(12) United States Patent
Nagatomi et al.

(10) Patent No.: US 8,062,549 B2
(45) Date of Patent: *Nov. 22, 2011

(54) PHOSPHOR AND MANUFACTURING METHOD THEREFORE, AND LIGHT EMISSION DEVICE USING THE PHOSPHOR

(75) Inventors: Akira Nagatomi, Tokyo (JP); Kenji Sakane, Tokyo (JP); Tomoya Yamada, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 784 days.

This patent is subject to a terminal disclaimer.

(21) Appl. No.: 11/992,647

(22) PCT Filed: Jul. 14, 2006

(86) PCT No.: PCT/JP2006/314109
§ 371 (c)(1),
(2), (4) Date: Jul. 29, 2008

(87) PCT Pub. No.: WO2007/037059
PCT Pub. Date: Apr. 5, 2007

(65) Prior Publication Data
US 2009/0267485 A1    Oct. 29, 2009

(30) Foreign Application Priority Data

Sep. 27, 2005  (JP) ................................. 2005-280859
May 1, 2006    (JP) ................................. 2006-127946

(51) Int. Cl.
*H01L 33/00*    (2010.01)
*C09K 11/62*   (2006.01)
*C09K 11/64*   (2006.01)
*C09K 11/66*   (2006.01)
*C09K 11/78*   (2006.01)
*C09K 11/79*   (2006.01)

(52) U.S. Cl. ............. 252/301.4 F; 252/301.6 F; 257/98; 313/487; 313/503

(58) Field of Classification Search ............ 252/301.4 F, 252/301.6 F; 313/487, 503; 257/98
See application file for complete search history.

(56) References Cited

U.S. PATENT DOCUMENTS
7,887,718 B2 * 2/2011 Nagatomi et al. ...... 252/301.4 F
(Continued)

FOREIGN PATENT DOCUMENTS
JP    A-2002-322474    11/2002
(Continued)

OTHER PUBLICATIONS
Oct. 1, 2010 European Search Report issued in EP 06 78 1134.
(Continued)

*Primary Examiner* — Carol M Koslow
(74) *Attorney, Agent, or Firm* — Oblon, Spivak, McClelland, Maier & Neustadt, L.L.P.

(57) ABSTRACT

To provide a phosphor for manufacturing an one chip type LED illumination, etc, by combining a near ultraviolet/ultraviolet LED and a blue LED, and having an excellent emission efficiency including luminance. The phosphor is given as a general composition formula expressed by $M_m A_a B_b O_o N_n$:Z, (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of elements acting as an activator.), satisfying $a=(1+x) \times m$, $b=(4-x) \times m$, $o=x \times m$, $n=(7-x) \times m$, $0 \leq x \leq 1$, wherein when excited by light in a wavelength range from 300 nm to 500 nm, the phosphor has an emission spectrum with a peak wavelength in a range from 500 nm to 620 nm.

40 Claims, 12 Drawing Sheets

U.S. PATENT DOCUMENTS

2005/0230689 A1    10/2005    Setlur et al.

FOREIGN PATENT DOCUMENTS

| JP | A-2002-363554 | 12/2002 |
| --- | --- | --- |
| JP | A-2003-206481 | 7/2003 |
| JP | A-2005-036038 | 2/2005 |
| JP | A-2005-048105 | 2/2005 |
| JP | A-2005-061627 | 3/2005 |
| JP | A-2005-075854 | 3/2005 |
| JP | A-2005-192691 | 7/2005 |
| WO | WO 2004/029177 A1 | 4/2004 |
| WO | WO 2005/049763 A1 | 6/2005 |
| WO | WO 2006/101257 A1 | 9/2006 |
| WO | WO 2006/121196 A1 | 11/2006 |

OTHER PUBLICATIONS

Chinese Office Action issued Oct. 18, 2010, in Patent Application No. 200680035715.4 (with English-language translation).

* cited by examiner (A)

(B)

(C)

PHOSPHOR AND MANUFACTURING METHOD THEREFORE, AND LIGHT EMISSION DEVICE USING THE PHOSPHOR

TECHNICAL FIELD OF THE INVENTION

The present invention relates to a phosphor containing nitrogen used for a cathode-ray tube (CRT), a display such as a field emission display (FED) and a plasma display (PDP), and an illumination device such as a fluorescent lamp and a fluorescent display tube, and an illumination device such as a crystal liquid back light and a method of manufacturing therefore, and also to a light emission device such as a white LED illumination in which a phosphor mixture, a phosphor sheet, a semiconductor light emitting element (LED) and this phosphor are combined.

BACKGROUND OF THE INVENTION

At present, a discharge type fluorescent lamp and an incandescent bulb used as the illumination device involve problems that a harmful substance such as mercury is contained, and life span is short. However, in recent years, a high luminescence LED emitting light of near ultraviolet/ultraviolet to blue color has been developed in sequence, and the white LED illumination for the practical application of the next generation has been actively studied and developed, in which the white light is created by mixing the light of the near ultraviolet/ultraviolet to blue color generated from the LED and the light generated from the phosphor having an excitation band in a wavelength region thereof. When the white LED illumination is put to practical use, since efficiency of converting electric energy into light is improved, less heat is generated and it is constituted of the LED and a phosphor, the white LED has advantages of good life span without burn-out of a filament like a conventional incandescent bulb and the harmful substance such as mercury is not contained, and miniaturization of the illumination device is realized, thus realizing an ideal illumination device.

Two systems are proposed as the system of the LED illumination. One of them is a multi-chip type system which creates white color by using three primary color LEDs such as high luminance red LED, green LED, and blue LED, and the other one is one-chip type system which creates white color by combining the high luminance LED emitting light of near ultraviolet/ultraviolet to blue color and the phosphor excited by the light of the near ultraviolet/ultraviolet to blue color emitted from this LED.

In a one-chip scheme in particular, a method is generally used in which a $Y_3Al_5O_{12}$:Ce yellow phosphor having a garnet structure is combined with a blue LED; La, Tb, Gd, or another rare-earth element that has a large atomic radius in the same manner as Y is substituted in place of or added to the Y sites of this yellow phosphor $Y_3Al_5O_{12}$:Ce; and B, Ga, or another trivalent element having a small atomic radius in the same manner as Al is substituted in place of or added to the Al sites, whereby various emission colors in the range from green color to reddish yellow color can be obtained while maintaining a garnet structure. For this reason, combinations with the light emitted from the blue LED can be used and various white lights having different color temperatures can be obtained.

However, the emission wavelength or emission color of a YAG:Ce phosphor can be changed by substituting or adding various elements, but emission efficiency is reduced by substituting elements, and the emission intensity is dramatically reduced at a temperature of 100° C. or higher. For this reason, there is a problem in that the balance between the emission color of the phosphor and the emission element is degraded and the tone of the white color is changed. On the other hand, a light emitting scheme that uses UV or near UV LED has a problem in that the emission intensity is dramatically reduced at temperatures of 100° C. or higher in the same manner as in a case in which ZnS:Cu, Al; (Sr, Ca)GaS:Eu; or another sulfurous phosphor having good light-emission characteristics is used as the phosphor.

In order to solve such temperature-induced degradation problems, demand has increased for novel phosphors that have a flat, high-efficiency excitation band in the range of near ultraviolet/ultraviolet to blue light, and that have excellent stability of light emission characteristics in relation to the ambient temperature. For example, much research has been carried out in relation to, e.g., Ca-sialon-based phosphors (described in patent document 1) and other oxynitride phosphors. However, there are problems with Ca-sialon-based phosphors in that the emission efficiency of the phosphor is insufficient in comparison with a YAG:Ce phosphor, and since the half-value width is narrow, adequate brightness and color rendering properties cannot be obtained except at a specific color temperature, a plurality of phosphors must be mixed to obtain an emission device that has excellent color rendering properties, and the overall emission characteristics as an emission device are thereby reduced.

There has also been proposed a $(Ca, Sr)_2Si_5N_8$:Ce yellow/green color phosphor (see patent document 6), which is a nitride phosphor of the same system as the phosphor described in patent document 1. The $(Ca, Sr)_2Si_5N_8$:Ce yellow/green color phosphor has a problem in that the emission characteristics are poor and stability is reduced due to heat, but non-patent document 1 describes a solution to this problem in which Li or Na is added in a small amount to the phosphor matrix, whereby the emission characteristics are improved.

Disclosed in patent document 2 is an Sr—Al—Si—O—N phosphor that is different from the Ca-sialon-based phosphor, i.e., $SrSiAl_2O_3N_2$:Ce, $SrSiAl_2O_3N_2$:Eu, and $Sr_2Si_4AlON_7$:Eu. However, these have poor emission efficiency, and are blue phosphors having a wavelength of 450 nm to 500 nm or red phosphors having a wavelength of 630 nm to 640 nm. A phosphor having good emission efficiency and an emission color from blue to orange in which the emission wavelength is 500 to 620 mm cannot be obtained.

In order to solve these problems, the present inventors developed a phosphor having a novel structure based on Sr—Al—Si—O—N, as described in patent document 3, and have proposed a phosphor that emits a good green to yellow color even from excitation light in the range of blue or near ultraviolet/ultraviolet, and have furthermore proposed in patent document 4 an Sr—Al—Si—O—N-based phosphor provided with good temperature characteristics and emission efficiency at high temperatures by adjusting the addition amount of Al. Also, an emission device that has good color rendering properties has been proposed in patent document 5 in which a plurality of phosphors comprising the above-described phosphors, a red phosphor, a blue phosphor, and the like is combined with an LED that emits ultraviolet to blue as an excitation light.

[Patent document 1] Japanese Laid Open Patent Application No. 2002-363554

[Patent document 2] Japanese Laid Open Patent Application No. 2003-206481

[Patent document 3] Japanese Patent Application No. 2005-061627

[Patent document 4] Japanese Patent Application No. 2005-192691

[Patent document 5] Japanese Patent Application No. 2005-075854

[Patent document 6] Japanese Laid Open Patent Application No. 2002-322474

[Non-patent document 1] Journal of Luminescence, 116 (2006), 107 to 116

DISCLOSURE OF THE INVENTION

Problems which the Invention is Intended to Solve

The nitrogen-containing phosphor proposed by the present inventors in patent documents 3 and 4 has excellent durability against heat and moisture, has a flat excitation band in the range of near ultraviolet/ultraviolet to blue color, has a large half-value width of the emission spectrum, has a broad emission spectrum, and has other excellent characteristics in comparison with the nitrogen-containing phosphor described patent document 1 and other publications. However, when the phosphor is combined with a near ultraviolet/ultraviolet LED, a blue LED, or the like to fabricate a one-chip type white LED illumination, the brightness as the most important factor for illumination during emission does not reach a satisfactory level and there is a need to further improve emission efficiency.

The emission efficiency of the emission element and the phosphor must be improved in order to enhance the emission characteristics of the visible light or white color light in LEDs and various other emission devices that emit visible light and white light by combining the above-described emission element that emits blue and ultraviolet light with a phosphor having an excitation band in the range of ultraviolet to blue color wavelengths. The emission color (chromaticity, emission wavelength) of the phosphor is also important. In addition, it is thought that there will be greater future demand for phosphors provided with truer emission colors depend on an LED, light source, or other service application.

Here, the present inventors posited that the emission color discharged from phosphors having the same composition can be changed to various colors by changing the elements contained in the structure rather than using combinations with other phosphors, even in an Sr—Al—Si—O—N phosphor (patent documents 3 to 5) proposed by the present inventors, in the same manner as the YAG:Ce phosphor described above. The present inventors also posited that various white-colored lights having different color temperatures can be obtained by combining the light discharged from a blue LED or a near ultraviolet/ultraviolet LED when temperature-induced reduction is not present in the emission characteristics.

The present invention was contrived in view of the problems described above, and a first object is to provide a phosphor that has a flat excitation band in the range from near ultraviolet/ultraviolet to blue/green color, that has a broad emission spectrum while possessing an emission wavelength peak in the vicinity of 500 nm to 620 nm capable of increasing the brightness, and that can emit a desired emission color in accordance with the target application; to provide a method of manufacturing the phosphor; to provide an emission device that uses the phosphor; and to provide various other emission devices.

As described above, a YAG:Ce phosphor can be made to change emission wavelength or emission color by substituting another element into the Y site or the Al site, or by adding an element to the two sites. However, in accordance with the research of the present inventors, this YAG:Ce phosphor has a problem in that the emission efficiency is reduced by the substitution/addition of an element, and has a problem in that the emission intensity is dramatically reduced when kept at a temperature of 100° C. or higher. There problems cause the balance between the emission color of the emission element and the emission color of the phosphor to degrade in an emission device that uses the phosphor, and, as a result, there is a problem in that the tone of the white light changes.

In accordance with the research of the present inventors, ZnS:Cu, Al, (Sr, Ca)GaS:Eu, and other sulfide phosphors have the problem in that the emission intensity is dramatically reduced when the sulfide phosphor is kept at a temperature of 100° C. or higher.

In accordance with the research of the present inventors, a Ca-sialon-based phosphor has inadequate emission efficiency in comparison with a YAG:Ce phosphor, and since the half-value width of emission spectrum is narrow, the emission device having adequate brightness and color rendering properties cannot be obtained except when the emission device has a specific color temperature. There is a need for a mixture of a plurality of phosphors in order to compensate for the problem in which the phosphor has a narrow half-value width of the emission spectrum and to obtain an emission device having excellent color rendering properties. However, such a mixture leads to a new problem in that the emission characteristics of the emission device overall are reduced.

A $(Ca, Sr)_2Si_5N_8$:Ce yellow/green phosphor has a problem in that stability is reduced by heat. A method of solving this problem is described in non-patent document 1 in which the emission characteristics can be improved by adding a small amount of Li or Na to the matrix. However, in accordance with the research of the present inventors, emission characteristics still remain insufficient and stability in relation to heat remains unsolved even if Li or Na is added to the $(Ca, Sr)_2Si_5N_8$:Ce yellow/green phosphor.

Lastly, the Sr—Al—Si—O—N phosphor having a novel structure proposed by the present inventors has a large half-width value of emission spectrum and excellent stability against heat, but can be improved in terms of emission intensity and emission brightness.

The present invention was contrived in view of the foregoing situation, and a second object thereof is to provide a phosphor that has an excitation band in the range of near ultraviolet/ultraviolet to blue color and possesses excellent emission intensity and brightness, an emission spectrum with a large half-value width, and excellent durability against heat; to provide a method of manufacturing the phosphor; to provide an emission device that uses the phosphor; and to provide various other emission devices.

In order to solve the problems described above, the present inventors first studied emission spectra and emission efficiencies in relation to the type and concentration of the activator element with a focus on the variation of the emission color due to the concentration of an activator and the activity of other activator elements. The present inventors also looked at the reasons that the brightness and other forms of emission efficiency do not reach a satisfactory level, concentrated on improvements in emission efficiency that accompany improvements in the crystallinity of the phosphors, and studied improvements in crystallinity, emission spectra and emission efficiency that accompany the addition effects.

Next, research was carried out in order to increase to a satisfactory level the emission intensity and brightness of the emission discharged from the phosphor while retaining excellent durability against heat and the emission spectrum with a large half-value width of the phosphor The present inventors, as a result of research relating to a phosphor composition containing several nitrogen atoms, considered that the crystal structure of such a phosphor is one in which a portion of the Si of an [SiN$_4$] tetrahedral structure is substituted by Al and a portion of the N is substituted by O, and in which Sr is incorporated in a network having a tetrahedral structure. The present inventors concluded that it is possible to improve emission efficiency by optimizing the crystal structure of the resulting phase in a phosphor and by optimizing the Al substitution amount for Si and the O substitution amount for N.

The present inventors also concluded that the emission color can be varied in a wide range using a single composition rather than mixing the phosphor with other compositions by optimizing the addition amount of Eu and/or Ce, which are used as activators.

The present inventors have concluded that the reaction is not uniform because the raw materials used for producing a phosphor have a high melting point and a solid phase reaction that proceeds slowly. The present inventors accordingly researched a method in which the progress of the solid phase reaction is promoted and the reaction is made uniform, and concluded that crystallinity is improved by adding small amounts of oxides, fluorides, chlorides, and nitrides when the phosphor is fired.

The present inventors, as a result of research related to the crystal structure of an Sr—Al—Si—O—N-based phosphor having a novel structure, posited that the crystal structure thereof has a portion of the Si substituted with Al and a portion of the N substituted with O in the tetrahedral structure of [SiN$_4$], and has a structure that includes an element (may hereinafter be referred to M$^{(2)}$, and is the alkaline-earth metal Sr in this model) having a bivalent valency in a network incorporated into the tetrahedral structure, and that also includes an element Z as an activator.

Based on the above reasoning, a portion of the sites of the M$^{(2)}$ and Z elements in this phosphor is substituted with an element (may also be referred to hereinafter as M$^{(1)}$) having a univalent valency, whereby the electrical and structural stability inside the crystal structure can be increased and the emission efficiency can be improved.

On the other hand, as a result of research related to the process of generating this phosphor, it was determined that the raw material used for generating the phosphor has a high melting point, and the solid-phase reaction progresses slowly even when heated, that the reaction is not uniform, and that the crystallinity of the phosphor that is produced is not improved. A mechanism had therefore been suggested whereby the emission efficiency could be reduced. Based on this reasoning, the present inventors pursued research related to a technique for facilitating the progress of the solid-phase reaction. The present inventors perfected the present invention having discovered that, in this technique, the solid-phase reaction can be uniformly carried out and the crystallinity of the phosphor can be increased by substituting a portion of the sites of the elements M$^{(2)}$ and Z in the phosphor described above with an element M$^{(1)}$.

In order to solve the above-described problem, a first structure of the present invention provides a phosphor, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of elements acting as an activator.), satisfying a=(1+x)×m, b=(4−x)×m, o=x×m, n=(7−x)×m, 0≦x≦1, wherein when excited by light in a wavelength range from 300 nm to 500 nm, the phosphor has an emission spectrum with a peak wavelength in a range from 500 nm to 620 nm.

A second structure of the present invention provides the phosphor according to the first structure, wherein the element M is one or more kinds of elements selected from the group consisting of Mg, Ca, Sr, Ba, Zn and the element A is one or more kinds of elements selected from the group consisting of Al, Ga, In, Sc, La, and Y, the element B is Si and/or Ge, and the element Z is one or more kinds of elements selected from the group consisting of Eu, Ce, Pr, Tb, Yb, Mn.

A third structure of the present invention provides the phosphor according to first and second structures, wherein the element M is Sr or Ba, the element A is Al or Ga, the element B is Si, and the element Z is Ce and/or Eu.

A fourth structure of the present invention provides the phosphor according to any one of first to third structures, wherein when the general formula is expressed by MmAaBbOoNn:Zz, the value of z/(m+z), which is a molar ratio of the element M to the element Z, is 0.0001 or more and 0.5 or less.

Fifth structure provides the phosphor according to any of first to fourth structures, further containing chloride or/and fluoride.

Sixth structure provides the phosphor according to fifth structure, wherein contents of said chloride or/and fluoride are not less than 0.0001 wt % and not more than 1.0 wt %.

Seventh structure provides the phosphor according to any one of first to sixth structures, wherein when an emission intensity of the phosphor at a temperature of 25° C. when this phosphor is excited by a prescribed excitation light in the wavelength range from 300 nm to 500 nm is defined as P$_{25}$, and the emission intensity at the temperature of 100° C. when this phosphor is irradiated with said prescribed excitation light is defined as P$_{100}$, the relation of P$_{25}$ and P$_{100}$ is given satisfying (P$_{25}$−P$_{100}$)/P$_{25}$×100≦20.

Eighth structure provides the phosphor according to any one of first to seventh structures, containing a primary particle with particle size of 50 µm or less and aggregates in which the primary particle agglutinates, wherein an average particle size (D50) of the powdery phosphor containing the primary particle and the aggregates is 1.0 µm or more and 50.0 µm or less.

Ninth structure provides a phosphor, which is given as a general composition formula expressed by M$^{(1)}_{m(1)}$M$^{(2)}_{m(2)}$Zz)AaBbOoNn:Z, (where element M$^{(1)}$ is one or more kinds of elements having bivalent valency, element A is one or more kinds of elements having tervalent valency, element B is one or more kinds of elements having tetravalent valency, O is oxygen, N is nitrogen, and element Z is the element acting as the activator.), satisfying 0.5≦a≦2.0, 3.0≦b≦7.0, m$^{(1)}$>0, m$^{(2)}$>0, z>0, 4.0≦(a+b)≦7.0, m$^{(1)}$+m$^{(2)}$+z=1, 0<o≦4.0, n=1/3m$^{(1)}$+2/3m$^{(2)}$+z+a+4/3b−2/3o, and when the phosphor is irradiated with light with a wavelength range form 300 nm to 500 nm, a peak wavelength in an emission spectrum is in a range from 500 nm to 600 nm.

Tenth structure provides the phosphor according to the ninth structure, satisfying 0<m$^{(1)}$≦0.05.

Eleventh structure provides the phosphor according to ninth or tenth structure, satisfying 0.0001≦z≦0.5.

Twelfth structure provides the phosphor according to any one of ninth to eleventh structures, satisfying 0.8≦a≦2.0, 3.0≦b≦6.0, 0<o≦1.0.

Thirteenth structure provides the phosphor according to any one of ninth to twelfth structures, satisfying 0<o≦1.0, a=1+o, b=4−o, n=7−o.

Fourteenth structure provides the phosphor according to any one of ninth to thirteenth structures, the element M$^{(1)}$ is one or more kinds of elements selected from a group consisting of Li, Na, K, Rb, the element $M^{(2)}$ is one more kind of elements selected from a group consisting of Mg, Ca, Sr, Ba, Zn, the element A is one or more kinds of elements selected from a group consisting of Al, Ga, In, the element B is Si and/or Ge, and the element Z is one or more kinds of elements selected from a group consisting of Eu, Ce, Pr, Tb, Yb, Mn.

Fifteenth structure provides the phosphor according to any one of ninth to fourteenth structures, wherein the element $M^{(2)}$ is Sr and/or Ba, the element A is Al, the element B is Si, and the element Z is Ce.

Sixteenth structure provides the phosphor according to any one of ninth to fifteenth structures, wherein the element $M^{(1)}$ is K.

Seventeenth structure provides the phosphor according to any one of ninth to sixteenth structures, containing Sr of 21.0 wt % to 27.0 wt %, Al of 8.0 wt % to 14.0 wt %, O of 0.5 wt % to 6.5 wt %, N of 26.0 wt % to 32.0 wt %, Ce beyond O and not more than 4.0 wt %, and one or more kinds of elements selected from Li, Na, K beyond 0 and under 1.0 wt %.

Eighteenth structure provides the phosphor according to any one of ninth to seventeenth structures, containing Ba beyond 0 and under 2.0 wt %.

Nineteenth structure provides the phosphor according to any one of ninth to eighteenth structures, containing a primary particle with particle size of 50 µm or less and aggregates in which the primary particle agglutinates, wherein an average particle size (D50) of the powdery phosphor containing the primary particle and the aggregates is 1.0 µm or more and 50.0 µm or less.

Twentieth structure provides a method of manufacturing the phosphor according to any one of claims 1 to 8, comprising the steps of:

obtaining a mixture by weighing and mixing raw material powders of this phosphor;

firing said mixture in a firing furnace and obtaining a fired product; and pulverizing said fired product and obtaining the phosphor, wherein in the step of firing said mixture and obtaining the fired product, any one of nitrogen or rare gas, or ammonia, or a mixed gas of the ammonia and the nitrogen, or the mixed gas of the nitrogen and hydrogen is used as an atmosphere gas during firing.

Twenty-first structure provides the method of manufacturing the phosphor according to twentieth structure, wherein gas containing 80% or more of nitrogen gas is used as the atmosphere gas in said firing furnace.

Twenty-second structure provides the method of manufacturing the phosphor according to claim 20 or 21, wherein in the step of firing said mixture in the firing furnace and obtaining the fired product, firing is performed, with 0.1 ml/min or more of the atmosphere gas in said firing furnace flown through said firing furnace.

Twenty-third structure provides the method of manufacturing the phosphor according to any one of twentieth to twenty-second structures, wherein in the step of obtaining the fired product by firing said mixture in the firing furnace, the atmosphere gas in said firing furnace is set in a pressurized state of 0.001 MPa to 1.0 MPa.

Twenty-fourth structure provides the method of manufacturing the phosphor according to any one of twentieth to twenty-third structures, wherein chloride or/and fluoride of the element M or/and the element A is added to the mixture of the raw material powders.

Twenty-fifth structure provides the method of manufacturing the phosphor according to twenty-fourth structure, wherein said chloride or/and fluoride compounds are $SrF_2$, $BaF_2$, $AlF_3$, $SrCl_2$, $BaCl_2$, $AlCl_3$.

Twenty-sixth structure provides the method of manufacturing the phosphor according to any one of twentieth to twenty-fifth structures, wherein oxide or/and nitride of the element M or/and the element A are added to the mixture of the raw material powders.

Twenty-seventh structure provides the method of manufacturing the phosphor according to twenty-sixth structure, wherein said oxide or/and nitride are $Al_2O_3$, $Ga_2O_3$, $In_2O_3$, GaN, $Sr_3N_2$, $Ba_3N_2$, $Ca_3N_2$.

Twenty-eighth structure provides the method of manufacturing the phosphor according to any one of twentieth to twenty-seventh structures, wherein an average particle size of the raw materials of said phosphor is 0.1 µm to 10.0 µm.

Twenty-ninth structure provides the method of manufacturing the phosphor according to any one of ninth to nineteenth structures, wherein when the raw materials of the phosphor are put in a crucible and fired in a furnace, a BN crucible is used as a crucible, then 0.1 ml/min or more gas containing one or more kinds of gases selected from nitrogen gas, rare gas, and ammonia gas is flown through the furnace, and a furnace pressure is set at 0.0001 MPa to 1.0 MPa, so that the raw materials are fired at a temperature of 1400° C. or more and 2000° C. or less for 30 minutes.

Thirtieth structure provides the method of manufacturing the phosphor according to twenty-ninth structure, wherein a series of steps composed of the step of firing and the step of pulverizing and mixing a fired product obtained by firing are repeated at least twice or more.

Thirty-first structure provides the method of manufacturing the phosphor according to twenty-ninth or thirtieth structure, wherein at least one kind of barium chloride, fluoride, oxide, and carbonate is used for the raw materials.

Thirty-second structure provides a light emission device, having the phosphor according to any one of first to nineteenth structures and a light emission part for emitting light of a first wavelength, wherein the light of a different wavelength from the first wavelength is emitted from the phosphor, by using a part or an entire part of the light of the first wavelength as an excitation light.

Thirty-third structure provides the light emission device according to thirty-second structure, wherein the first wavelength is the wavelength of 300 nm to 500 nm.

Thirty-fourth structure provides the light emission device according to thirty-second or thirty-third structure, wherein an average color rendering index Ra of an emission spectrum of the light emission device is 60 or more.

Thirty-fifth structure provides the light emission device according to thirty-second or thirty-third structure, wherein an average color rendering index Ra of an emission spectrum of the light emission device is 80 or more.

Thirty-sixth structure provides the light emission device according to any one of thirty-second to thirty-fifth structures, wherein a special color rendering index R15 of an emission spectrum of the light emission device is 80 or more.

Thirty-seventh structure provides the light emission device according to any one of thirty-second to thirty-sixth structures, wherein a special color rendering index R9 of an emission spectrum of the light emission device is 60 or more.

Thirty-eighth structure provides the light emission device according to any one of thirty-second to thirty-seventh structures, wherein a correlated color temperature of the light emission device is in a range from 10000K to 2000K.

Thirty-ninth structure provides the light emission device according to any one of thirty-second to thirty-seventh structures, wherein the correlated color temperature of the light emission device is in a range from 7000K to 2500K.

Fortieth structure provides the light emission device according to any one of thirty-second to thirty-ninth structures, wherein the light emission part for emitting light of the first wavelength is a light emitting diode (LED).

Advantages of the Invention

The first to eighth structures provide the phosphor having a flat excitation band in a range from near ultraviolet/ultraviolet to bluish green color and having excellent emission characteristics of having a broad emission spectrum, with an emission peak in the vicinity of the wavelength range from 500 nm to 620 nm, thereby making it possible to improve luminance, and capable of easily emitting light having a desired emission color so as to correspond to the purpose of use.

The ninth to nineteenth structures provide the phosphor capable of emitting light with high efficiency, when being excited by light in a wavelength range from 300 nm to 500 nm, and capable of obtaining green to yellow emissions with a peak wavelength range from 500 nm to 600 nm in the emission spectrum.

The twentieth to twenty-eighth structures provide the phosphor having a flat excitation band in a range from the near ultraviolet/ultraviolet to bluish green color, with a peak of a broad emission spectrum, and in addition having an excellent emission characteristic, having a heat-resistant property, and having the emission characteristic of hardly deteriorated even under a high temperature environment compared to an environment of a room temperature (25° C.) or less, and capable of being easily manufactured without using an unstable raw material in the atmospheric air, with an inexpensive manufacturing cost.

According to the manufacturing method of the phosphor of the twenty-ninth to thirty-first structures, it is possible to easily manufacture the phosphor having an excitation band in a range from the near ultraviolet/ultraviolet to bluish green color, with a peak of a broad emission spectrum, and in addition having an excellent emission intensity/luminance, without using an unstable raw material in the atmospheric air, with an inexpensive manufacturing cost.

According to the emission device of the thirty-second to fourty-th structures, the light having excellent characteristics of not only the high luminance but also the high color rendering property can be obtained.

BEST MODE FOR CARRYING OUT THE INVENTION

Preferred embodiments of the present invention will be explained hereunder. However, the present invention is not limited thereto.

Phosphor According to a First Embodiment

A first phosphor of this embodiment is the phosphor having a matrix composition given by a general formula expressed by $M_mA_aB_bO_oN_n:Z$. Here, element M is one kind of element or more selected from elements having bivalent valency in the phosphor. Element A is one kind of element or more having trivalent valency, element B is one kind of element or more having tetravalent valency, O is oxygen, N is nitrogen, and element Z is an element acting as the activator in the phosphor and is one kind of element or more selected from rare earth elements or transitional metal elements.

Also, in the phosphor, $(a+b)/m$ satisfies the inequality $4.0<(a+b)/m<7.0$; $n>o$; $a/m$ satisfies the inequality $0.5<a/m\leqq2.0$; $b/m$ is in the range of $3.0\leqq b/m\leqq6.0$; $o/m$ is in the range of $0\leqq o/m\leqq1.5$; and nitrogen satisfies the equality $n=2/3\,m+a+4/3b-2/3o$.

The phosphor of the present invention having the first configuration described above according to this embodiment is a phosphor that has a flat excitation band in the range from near ultraviolet/ultraviolet to blue color (wavelength range from 300 nm to 500 nm), has excellent initial emission characteristics with a broad emission spectrum and an emission wavelength peak is in the vicinity of 500 nm to 620 nm capable of increasing the brightness, and has excellent heat and water resistance; and is a phosphor in which the emission characteristics substantially do not degrade in comparison with those at room temperature (25° C.), even under a high-temperature environment. A more preferred configuration in the phosphor is one in which $a=(1+x)\times m$, $b=(4-x)\times m$, $o=x\times m$, and $n=(7-x)\times m$ in a range that satisfies the inequality $0\leqq x\leqq1$, whereby the emission intensity and the various characteristics described above can be further enhanced.

As a result, highly-efficient light emission having high emission intensity, high brightness, and stable emission color can be obtained regardless of accumulated lighting time by combining the phosphor alone, or the phosphor mixture produced by mixing the phosphor with a suitable phosphor of another color to obtain a phosphor mixture, and a near ultraviolet/ultraviolet LED, a blue LED, or another light emitting part. Also, the emission color can be varied while maintaining high emission efficiency by optimizing the x term in the phosphor compositional formula of this embodiment and varying the type and addition amount of the activator. An emission color having good color rendering properties can be obtained at various color temperatures by combining the phosphor and a blue LED or another light emitting part.

Color rendering will be briefly described below. Color rendering properties refer to the fact that the visual appearance of colors of an object illuminated by light from a light source will appear to change depending on the type of light source. The color rendering properties, which show the reproducibility of the colors of an illuminated object, depend on the type of the light source and can generally be numerically expressed by an average color rendering index (Ra). The best average color rendering index (Ra=100) is achieved as long as the exact same color as that when viewed under a reference light can be reproduced, and the Ra value is reduced (Ra<100) as the difference in the reproduced colors increases.

It is apparent that a phosphor whose visual color appearance more closely resembles that observed under a reference light is preferred as the light source for illumination. However, the reference light is a white light source having a uniform light across the entire range of visible light, but existing white LED illumination has nonuniform light intensity; i.e., the intensity of the light is high for wavelengths in the range of visible light, but the intensity is low at certain wavelengths. Therefore, the color reproducibility is poor and color rendering properties are reduced in wavelength regions in which the intensity of the light is insufficient.

Ultimately, the peak of the emission spectrum of the phosphor to be used must be broadened in order to achieve an emission having high color rendering properties in a white LED illumination. The half-value width of the emission spectrum in the phosphor of this embodiment is 80 m or more, and the phosphor is one in which the emission spectrum has a broad peak. Therefore, a phosphor having a high average color rendering index and excellent color rendering properties can be obtained when used in combination with a near ultraviolet/ultraviolet LED, a blue color LED, or another light emitting part to obtain a white LED illumination.

Also, the phosphor of this embodiment can shift the peak position of the emission spectrum in a wavelength range of 500 nm to 620 nm in which visibility (brightness) is high. Therefore, white LED illumination of a target emission color can be fabricated without mixing the phosphor with another phosphor. In white LED illumination that is obtained in combination with a blue color LED in particular, an emission device having an average color rendering index Ra of 60 or higher can be obtained in a correlated color temperature range of 10,000 K to 2,500 K by using the phosphor of this embodiment. An emission device having very good color rendering properties in which the average color rendering index Ra is 80 or higher can be obtained by furthermore adding $CaAlSiN_3$: Eu and other types of red color phosphors.

The first phosphor according to this embodiment features a peak excitation band in a wavelength range of 300 nm to 500 nm, and particularly in a wavelength range of 400 nm to 480 nm. The phosphor of this embodiment has an excitation band across a wide wavelength range of 300 nm to 500 nm, and it is therefore also possible to obtain white LED illumination by forming a combination with a near ultraviolet/ultraviolet LED, which is difficult to achieve with a YAG:Ce phosphor. Since the excitation band of the phosphor of this embodiment is flat, there is no problem in that the excitation light becomes offset from the optimal range of the excitation band due to variability in the emission element, the luminous intensities of the blue and yellow colors become unbalanced, and the tone of the white-colored light varies in the same manner as in a YAG:Ce phosphor, which has a narrow excitation band with good emission efficiency.

The half-value width of the spectrum of a common emission element is about 20 nm, but emission partially includes, albeit in a small amount, light having a wavelength of about 420 nm in case that a blue color emission element having a peak wavelength of 460 nm is used. The portion of light having a short wavelength may lead to the degradation of the resin that covers the element, or may affect the human body.

The phosphor of this embodiment has an excitation peak at a wavelength less than the emission wavelength (460 nm) of a blue color emission element, and the absorption efficiency of the emission spectrum discharged from the blue color element is accordingly greater at emission wavelengths that are less than the emission peak wavelength. As long as the phosphor can efficiently absorb the emission element's light whose emission wavelength is less than that of the emission peak, the so-called phosphor as such acts as a UV absorber, and the effect on the human body and resin degradation can be prevented. The phosphor preferably has an excitation peak in the range that starts at a point 40 nm less than the peak wavelength of the emission element, which is the excitation light of the emission device. Harmful UV rays can be absorbed as long as the excitation band is kept at 80% or higher, with the excitation peak constituting 100%; and the effect on the human body and resins can be avoided.

The first phosphor according to this embodiment has a flat excitation band across a wide range from near ultraviolet/ultraviolet to blue/green color (wavelength: 300 nm to 500 nm), yields a highly efficient emission spectrum in the range of green color to orange color, has excellent durability with respect to heat and moisture, and has excellent emission characteristics, particularly in high temperatures. The reasons for this are mainly as follows. First, in the general formula $M_mA_aB_bO_oN_n$:Z of the phosphor of this embodiment, the element M is Sr or Ba, the element A is Al or Ga, the element B is Si, the element Z is Ce and/or Eu, and the values of a, b, o, and n are in a range that satisfies the expressions $a=(1+x)\times m$, $b=(4-x)\times m$, $o=x\times m$, $n=(7-x)\times m$, and $0 \leq x \leq 1$, whereby the phosphor has a crystal structure that is different from the structure of a conventional nitride or oxynitride phosphor and that is durable at high temperatures.

The first phosphor according to this embodiment is expressed by the composition formula described above as $SrAl_{1+x}Si_{4-x}O_xN_{7-x}$:Z (wherein Z is an activator). $SrLuSi_4N_7$:$Eu^{2+}$ disclosed in Japanese Patent Laid Open Publication No. 2003-206481 (patent document 2); $SrYSi_4N_7$:$Eu^{2+}$, $SrYSi_4N_7$:$Ce^{3+}$ described in non-patent document J. Solid State Chem., 177, (2004), 4687-4694; $SrYbSi_4N_7$ and $BaYbSi_4N_7$ described in non-patent document Z. Anorg. Allg. Chem., 623, (1997), 212-217; and other nitride phosphors similar to conventional phosphors have been reported. When these conventional nitride phosphors are expressed as $MASi_4N_7$, the element M is Ca, Sr, Ba, or another alkaline-earth metal, and is the same as in the phosphor of this embodiment.

However, the A site of conventional nitride phosphors is La, Yb, Lu, Gd, or another rare-earth element, and the phosphor of this embodiment is different in that Al, Ga, In, or another Group IIIA element having an ion radius that is less than that of a rare-earth element is used as the principal component. Also, the $SrAlSi_4N_7$:Ce of the phosphor of this embodiment has different emission characteristics in that a yellow/green color is emitted, in contrast to the $SrYSi_4N_7$:Ce in which the Ce-activated $SrYSi_4N_7$ as the conventional nitride phosphor emits blue light or the like. The phosphor of this embodiment is different in composition from the conventional nitride phosphors described above, but is thought to have a similar crystal structure.

In the manufacture of the phosphor of this embodiment, a stable crystal structure is obtained by substituting a portion of the Si in the crystal structure with Al and substituting N with O in the same amount as that substituted by Al. This is because the valency of the phosphor crystal became unstable by admixing oxygen atoms into the phosphor structure during manufacture. It is thought that emission efficiency is improved by adopting this crystal structure because the atoms can be present in an orderly fashion in the crystal structure, and excitation energy used for light emission is transmitted with good efficiency. It is also thought that the reason that the phosphor has a flat excitation band across a wide range from near ultraviolet/ultraviolet to blue color/green color (wavelength: 300 nm to 500 nm) in the visible light region is that the covalence is strong in comparison with an oxide phosphor.

The first phosphor according to this embodiment is a composition that includes a small amount of oxygen atoms, but the amount of oxygen atoms is preferably kept smaller. More particularly, a range of $0<x<0.5$ is preferred, and a range of $0 \leq x \leq 1.0$ is more preferred, whereby the emission intensity may possibly be further increased because the composition is chemically stable. The specific reason for this is not known, but it is surmised that a smaller amount of oxygen atoms makes it difficult for impurity phases that do not contribute to emission to be generated in the phosphor, and a reduction in the emission intensity can be lessened. In other words, it is thought that when a large amount of impurity phases is generated, the amount of phosphor per unit surface area is reduced, and the impurity phases thus generated absorb excitation light and phosphor-generated light, whereby the emission efficiency is reduced and high emission efficiency cannot be obtained.

This reasoning is supported by the fact that the diffraction intensity is very low either in the confirmed presence or absence of a peak produced by the impurity phase of AlN, $Si_3N_4$, and other unreacted raw materials and a peak produced by the impurity phases that are different from those contributing to light emission when the value of x is within the range $0 \leq x \leq 1.0$ described above in X-ray diffraction measurement of the phosphor of this embodiment after firing. When the value of x is x>1.0, a marked peak of the phase that differs from the phase that contributes to light emission is confirmed. The characteristic in which the peak of the impurity phase is not observed in the X-ray diffraction pattern of the phosphor after firing is thought to indicate that the phosphor as the target of measurement has high emission intensity.

Optimum Oxygen Range

The oxygen content of the first phosphor according to this embodiment is preferably 5.0 wt % or less. The oxygen content is optimized, making it possible to obtain a phosphor in which the initial emission characteristics (25° C.) of the phosphor are improved and which his provided with emission characteristics that substantially do not degrade in a high-temperature environment in comparison with those at room temperature (25° C.). This is due to the fact that Al has a larger ion radius in comparison with Si, and merely substituting Al into the Si sites results in a crystal structure unsuitable for light emission. Furthermore, Al is trivalent and is different in this sense from Si, which is tetravalent. Therefore, there is a problem in that the valency in the crystal becomes unstable. However, an optimal crystal structure for light emission can be obtained when some of the N sites are substituted with O in accordance with the amount of Al substituted into the Si sites, and since the valency of the entire matrix crystal can be kept at the stable level of zero, it is thought that excellent emission characteristics can be obtained. On the other hand, since an excessive amount of substituted oxygen leads to a degradation of the emission characteristics, a sufficiently practical phosphor having good emission characteristics is obtained as long as the oxygen content of the phosphor after firing is kept at a level that is 5.0 wt % with respect to the entire weight of the phosphor.

Optimum Chloride and Fluoride Ranges

The chloride content and/or fluoride content of the first phosphor according to this embodiment are preferably 0.0001 wt % or more and 1.0 wt % or less. When compounds of the raw materials fluoride and chloride are added during the manufacture of a phosphor, the added compounds melt during firing and become incorporated into the surrounding raw materials, and the crystal growth reaction of the phosphor is further accelerated, whereby a phosphor having high emission efficiency can be obtained. The chloride and/or fluoride added to the phosphor possibly substitute oxygen and nitrogen atoms in small amounts and remain as a residue in the phosphor after generation. Even with elements other than chloride and/or fluoride, a flux effect is can be obtained and the reaction accelerated by simultaneously using oxides and nitrides of the constituent elements of the composition (raw material elements), which have a melting point of 1000° C. or higher and 2000° C. or lower.

Optimum M Range

The element M is required to have Sr; is preferably one or more kinds of elements selected from Mg, Ca, Ba, Zn, and a rare-earth element having a bivalent valency; is more preferably one or more kinds of elements selected from Sr and Ba; and is most preferably Sr alone or the element Sr contained as the element M in an amount of 50 at % or more.

Optimum A Range

The element A is preferably one or more kinds of elements selected from the group consisting of Al, Ga, In, Tl, Y, Sc, La, P, As, Sb, and Bi; is more preferably one or more kinds of elements selected from the group IIIA elements Al, Ga, and In, and is most preferably Al. The element A is specifically Al alone, or Al used in combination with one or more kinds of elements suitably selected from Ga and In. Al is preferred in that AlN, which is a nitride, is used as a common heat transmission material or as a structural material, is readily available and inexpensive, and has a low environmental impact.

Optimum B Range

The element B is preferably one or more kinds of elements selected from the group consisting of Si, Ge, Sn, Ti, Hf, Mo, W, Cr, Pb, and Zr; is more preferably Si and/or Ge; and is most preferably Si. The element B is specifically Si alone, or Si and Ge used in combination. Si is preferred in that $Si_3N_4$, which is a nitride, is used as a common heat transmission material or as a structural material; is readily available and inexpensive; and has a low environmental impact.

Optimum Z Range

The element Z is one or more kinds of elements selected from rare-earth elements or transition metal elements that are blended in a form in which a portion of the element M in the matrix structure of the phosphor has been substituted. Therefore, in this embodiment, m, which shows the mole count of the element M, is a numerical value that includes the mole count z of the element Z.

From the viewpoint of demonstrating sufficient color rendering properties in a white LED illumination and various other light sources in which the first phosphor according to this embodiment is used, the half value width of the peak in the emission spectrum of the phosphor is preferably large. In view of the above, the element Z is preferably one or more kinds of elements selected from the group consisting of Eu, Ce, Pr, Tb, Yb, and Mn. Most preferred among these as the element Z are Ce and Eu. It is preferred that the element Z be, specifically, Ce alone, Eu alone, or two types of Ce and Eu used in combination as the activator for the phosphor used for white LED illumination and various other light. This is because the emission spectrum of the phosphor of this embodiment is broad from green color to orange color and the emission intensity is greater.

An amount of the element Z to be added is preferably in the range of 0.0001 or more and 0.50 or less in a molar ratio $z/(m+z)$ of the element M and the element Z as an activator, when the general formula of the phosphor of this embodiment is expressed by the general formula $M_mA_aB_bO_oN_n:Z_z$ (wherein $0<m+z\leq 1$). When the molar ratio $z/(m+z)$ of the element M and the element Z is in the aforementioned range, deterioration in the emission efficiency due to concentration quenching caused by an excessive content of the activator (element Z) is prevented, and on the other hand, the atoms contributing to light emission become deficient due to an excessively low content of the activator (element Z), and the emission efficiency is thereby prevented from deteriorating. Further, it is preferable to set the value of the $z/(m+z)$ within the range of not less than 0.001 and not more than 0.30, and as long as this range is satisfied, the peak wavelength of the light emission of the phosphor can be shifted and set by controlling the amount of the activator (element Z) to be added, and this is effective when adjusting the color temperature, brightness, and luminance in the light source thus obtained. However, an optimal value of the range of the value of $z/(m+z)$ fluctuates somewhat due to the kind of the activator (element Z) and the kind of the element M.

In the first phosphor (general formula: $M_mA_aB_bO_oN_n:Z$) according to this embodiment, Sr was selected as the element M, Al was selected as the element A, Si was selected as the element B, Ce and/or Eu were selected as the element Z, and the values of m, a, b, o, and n were within the ranges $a=(1+x) \times m$, $b=(4-x) \times m$, $o=x \times m$, $n=(7-x) \times m$, and $0 \leq x \leq 1$, whereupon the weight ratios of the elements constituting the aforementioned phosphor was obtained by compositional analysis of the phosphor after firing. At this point, Sr was 22.0 wt % or more and 28.0 wt % or less, Al was 5.0 wt % or more and 18.0 wt % or less, O was 5.0 wt % or less, N was 27.0 wt % or less, and Ce and/or Eu was greater than 0 and 5.0 wt % or less. Element included in the phosphor except described above is Si or another element. When the phosphor was irradiated with monochromatic light in the wavelength range of 300 nm to 500 nm, or with mixed light composed of these kinds of monochromatic light as excitation light, the peak wavelength of the emission spectrum of the phosphor was in a wavelength range of 500 to 620 nm. At this point, the phosphor exhibited a sufficient emission intensity and good emission characteristics; i.e., the chromaticity x of the chromaticity (x, y) of the emission spectrum was in a range of 0.38 to 0.55, and the chromaticity y was in a range of 0.40 to 0.60.

Next, the temperature characteristics of the first phosphor according to this embodiment will be described.

In some cases, the phosphor is used not only as the white LED illumination, but under high temperature environment. Accordingly, when the phosphor whose emission intensity is deteriorated in association with an increase of the temperature, and whose emission characteristic is degraded in association with thermal degradation, such a phosphor is not preferable. For example, in a sulfide phosphor, the emission characteristics are excellent, but there are many such phosphors in which the emission intensity is reduced as the temperature increases and the emission characteristics are degraded by heat-induced compositional changes. In contrast, the phosphor according to this embodiment exhibits excellent temperature characteristics and heat resistance, and when monochromatic light, which is in the near ultraviolet/ultraviolet to blue/green color range (wavelength: 300 nm to 500 nm), or a mixed light of these monochromatic lights is irradiated as the excitation light, the expression $(P_{25}-P_{100})/P_{25} \times 100 \leq 20.0$ holds true when $P_{25}$ is the value of relative intensity of the maximum peak in the emission spectrum at 25° C., and $P_{100}$ is the value of the relative intensity of the maximum peak at 100° C. of the phosphor irradiated by the above-described excitation light, and excellent emission characteristics are demonstrated even in a high-temperature environment.

The present inventors studied the exothermic temperature of LEDs, and found that the temperature of small low-current type chips is about 50° C., and when a large high-current type chip is used in order to obtain stronger luminescence, the temperature increased to between about 80° C. to 150° C. When used as white LED illumination, the heat generated by sealing the chip with a resin and by the structure of the lead frame accumulates and there are cases in which the temperature of the resin or the mixed portion of the phosphor reaches about 100° C. In other words, heat-induced reduction in the emission intensity can be kept within levels that do not pose a problem for white LED illumination or the like even when heat accumulates in association with the extended lighting time of LEDs or the like as a light source as long as $(P_{25}-P_{100})/P_{25} \times 100 \leq 20.0$, and more preferably $(P_{25}-P_{100})/P_{25} \times 100 \leq 10.0$ The first phosphor according to this embodiment is used in a powder form, whereby application can readily be made to white LED illumination and various other emission devices. Here, when the phosphor is used in a powdery state, the phosphor preferably contains primary particles having a particle size of 50.0 µm or less and aggregates composed of the primary particles, wherein the average particle size (D50) of the powdery phosphor containing the primary particles and the aggregates is 1.0 µm or more and 50.0 µm or less, and more preferably is 1.0 µm or more and 10.0 µm or less. This is thought to be due to the fact that, as long as the average particle size is 50.0 µm or less, the pulverizing step can thereafter be readily carried out and the fact that the light emission in the phosphor powder mainly occurs on the surface of the particles, therefore, the surface area per unit weight of the powder can be assured and a reduction in brightness can be avoided. Furthermore, if the average particle size is 50.0 µm or less, the density of the powder can be increased when the powder is formed into a paste and coated onto an emission body element or the like, and a reduction in brightness can be avoided from this viewpoint as well. Also, in accordance with the research of the present inventors, the average particle size is preferably 1.0 µm or greater in view of considerations related to the emission efficiency of the phosphor powder, although the specific reason for this is unknown.

The average particle size of the powder in the phosphor of this embodiment is preferably 1.0 µm or more and 50.0 µm or less. As used herein, the average particle size (D50) is a value measured by a LS230 (laser diffraction dispersion) manufactured by Beckman Coulter, Inc. From this viewpoint, the value of a specific surface area (BET) is preferably 0.05 m²/g or more and 5.00 m²/g or less.

The distribution width of the particle size distribution is preferably a sharp distribution because of considerations related to reducing coating nonuniformities when the powder is coated. A coefficient of variation CV is used as an index related to the distribution width of the particle size distribution. The coefficient of variation CV is calculated from the following formula, and the value of the coefficient of variation CV is preferably 100% or less in a phosphor that is to be used in a white LED.

Coefficient of variation CV (%)=Standard deviation/Calculated average particle size×100 (Formula)

Method of Manufacturing a Phosphor According to a First Embodiment

Next, the method of manufacturing a first phosphor according to this embodiment will be described using as an example the manufacture of $SrAl_{1.25}Si_{3.75}O_{0.25}N_{6.75}$:Ce (expressed as $SrAl_{1+x}Si_{4-x}O_xN_{7-x}$:Ce, wherein x=0.25 and Ce/(Sr+Ce)= 0.030).

Generally, in many cases, the phosphors are manufactured by a solid-phase reaction, and the phosphor of this embodiment can be also obtained by the solid-phase reaction. However, the manufacturing method is not limited thereto. Each raw material of the element M, the element A, and the element B may be a nitride, oxide, carbonate, hydroxide, a basic carbonate, oxalate, or other commercially available raw materials. However, higher purity is more preferable, and preferably, the raw material of 2N or more, further preferably the raw material of 3N or more is prepared. The particle size of each particle of the raw material is commonly preferred to be a fine particle, in terms of accelerating the reaction. However, the particle size and a form are changed, depending on the particle size and the form of the phosphor obtained. Therefore, the raw material of the nitride and so forth having an approximate particle size in accordance with the particle size and the form required for the phosphor finally obtained may be prepared. However, preferably the raw material with particle size of 50 µm or less, further preferably 0.1 µm or more and 10.0 µm or less may be used. As the raw material of the element Z also, the commercially available nitride, oxide, carbonate, hydroxide, basic carbonate, or oxalate is preferable. Of course, the higher purity of each raw material is more preferable, and the raw material of 2N or more, and further preferably the raw material of 3N or more are prepared.

When manufacturing $SrAl_{1.25}Si_{3.75}O_{0.25}N_{6.75}$:Ce (where Ce (Sr+Ce)=0.030), for example, preferably $SrCO_3$(3N), AlN (3N), $Si_3N_4$(3N) are respectively prepared as the raw materials of the element M, the element A, the element B, and $CeO_2$(3N) is prepared as the element Z. Then, several points are examined in consideration of a deviation generated between a prepared composition of raw materials and the composition after firing, and a prepared composition, whereby a target composition can be obtained after firing, is obtained. In a preparing step prior to firing, raw materials are weighed in amounts that corresponded to 0.970 mol of $SrCO_3$, 1.25 mol of AlN, 4.25/3 mol of $Si_3N_4$, and 0.030 mol of $CeO_2$ so that the molar ratio of the elements after firing is Sr:Al:Si:O:Ce=0.970:1.25:3.75:0.25:0.030.

Here, the $Si_3N_4$ is weighed in an amount that is greater than that of the target composition by 0.50/3 mol. This is due to the fact that, in firing at 1700° or higher and firing over a long period of time, a larger than normal molar ratio is preferably prepared because $Si_3N_4$ gradually sublimates due to firing at high temperature over a long period of time. However, the molar ratio needs to be adjusted in accordance with each firing condition because sublimation varies due to the conditions during firing.

Also, in relation to the oxygen content of the sample after generation, fabrication carried out by causing the required amount of oxygen to be present by adjusting the firing conditions because the carbonate dissolves/nitrides due to the high-temperature firing when a carbonate is used as the raw material of the element M (Sr, in this case). However, without using a carbonate, the oxygen content can be adjusted by the combining the nitrides of the element M, the element A, and the element B, and $Al_2O_3$, $SiO_2$, and other oxides.

A chloride and/or a fluoride of the element M and/or the element A is preferably added in order to improve the crystallinity of the first phosphor of this embodiment, whereby the reaction is accelerated and the sintering temperature and time are reduced. An oxide and/or a nitride of the element M and/or the element A is preferably added in a similar manner because a similar effect can be obtained.

When a carbonate or another raw material having a low melting point is used, the raw material itself acts as a flux, and the reaction is sometimes accelerated. Compounds of the element M and/or the element A, and more particularly fluorides, chlorides, oxides, and nitrides of the element M and/or the element A, which have a melting point of 1000° C. or higher and 2000° C. or lower, are added to the mixture of the raw material powder in the amount of 0.01 wt % to 5.0 wt %, whereby the effect of flux can be further demonstrated.

Particularly preferred are $SrF_2$, $BaF_2$, and $AlF_3$ as fluorides; $SrCl_2$, $BaCl_2$, and $AlCl_3$ as chlorides; $Al_2O_3$, $Ga_2O_3$, $In_2O_3$, $SiO_2$, $GeO_2$ as oxides; and $Ca_3N_2$, $Sr_3N_2$, $Ba_3N_2$, GaN, InN, and BN as nitrides. Particularly preferred are $SrF_2$, $BaF_2$, $Al_2O_3$, and $Ga_2O_3$. Substances other than those described above may be added as the flux, but the flux becomes an impurity, and the characteristics of the phosphor can be degraded. Therefore, a chloride and/or a fluoride compound of the element M and/or the element A, and an oxide and/or a nitride of the element M and/or the element A are preferred.

The weighing and mixing of the samples may be performed in an atmospheric air. However, the nitride in each raw material element is easily affected by moisture, and therefore it is convenient to operate in a glove box in an inactive atmosphere where moisture is sufficiently removed. Either of a dry system or a wet system may be used as a mixing system. However, the raw material readily decomposes when pure water is used as a solvent of the wet mixing. Therefore, a suitable organic solvent, or liquid nitrogen must be selected. A ball mill, a mortar, or another known method may be used as the apparatus.

The raw material thus completed in mixing is put in a crucible, and retained and fired at 1400° C. or more, and more preferably 1600° C. or more and 2000° C. or less for more than 30 minutes in a firing furnace in an atmosphere of nitrogen, rare gas, or ammonia, or a mixed gas of ammonia and nitrogen. In this case, the atmosphere gas in the firing furnace preferably contains 80% or more of nitrogen gas.

If the firing temperature is 1400° C. or more, a phosphor can be obtained in which the solid-phase reaction progresses in a favorable fashion and which has excellent emission characteristics. If the firing temperature is 2000° C. or less, excessive sintering and melting can be prevented from occurring. Since the solid-phase reaction progresses more rapidly as the firing temperature is increased, the retention time can be reduced. On the other hand, the target emission characteristics can be obtained by maintaining the stated temperature over a long period time, even when the firing temperature is low. However, since particle growth progresses and particle shapes increase in size as the length of firing time is extended, the firing time can be set in accordance with the target particle size.

Pressure in the furnace during firing is preferably 0.001 MPa or more and 1.0 MPa or less, and is more preferably 0.01 MPa or more and 0.5 MPa or less. (In this embodiment, the pressure inside the furnace refers to the pressure added to atmospheric pressure.) This is because excessive sintering among particles can be avoided and pulverization after firing is facilitated by firing under a pressure of 1.0 MPa or less, and the penetration of oxygen from the atmosphere into the furnace during firing can be reduced by firing under a pressure of 0.001 MPa or more.

Note that an $Al_2O_3$ crucible, an $Si_3N_4$ crucible, an AlN crucible, a sialon crucible, a C (carbon) crucible, and a BN (boron nitride) crucible or the like which can be used in the aforementioned gas atmosphere may be used as a crucible. However, preferably when the BN crucible is used, intrusion of impurities can be averted.

In addition, during firing, the aforementioned gas atmosphere preferably flows with a flow rate of 0.1 mL/min, for example. This is because gas is generated from the raw material during firing, but by flowing the atmosphere containing more than one kind of gas selected from the aforementioned nitrogen, rare gas, or ammonia, or a mixed gas composed of ammonia and nitrogen, or a mixed gas composed of nitrogen and hydrogen, gas generated from the raw material can be prevented from filling the furnace and affecting the reaction, and as a result, degradation of the emission characteristics of the phosphor can be prevented. Particularly, when carbonate, hydroxide, basic carbonate, oxalate, or the like are used for the raw material, a large amount of gas is generated. Therefore, it is preferable to make the gas flow in a firing furnace and to exhaust the gas thus generated.

In this embodiment, the raw material is preferably fired in a powder state. In a common solid-phase reaction, the raw material may be fired in a pellet state in order to accelerate a uniform reaction for the entire raw material with consideration given to the progress of the reaction by dispersion of the atoms in the mutual contact points of the raw materials. However, in the case of the raw material of this phosphor, the raw material is fired in a powder state to thereby facilitate pulverization after firing, and the shape of the primary particle is an ideal spherical shape. Therefore, the phosphor raw material is preferably handled as a powder. Further, when carbonates, hydroxides, basic carbonates, or oxalates are used as raw materials, $CO_2$ gas is generated by the decomposition of the raw material during firing, but the $CO_2$ gas is sufficiently drawn out if the raw material is a powder, and therefore, from the viewpoint of avoiding a negative effect on the emission characteristics, the raw material is preferably a powder.

After completing the firing, an object thus fired is taken out from the crucible, a mortar, ball mill, or other pulverizing mechanism is used to pulverize the raw material to a predetermined average size, and the phosphor of the composition expressed by $SrAl_{1.25}Si_{3.75}O_{0.25}N_{6.75}$:Ce (where Ce/(Sr+Ce)=0.030) can be manufactured. As needed, the phosphor thus obtained is then cleaned using sulfuric acid, hydrochloric acid, nitric acid, hydrofluoric acid, or water, is classified and annealed, and is surface treated by depositing $SiO_2$ or an electroconductive substance on the surface.

When other elements are used as the element M, the element A, the element B, and the element Z, and when an amount of activation of the element Z as the activator is changed, the phosphor can be manufactured by the same manufacturing method as the aforementioned method by adjusting a blending amount of each raw material at preparing to a predetermined composition ratio.

Phosphor According to a Second Embodiment

A second phosphor according to this embodiment is a phosphor having a matrix structure expressed in the general formula $(M^{(1)}_{m(1)}M^{(2)}_{m(2)}Z_z)A_aB_bO_oN_n$. In the formula, $M^{(1)}$ is one or more types of elements selected from elements having univalent valency in the phosphor, and $M^{(2)}$ is one or more types of elements selected from elements having bivalent valency in the phosphor. The element A is one or more types of elements selected from elements having trivalent valency in the phosphor. The element B is one or more types of elements selected from elements having tetravalent valency in the phosphor. O is oxygen. N is nitrogen. The element Z is an element that acts as an activator in the phosphor and is one or more types of elements selected from rare-earth elements or transition metal elements.

In the crystal structure of the phosphor, the $M^{(1)}$ element, the $M^{(2)}$ element, and the Z element are in the same atomic sites. Therefore, the crystal structure of the phosphor is determined by the ratio of the other elements, i.e., the A element, the B element, the O (oxygen) element, and the N (nitrogen) element in relation to the elements that occupy these same sites. In this case, in the composition formula noted above, the formulation can be adjusted so that $m^{(1)}+m^{(2)}+z=1$, whereby the composition ratio of each of the elements can be handled so as to conform to the values of a, b, o, and n, and simple notation can be used. In view of this fact, in the present invention, the composition ratio of the elements in the crystal structure can be expressed using this method of notation.

From the results of the study of the ratio of each element carried out by the present inventors, a phosphor can be obtained having advantageous emission characteristics in that the phosphor has an excitation band in the range of near ultraviolet/ultraviolet to blue/green color (wavelength: 300 nm to 500 nm) and has an emission peak in the vicinity of a wavelength of 500 nm to 600 nm that can increase brightness while having a broad emission spectrum when the composition ratios of the elements $M^{(1)}$, $M^{(2)}$, and Z, the element A, and the element B (where the formulation is made so the expression $m^{(1)}+m^{(2)}+=1$ holds true) satisfy the relationships $0.5 \leq a \leq 2.0$, $3.0 \leq b \leq 7.0$, $m^{(1)}>0$, $m^{(2)}>0$, $z>0$, and $4.0 \leq (a+b) \leq 7.0$.

This is thought to be due to the fact that the generation of an impurity phase having a crystal structure that is different than that of the phosphor is reduced, and the emission characteristics are maintained by keeping the composition ratio of each element in this range. In the same manner, a phosphor having high emission characteristics can be obtained when the ratio of the oxygen element is in the range of $0<o \leq 4.0$. This is because the generation of impurities does not occur and the emission characteristics are maintained by keeping the amount of oxygen in the stated range.

In relation to the nitrogen element, the sum of the charges within the crystal structure is zero and the most stable crystal structure is obtained when the expression $n=1/3\ m^{(1)}+2/3\ m^{(2)}+z+a+4/3b-2/3o$ is satisfied with consideration given to the charge of each of the constituent elements. Therefore, it is surmised that high emission characteristics can be obtained by keeping the amount of nitrogen in the state range.

In the composition range described above (when formulated so that $m^{(1)}+m^{(2)}+z=1$), the generation of impurities described above can be more greatly reduced and the phosphor substance can be obtained in substantially a single phase when the expressions $0.8 \leq a \leq 2.0$, $3.0 \leq b \leq 6.0$, and $0<o \leq 1.0$ are satisfied. Such a situation is preferred because a phosphor having excellent emission intensity and brightness can accordingly be obtained.

In the composition range described above, a phosphor having excellent emission characteristics can be obtained in the particular case that the expressions $a=1+o$, $b=4-o$, and $n=7-o$ are satisfied when $0<o \leq 1.0$. This is thought to be due to the fact that the crystal structure of the phosphor is the most optimal structure for luminescence. This is the most preferred compositional ratio because the emission intensity and brightness are even further improved.

The emission mechanism in the conventional phosphor described above is endowed with emission characteristics by substituting a portion of the M sites with an element Z, which is referred to as the activator element. Here, the element Z has a different ion radius and ion valency than the element that originally occupies the M sites. When the M sites of the substance acting as the matrix are substituted with the element Z with the aim of obtaining luminescence, strain is generated in the crystal structure due to the difference in the ion radii of the element M and the element Z, and the balance between electric charges is lost due to the difference in the ion valencies of the element M and the element Z, whereby the crystal structure becomes unstable. When instability is present in such a crystal structure, a state is brought about in which the energy of the excitation light that has penetrated the crystal is lost due to dissipation, and the energy cannot efficiently reach the emission center. Furthermore, the instability increases dramatically when the substitution amount of the element Z that contributes to luminescence is increased in order to obtain higher emission characteristics. It is thought that it is difficult to fabricate a phosphor having high emission intensity and brightness due to the instability of the crystal structure. In contrast, in the phosphor according to this embodiment, it is thought that the element in the M sites reduces the imbalance of the electric charges and the strain of the crystal structure associated with the substitution of the element Z into the M sites by mixing the bivalent element $M^{(2)}$ with the univalent element $M^{(1)}$.

For example, when a trivalent activator element having a smaller ion radius is introduced to the $M^{(2)}$ sites occupied by the bivalent $M^{(2)}$ element, the crystal structure becomes structurally and electrically unstable because the crystal lattice shrinks locally and the positive charge becomes excessive by an amount commensurate with the quantity of activator. The balance of the electric charges can be restored by introducing atoms of a univalent element $M^{(1)}$ in approximately the same number as that of the atoms of the element Z. The strain of the crystal structure can be reduced as long as the element $M^{(1)}$ has an ion radius that is greater than that of the element Z.

Based on the above, the amount in which the sites of the element $M^{(2)}$ are substituted by the atoms of the $M^{(1)}$ element is preferably approximately equal to the number of atoms of the element Z. Specifically, the value of $m^{(1)}$ is preferably $0 < m^{(1)} \leq 0.05$. Here, the value of $m^{(1)}$ indicates the ratio (i.e., the site substitution ratio of the element $M^{(1)}$) occupied by the element $M^{(1)}$ in the sites composed of the element $M^{(1)}$, the element $M^{(2)}$, and the element Z using the expression $m^{(1)} = 1 - m^{(2)} - z$.

A phosphor having greater emission intensity and brightness can be fabricated by stabilizing the crystal structure of the phosphor by substituting the $M^{(2)}$ sites using the element $M^{(1)}$.

Here, the element $M^{(1)}$ will be described in greater detail.

The element $M^{(1)}$ is an element having a univalent valency, and is principally Li, Na, K, Rb, or another alkali metal. The element $M^{(1)}$ is a component of a phosphor in which a portion of the element $M^{(2)}$ described below is substituted. The type and substitution amount of the element $M^{(1)}$ may be selected with consideration given to differences in the ion radius and charge of the element $M^{(2)}$ and the activator element Z.

For example, in a preferred embodiment of the present invention, the crystal lattice locally shrinks and the positive charges in the crystal lattice become excessive because a portion of the $Sr^{2+}$ sites is substituted with $Ce^{3+}$ in the case that Sr has been selected as the element $M^{(2)}$ and Ce has been selected as the element Z. In this case, the element $M^{(1)}$ can be introduced in about the same amount as the element Z in order to maintain the balance between the charges, but K or Rb, which has an ion radius that is greater than that of $Ce^{3+}$, is preferably introduced in order to simultaneously reduce the strain of the crystal lattice. K is particularly readily obtained and is preferred from the aspect of manufacturing cost.

Next, the element $M^{(2)}$ will be described in greater detail.

Preferably, Sr is first selected as the element $M^{(2)}$, and the element is additionally one or more kinds of elements selected from Mg, Ca, Ba, Zn, and rare-earth elements having a bivalent valency. More preferably Sr is used alone, or Sr and Ba are used in combination. Sr and Ba are most preferably used in combination, and the ratio of the Sr is 95 at % or more and less than 100 at %. A phosphor having high emission characteristics can be obtained by using such a configuration.

Next, the element A will be described in greater detail.

The element A is preferably one or more kinds of elements selected from Al, Ga, In, Tl, Y, Sc, La, P, As, Sb, and Bi, is more preferably one or more kinds of elements selected from the group IIIA elements Al, Ga, and In, and is most preferably Al. Al is preferred in that AlN, which is a nitride, is used as a common heat transmission material or as a structural material, is readily available and inexpensive, and has a low environmental impact.

Next, the element B will be described in greater detail.

The element B is preferably one or more kinds of elements selected from Si, Ge, Sn, Ti, Hf, Mo, W, Cr, Pb, and Zr, is more preferably Si and/or Ge, and is most preferably Si. Si is preferred in that $Si_3N_4$, which is a nitride, is used as a common heat transmission material or as a structural material, is readily available and inexpensive, and has a low environmental impact.

Next, the element Z will be described in greater detail.

The element Z is one or more kinds of elements selected from rare-earth elements or transition metal elements that are blended in a form in which a portion of the element $M^{(1)}$ or the element $M^{(2)}$ in the matrix structure of the phosphor has been substituted.

From the viewpoint of demonstrating sufficient color rendering in a white LED illumination or various other light sources in which the phosphor of this embodiment is used, the half-width value of the peak in the emission spectrum of the phosphor is preferably increased. From this aspect, the element Z is preferably one or more kinds of elements selected from Eu, Ce, Pr, Tb, Yb, and Mn, and most preferable among these is Ce.

The amount of the element Z to be added is preferably in the range of 0.0001 or more and 0.50 or less, which is the value of the z (where $z/(m^{(1)} + m^{(2)} + z) = z$) as the substitution ratio of the element sites of $M^{(1)}$ and $M^{(2)}$ by the activator element Z, when the phosphor of this embodiment is expressed by the general formula $(M^{(1)}{}_{m(1)} M^{(2)}{}_{m(2)} Z_z) A_a B_b O_o N_n$. A reduction in the emission efficiency due to concentration quenching caused by excessive activator (element Z) content can be prevented as long as the site substitution ratio z of the activator element Z is in the stated range. On the other hand, a reduction in the emission efficiency due to the deficiency of the atoms contributing to light emission caused by excessively low content of the activator (element Z) is thereby prevented from deteriorating. An even more preferred option is obtained as long as the value of z is within the range of 0.001 or more and 0.10 or less. The optimal value of the range of z values varies slightly depending on the type of activator (element Z) and the types of elements $M^{(1)}$ and $M^{(2)}$.

In the second phosphor (general formula: $(M^{(1)}{}_{m(1)} M^{(2)}{}_{m(2)} Z_z) AaBbOoNn$) according to this embodiment, when K was selected as the element $M^{(1)}$, Sr was selected as the element $M^{(2)}$, Al was selected as the element A, Si was selected as the element B, and Ce was selected as the element Z, the weight ratios of the elements constituting the aforementioned phosphor were obtained by compositional analysis of the phosphor after fabrication, and Sr was 21.0 wt % or more and 27.0 wt % or less, Al was 8.0 wt % or more and 14.0 wt % or less, O was 0.5 wt % or less and 6.5 wt % or less, N was 26.0 wt % or more and 32.0 wt % or less, and Ce was greater than 0 and 4.0 wt % or less. The weight ratio of K was greater than 0 and less than 1.0 wt %. In addition to the composition described above, Si or impurities mixed in the raw materials may be included. When the phosphor was irradiated with monochromatic light in the wavelength range of 300 nm to 500 nm, or with mixed light composed of these kinds of monochromatic light as excitation light, the peak wavelength of the emission spectrum of the phosphor was in a wavelength range of 500 to 600 nm. At this point, the phosphor exhibited a sufficient emission intensity and good emission characteristics; i.e., the chromaticity x of the chromaticity (x, y) of the emission spectrum was in a range of 0.380 to 0.550, and the chromaticity y was in a range of 0.400 to 0.600.

As described above, in this embodiment, Sr and Ba are selected as the element $M^{(2)}$, and the ratio of Sr is set to 95 at % or more and less than 100 at %, whereby high emission efficiency can be obtained. In this case, the weight ratio of the element Ba in relation to the phosphor was measured and was greater than 0 and less than 2.0 wt %.

The second phosphor according to this embodiment is used in a powder form, whereby application can readily be made to white LED illumination and various other emission devices. Here, when the phosphor is used in a powdery state, the phosphor preferably contains primary particles having particle size of 50.0 μm or less and aggregates composed of the primary particles, wherein the average particle size (D50) of the powdery phosphor containing the primary particles and the aggregates is 1.0 μm or more and 50.0 μm or less, and is more preferably 1.0 μm or more and 20.0 μm or less. This is thought to be due to the fact that, as long as the average particle size is 50.0 μn or less, the pulverizing step can thereafter be readily carried out and the surface area per unit weight of the powder can be assured, and by reason that the light emission in the phosphor powder mainly occurs on the surface or the particles, a reduction in brightness can be avoided. Furthermore, if the average particle size is 50.0 μm or less and more preferably 20.0 μm or less, the density of the powder can be increased when the powder is formed into a paste and coated onto an emission element or the like, and a reduction in brightness can be avoided from this viewpoint as well. Also, in accordance with the research of the present inventors, the average particle size is preferably 1.0 μm or greater in view of considerations related to emission efficiency of the phosphor powder, although the specific reason for this is unknown.

The average particle size of the powder in the phosphor of this embodiment is preferably 1.0 μm or more and 50.0 μm or less. As used herein, the average particle size (D50) is a value measured by an LS230 (laser diffraction dispersion) manufactured by Beckman Coulter, Inc. From this viewpoint, the value of a specific surface area (BET) is preferably 0.05 m$^2$/g or more and 5.00 m$^2$/g or less.

Method of Manufacturing a Phosphor According to a Second Embodiment

The method of manufacturing a second phosphor according to this embodiment will be described using as an example the manufacture of $(K_{0.04}Sr_{0.93}Ce_{0.03})Al_{1.3}Si_{3.7}O_{0.3}N_{6.7}$ (where, in the compositional formula described above, K is the element $M^{(1)}$, Sr is the element $M^{(2)}$, o=0.30, and $m^{(1)}$=0.04).

Generally, in many cases, the phosphors are manufactured by a solid-phase reaction, and the phosphor of this embodiment can be also obtained by the solid-phase reaction. However, the manufacturing method is not limited thereto. Each raw material of the element $M^{(1)}$, element $M^{(2)}$, the element A, and the element B may be a nitride, oxide, carbonate, hydroxide, a basic carbonate, oxalate, or other commercially available raw materials. However, higher purity is more preferable, and preferably, the raw material of 2N or more, further preferably the raw material of 3N or more is prepared. The particle size of each particle of the raw material is commonly preferred to be a fine particle, in terms of accelerating the reaction. However, the particle size and a form are changed, depending on the particle size and the form of the phosphor obtained. Therefore, the raw material of the nitride and so forth having an approximate particle size in accordance with the particle size and the form required for the phosphor finally obtained may be prepared. However, preferably the raw material with a particle size of 50 μm or less, further preferably 0.1 μm or more and 10.0 μm or less may be used.

As the raw material of the element Z, a commercially available nitride, oxide, carbonate, hydroxide, basic carbonate, or oxalate is preferred. Of course, the higher purity of each raw material is more preferable, and the raw material of 2N or more, and further preferably the raw material of 3N or more are prepared.

When manufacturing $(K_{0.04}Sr_{0.93}Ce_{0.03})Al_{1.3}Si_{3.7}O_{0.3}N_{6.7}$, for example, preferably $K_2CO_3(3N)$, $SrCO_3(3N)$, $AlN(3N)$, and $Si_3N_4(3N)$ are respectively prepared as the raw materials of the element $M^{(1)}$, the element $M^{(2)}$, the element A, and the element B, and $CeO_2(3N)$ is prepared as the element Z. Then, several points are examined in advance in consideration of a deviation generated between the prepared composition of raw materials and the composition after firing, and a prepared composition that makes it possible to obtain a target composition after firing is calculated. In a preparing step prior to firing, raw materials are weighed in amounts that corresponded to 0.04/2 mol of $K_2CO_3$, 0.92 mol of $SrCO_3$, 1.25 mol of AlN, 4.5/3 mol of $Si_3N_4$, and 0.050 mol of $CeO_2$ so that the molar ratio of the elements after firing is K:Sr:Al:Si:O:Ce=0.04:0.93:1.3:3.7:0.30:0.030.

Here, the components are weighed in a weight ratio that is different from that of the composition formula that is the ultimate target. This is due to the fact that, in firing at 1700° or higher and firing over a long period of time, consideration is given to the amount of raw materials that gradually decompose and sublimate. However, the ratio in which the raw materials decompose and sublimate varies in accordance with each firing condition, and is therefore adjusted due to the conditions during firing.

Also, in relation to the oxygen content of the sample after generation, the weight ratio calculated from the mixture ratio is considerably reduced because the carbonate decomposes and undergoes nitriding due to the high-temperature firing when a carbonate is used as the raw material of the elements $M^{(1)}$ (K, in this case) and $M^{(2)}$ (Sr, in this case). The firing conditions described below were adjusted so that the required amount of oxygen remained. However, without using a carbonate, the oxygen content can be adjusted by combining nitrides of the element $M^{(1)}$, the element $M^{(2)}$, the element A, and the element B, and $Al_2O_3$, $SiO_2$, and other oxides. A small amount of C (carbon) powder may be added to the raw materials in order to increase reducibility. However, in this case, notice must be taken of the carbon component remaining as a residue after firing.

The weighing and mixing may be performed in an atmospheric air. However, the nitride in each raw material element is easy affected by moisture, and it is therefore convenient to operate in a glove box in an inactive atmosphere in which moisture has been sufficiently removed. Either of a dry system or a wet system may be used as a mixing system. However, the raw material readily decomposes when pure water is used as a solvent of the wet mixing. Therefore, a suitable organic solvent, or liquid nitrogen must be selected. A ball mill, a mortar, or another known method may be used as the apparatus.

The raw material thus completed in mixing is put in a crucible, and retained and fired at 1400° C. or more, and more preferably 1600° C. or more and 2000° C. or less for more than 30 minutes in a firing furnace in an atmosphere of nitrogen, rare gas, or ammonia, or a mixed gas of ammonia and nitrogen. In this case, the atmosphere gas in the firing furnace preferably contains 80% or more of nitrogen gas.

If the firing temperature is 1400° C. or more, a phosphor can be obtained in which the solid-phase reaction progresses in a favorable fashion and which has excellent emission characteristics. If the firing temperature is 2000° C. or less, excessive sintering and melting can be prevented from occurring. Since the solid-phase reaction progresses more rapidly as the firing temperature is increased, the retention time can reduced. On the other hand, the target emission characteristics can be obtained by maintaining the stated temperature over a long period time, even when the firing temperature is low. However, since particle growth progresses and particle shapes increase in size as the length of firing time is extended, the firing time can be set in accordance with the target particle size.

Pressure in the furnace during firing is preferably 0.0001 MPa or more and 1.0 MPa or less, and is more preferably 0.01 MPa or greater and 0.5 MPa or less. (In this embodiment, the pressure inside the furnace refers to the pressure added to atmospheric pressure.) This is because excessive sintering among particles can be avoided and pulverization after firing is facilitated by firing under a pressure of 1.0 MPa or less. On the other hand, the penetration of oxygen from the atmosphere into the furnace during firing can be reduced by firing under a pressure of 0.0001 MPa or more. Note that an $Al_2O_3$ crucible, an $Si_3N_4$ crucible, an AlN crucible, a sialon crucible, a C (carbon) crucible, and a BN (boron nitride) crucible or the like which can be used in the aforementioned gas atmosphere may be used as a crucible. In particular, a nitride can be used as the crucible, but a BN crucible is preferably used because the intrusion of impurities can be averted. The amount of impurities that become intermixed from the crucible is preferably kept to 0.1 wt % or less in order to avoid compromising the emission characteristics of the resulting phosphor powder. In particular, B (boron) and/or C (carbon) as impurities are preferably kept to 0.1 wt % or less.

In addition, during firing, the aforementioned gas atmosphere preferably flows with a flow rate of 0.1 mL/min, for example. This is because gas is generated from the raw material during firing, but by flowing the atmosphere containing more than one kind of gas selected from the aforementioned nitrogen, rare gas, or ammonia, or a mixed gas composed of ammonia and nitrogen, or a mixed gas composed of nitrogen and hydrogen, gas generated from the raw material can be prevented from filling the furnace and affecting the reaction, and as a result, degradation of the emission characteristics of the phosphor can be prevented. Particularly, when carbonate, hydroxide, basic carbonate, oxalate, or another raw material that decomposes at high temperatures is used as the raw material, a large amount of gas is generated. Therefore, it is preferable to make the gas flow in a firing furnace and to exhaust the gas thus generated.

In this embodiment, the raw material is preferably fired in a powder state. In a common solid-phase reaction, the raw material may be fired in a pellet state in order to accelerate a uniform reaction for the entire raw material with consideration given to the progress of the reaction by dispersion of the atoms in the mutual contact points of the raw materials. However, in the case of the raw material of this phosphor, the raw material is fired in a powder state to thereby facilitate pulverization after firing, and the shape of the primary particle is an ideal spherical shape. Therefore, the phosphor raw material is preferably handled as a powder. Further, when carbonates, hydroxides, basic carbonates, or oxalates are used as raw materials, $CO_2$ gas is generated by the decomposition of the raw material during firing, but the $CO_2$ gas is sufficiently drawn out if the raw material is a powder, and therefore, from the viewpoint of avoiding a negative effect on the emission characteristics, the raw material is preferably a powder.

In this embodiment, it is preferred that the firing step be repeated two times or more in the conditions described above, the samples be temporarily removed from the furnace between the firing steps, and a pulverizing and mixing operation be added. The uniformity of the fired product is improved and the emission efficiency of the phosphor is improved by repeating the firing. In the pulverization and mixing operation, a mortar, a ball mill, a bead mill, a jet mill, or another known method may be used.

After completing the firing, an object thus fired is taken out from the crucible, a mortar, ball mill, or other pulverizing mechanism is used to pulverize the raw material to a predetermined average particle size, and the phosphor of the composition expressed by $(K_{0.04}Sr_{0.93}Ce_{0.03})Al_{1.3}Si_{3.7}O_{0.3}N_{6.7}$ can be manufactured. The phosphor thus obtained is then optionally cleaned using acid or water, classified, annealed, and subjected to a surface treatment.

When other elements are used as the element $M^{(1)}$, the element $M^{(2)}$, the element A, the element B, and the element Z, and when an amount of activation of the element Z as the activator is changed, the phosphor can be manufactured by the same manufacturing method as the aforementioned method by adjusting a blending amount of each raw material at preparing to a predetermined composition ratio.

In this embodiment in particular, a phosphor having high emission characteristics can be fabricated by using a mixture of Sr and Ba as the element $M^{(2)}$. In this case, nitrides, oxides, carbonates, hydroxides, basic carbonates, oxalate, and the like of Sr and Ba can be weighed and mixed so as to achieve a desired ratio. Barium chloride, barium fluoride, barium oxide, and barium carbonate are preferred as the Ba compound in that a phosphor having high emission intensity can be obtained, and particularly preferred among these is barium oxide.

The second phosphor according to this embodiment absorbs light in a broad wavelength range and generates a green color to yellow color luminescence having a wavelength of 500 nm to 600 nm. Light having a wavelength that is different from a first wavelength can therefore be generated and various light sources can be fabricated by combining the phosphor of this embodiment and an emission part that generates a first wavelength.

Emission Device in which the Phosphor According to the First Embodiment is Used Following is a description of an emission device which has the phosphor according to the first present embodiment and an emission part that emits light having a first wavelength, in which all or a portion of the light having a first wavelength is used as the excitation light, and in which a light having a different wavelength than the first wavelength is emitted from the phosphor. In this case, the first wavelength is a wavelength of 300 nm to 500 nm.

An LED emission element that emits light in the range of, e.g., near ultraviolet/ultraviolet to blue/green color, or an electric-discharge lamp that emits ultraviolet light, may be used as the emission part for emitting a light having a first wavelength. Various illumination units, backlights for display devices, and the like can be manufactured when a phosphor mixture that contains the phosphor of the present invention is combined with this LED light emitting element, and various fluorescent lamps, illumination units, backlights for a display device, and the like can be manufactured when the phosphor mixture of this embodiment is combined with this electric-discharge lamp. Furthermore, a display device can also be manufactured by combining the phosphor of this embodiment with a device that emits an electron beam.

In particular, since the temperature characteristics of the phosphor of this embodiment are excellent, a phosphor can be fabricated in which a reduction of the emission characteristics substantially does not occur even when the temperature of the emission device increases due to light over a long period of time. Also, the phosphor has an emission spectrum that has a peak in the range of green color to orange color, and since the shape of the peak is broad, the phosphor is suitable for use in a white LED illumination from the viewpoint of color rendering properties. Further, the excitation band is flat in the broad range of near ultraviolet/ultraviolet to blue green color (wavelength range: 300 to 500 nm). Therefore, this phosphor provides a state close to maximum emission intensity in either of the following cases: The case of a white LED illumination of a system for obtaining white color by utilizing a complementary relation between a blue light emission of the high luminance blue LED (wavelength: in the vicinity of 460 nm) and a yellow light emission of a phosphor, which is proposed as a white LED illumination, and the case of white LED illumination in the system for obtaining white color by utilizing the mixed state of colors of the light obtained from the phosphors of R, G, and B, and other colors by combining the LED emitting light of near ultraviolet/ultraviolet (wavelength: in the vicinity of 380 to 410 nm), a red color (R) emitting phosphor, a green color (G) emitting phosphor, and a blue color (B) emitting phosphor that are excited by the near ultraviolet/ultraviolet light generated from the LED.

In other words, by combining the emission part that emits light from the near ultraviolet/ultraviolet to blue color and the phosphor of this embodiment, it is possible to obtain a white light source and white LED illumination having high output and good color rendering properties, and to obtain an illumination unit using the same.

When the emission device as described above is used as a high-color rendering illuminating light source, the emission spectrum must have excellent color rendering properties. Therefore, the color rendering properties of the emission device incorporating the phosphor mixture that includes the phosphor of this embodiment were evaluated using the evaluation method of JIS Z 8726. In the evaluation of JIS Z 8726, when the average color rendering index Ra of this light source is 60 or more, the device can be used for common illumination. The device can be regarded to be an excellent emission device if Ra is 80 or more. Then, the device can be regarded to be a very excellent emission device when a special color rendering index R15, which is an index showing a skin color component of Japanese women, is preferably 80 or more, and when a special color rendering index R9 is more preferably 60 or more. However, the aforementioned index is not required to be satisfied, depending on differing purposes and applications that do not require color rendering properties.

The present inventors fabricated an emission device in which the phosphor mixture that includes the phosphor of the present invention is irradiated with light from an emission part that emits light having a wavelength in the range of 300 nm to 500 nm, and light is emitted by the phosphor mixture. An emission element that emits light having a wavelength of 460 nm was used as an emission part. Then, the color rendering properties of the emission spectrum of this emission device were evaluated. As a result, the color rendering properties of the emission device incorporating the phosphor mixture that includes the phosphor of this embodiment had a Ra of 60 or more in a correlated color temperature range of 10000 K to 2500 K. The emission device that incorporates the phosphor mixture to which a red color phosphor has been added to the phosphor of this embodiment exhibited high color rendering properties in which R15 was 80 or more and R9 was 60 or more, and this emission device was found to be a light source with high brightness and extremely excellent color rendering properties.

The correlated color temperature of the emission spectrum in the emission device of this embodiment is preferably in a range of 10000 K to 2500 K as noted above, and is more preferably in a range of at least 7000 K to 2500 K.

Emission Device in which the Phosphor According to the Second Embodiment is Used The second phosphor according to this embodiment emits light at high efficiency using, in particular, excitation light having a wavelength of 300 nm to 500 nm, and the emission wavelength of the emission part is therefore preferably kept in the stated range.

The second phosphor according to this embodiment in particular demonstrates a very broad emission spectrum having considerable intensity in a wavelength range of 500 nm to 600 nm, i.e., green color to yellow color. Therefore, an emission device having high color rendering properties and high brightness can be manufactured by combination with a light source that emits a blue color light having a wavelength of 460 nm, for example.

The color rendering properties will be briefly described below. Color rendering refers to the fact that the visual appearance of colors of an object illuminated by light from a light source will appear to change depending on the type of light source. The color rendering properties, which show the reproducibility of the colors of an illuminated object, can generally be numerically expressed by an average color rendering index (Ra), while this depends on the type of the light source. The best average color rendering index (Ra=100) is achieved as long as the exact same color as the one viewed under a reference light can be reproduced, and the Ra value is reduced (Ra<100) as the difference in the reproduced colors increases.

In the evaluation of JIS Z 8726, when the average color rendering index Ra of this light source is 60 or more, the device can be used for common illumination. The device can be regarded to be an excellent emission device if Ra is 80 or more. Then, the device can be regarded to be an excellent emission device when a special color rendering index R15, which is an index showing a skin color component of Japanese women, is preferably 80 or more, and when a special color rendering index R9 is more preferably 60 or more. However, the aforementioned index is not required to be satisfied, depending on differing purposes and applications that do not require color rendering properties.

The correlated color temperature of the light source is preferably in a range of 10000 K to 2000 K, and is more preferably in a range of 7000 K to 2500 K.

The present inventors fabricated an emission device in which the phosphor mixture that includes the phosphor of the present invention is irradiated with light from an emission part that emits light having a wavelength of 460 nm, and light is emitted by the phosphor mixture. As a result, the color rendering properties of the emission device incorporating the phosphor mixture that includes the phosphor of this embodiment had a Ra of 60 or more in a correlated color temperature range of 10000 K to 2500 K. The emission device that incorporates the phosphor mixture to which a red color phosphor has been added to the phosphor of this embodiment exhibited high color rendering properties in which Ra was 80 or more, R15 was 80 or more, and R9 was 60 or more, and this emission device was found to be a light source with high brightness and extremely excellent color rendering properties.

Combination of the Phosphors According to the First and Second Embodiments and an Emission Part The method of combining the mixture of the phosphors of the first and second embodiments and an emission part may be a known method, but an emission device that uses an LED as the emission part can be fabricated in the manner described below. The emission device that uses an LED as the emission part is described below with reference to the diagrams.

FIGS. 6(A) to 6(C) are schematic sectional views of a bullet-type LED emission device, and FIGS. 7(A) to 7(E) are schematic sectional views of a reflective-type LED emission device. In the diagrams, the same reference numerals are used for corresponding portions, and a description is omitted.

First, an example of an emission device combined with the phosphor mixture by using the LED in the emission part will be described with reference to FIG. 6(A). In the bullet-type LED emission device, an LED light emitting element 2 is set in a cup-shaped container 5 provided on the tip end of a lead frame 3, and these are molded using a translucent resin 4. In this embodiment, the phosphor mixture or a mixture in which the phosphor mixture is dispersed in silicone, epoxy, or another translucent resin (described as mixture 1 hereunder) fills an entire cup-shaped container 5. $SiO_2$ or $Al_2O_3$ may be mixed as a dispersion material in the resin.

Next, an example of a different emission device will be described with reference to FIG. 6(B). In this embodiment, the cup-shaped container 5 and the upper surface of the LED emission element 2 are coated with a mixture 1.

Next, an example of a different emission device will be described with reference to FIG. 6(C). In this embodiment, a phosphor mixture 1 is disposed in the upper portion of the LED emission element 2.

The bullet-type LED emission device described above with reference to FIGS. 6(A) to 6(C) is configured so that the direction in which light is discharged from the LED emission element 2 is the upward direction, but the emission device can be fabricated using the same method when the direction in which light is discharged is the downward direction. For example, the reflective type LED emission device is constituted in such a manner that a reflective surface and a reflective plate are provided in the direction of light emission of the LED light emitting element 2, and the light emitted from this light emitting element 2 is reflected by the reflective surface so as to be emitted to the exterior. In view of the above, an emission device in which the reflective-type LED emission device and the phosphor mixture of this embodiment are combined will be described with reference to FIGS. 7(A) to 7(E).

First, an example of the emission device combined with the phosphor mixture of the present embodiment will be described with reference to FIG. 7(A) using a reflective-type LED emission device as the emission part. In the reflective type LED emission device, the LED light emitting element 2 is set on one tip end of one lead frame 3, and light is emitted from the LED light emitting element 2 so as to be directed downward, reflected by the reflective face 8, and discharged upward. In this embodiment, the mixture 1 is applied onto the reflective surface 8. A transparent mold material 9 is sometimes filled in a recessed portion formed by the reflective face 8 so as to protect the LED light emitting element 2.

Next, an example of a different emission device will be described with reference to FIG. 7(B). The embodiment has a mixture 1 disposed on a lower portion of the LED emission element 2.

Next, an example of a different emission device will be described with reference to FIG. 7(C). In this embodiment, a mixture 1 is filled in the concavity formed by a reflective surface 8.

Next, an example of a different emission device will be described with reference to FIG. 7(D). The embodiment has a mixture 1 applied to the upper portion of the transparent mold material 9 for protecting the LED emission element 2.

Next, an example of a different emission device will be described with reference to FIG. 7(E). The embodiment has a mixture 1 applied to the surface of the LED emission element 2.

A bullet-type LED emission device and a reflective-type LED emission device may be used in accordance with the application, but the reflective-type LED emission device has advantages in that it can be made thinner, the emission surface area for focusing light from a reflective mirror can be controlled, light-usage efficiency is increased, and other advantages can be achieved.

EXAMPLES

The present invention will be described in greater detail below using examples.

Examples 1 to 44 and comparative example 1 relate to the phosphor according to the first embodiment, and examples 45 to 65 and comparative examples 2 to 4 relate to the phosphor according to the second embodiment.

Examples 1 to 5

In examples 1 to 5, x was varied from 0 to 1 in the formula $SrAl_{1+x}Si_{4-x}O_xN_{7-x}$:Ce (wherein Ce/(Sr+Ce)=0.030) and a phosphor was manufactured. The manufacturing method entailed weighing the raw material of each element so that the molar ratio of the elements after firing resulted in a sample in which Sr:Al:Si:O:Ce=0.970:1+x:4−x:x:7−x:0.030. In the case that x=0 (example 1), a nitride was used in all raw materials because oxygen contained in raw materials has an effect when $SrCO_3$ is used as the raw material. As starting raw materials, 0.970/3 mol of $Sr_3N_2$(2N), 1.00 mol of AlN(3N), 4.0/3 mol of $Si_3N_4$(3N), and 0.030 mol of $CeO_2$(3N) were weighed. When all of the starting raw materials are composed of a nitride material, the amount of oxygen contained in the raw materials is low and the sublimation of $Si_3N_4$ can be reduced. Therefore, the $Si_3N_4$ raw material was weighed in a fixed amount. Also, the additive amount of $CeO_2$ used as the activator was very small, and the oxygen in $CeO_2$ was therefore ignored.

In the case that x=0.25 (example 2), 0.970 mol of $SrCO_3$, 1.25 mol of AlN, 4.25/3 mol (weighed in an amount that is greater than that of the target composition by 0.50/3 mol) of $Si_3N_4$, and 0.030 mol of $CeO_2$ were weighed. In examples 3 to 5 and in example 6 described below, a phosphor sample was fabricated in the same manner as in example 2, except that the mixture ratio was adjusted so that the raw materials assumed a prescribed x. The values of x thus adjusted were x=0.5 (example 3), x=0.75 (example 4), and x=1.00 (examples 5).

Because the Si and oxygen contents vary after firing depending on the firing time and the firing temperature, amounts that conform to the firing conditions can be used for the raw materials so that the product after firing conforms to the target composition, and the amount of oxygen can be adjusted in combination with $Al_2O_3$, $SiO_2$, and other oxides when a nitride is used as the raw material of the element M.

The raw materials thus mixed were placed in a BN crucible, after vacuuming inside the furnace, temperature was increased to 1750° C. at 15° C./min at an in-furnace pressure of 0.05 MPa, retained and fired at 1750° C. for six hours in a nitrogen atmosphere (flow state: 4.0 L/min), and then cooled from 1750° C. to 50° C. in one hour and 30 minutes. Thereafter, the fired sample was crushed to a proper particle size by using the mortar in atmospheric air, and a phosphor expressed by the composition formula $SrAl_{1+x}Si_{4-x}O_xN_{7-x}$:Ce ($0 \leq x \leq 1.0$) was obtained.

Comparative Example 1

In comparative example 1, a phosphor in which x was set to 1.5 in $SrAl_{1+x}Si_{4-x}O_xN_{7-x}$:Ce (wherein Ce/(Sr+Ce)=0.030) was manufactured in the same manner as in examples 1 to 6. $SrCO_3$(3N), AlN(3N), $Si_3N_4$(3N), $Al_2O_3$(3N), $CeO_2$(3N) were prepared; and raw materials were weighed in amounts that corresponded to 0.970 mol of $SrCO_3$, 2.50−(2×0.50/3) mol of AlN, 3.0/3 mol (mixed with an additional 0.5/3 mol) of $Si_3N_4$, 0.50/3 mol of $Al_2O_3$, and 0.030 mol of $CeO_2$ so that the molar ratio of the elements after firing was Sr:Al:Si:O:Ce=0.970:2.50:2.50:1.50:0.030. The mixed raw materials were directly mixed in the same manner as in examples 1 to 5 and fired.

Excitation of monochromatic light at a wavelength of 460 nm

TABLE 1 shows the measurement results of the emission intensity, chromaticity (x, y), and brightness when the phosphors of examples 1 to 5, comparative example 1, and example 6, which is described below were irradiated with monochromatic light at a wavelength of 460 nm as an excitation light (25° C.). The emission intensity and brightness are shown with the phosphor fabricated in example 2 set to 100. The half-width value of the phosphor obtained in example 2 was calculated and found to be 116.2 nm. The chromaticity (x, y) of the emission spectrum was calculated, and it was found that the chromaticity was x=0.402 and y=0.550. The powders of the phosphors of examples 1 to 5 were all yellow phosphor colors, and a yellow green emission color was visually confirmed.

In FIG. 1, the emission intensity of the phosphor is shown on the vertical axis, and the value of x is shown on the horizontal axis. FIG. 2 shows the emission spectra of example 2, comparative example 1, and example 6 described below. The vertical axis of FIG. 2 represents the relative emission intensity and the horizontal axis is the emission wavelength. Here, the emission spectrum of example 2 is shown by a solid line, that of example 6 is shown by an alternate long and short dash line, and that of example 1 is shown by a broken line. In this case, the emission spectrum is the spectrum of light discharged from the phosphor when the phosphor is irradiated with light having a certain wavelength or energy. The emission spectrum of the phosphor of example 2 has a broad peak in a wide wavelength range of 470 nm to 720 nm and a peak wavelength of 556.6 nm when irradiated with a monochromatic light at a wavelength of 460 nm as an excitation light.

In accordance with the measurement results of examples 1 to 5 and comparative example 1, emission efficiency is reduced when the value of x is greater than 0.5, as shown in FIG. 1. The value of x was greater than 1 in comparative example 1 in which x=1.5, and an emission efficiency of only 50% or less than that of the highest efficiency in example 2 was obtained. When the oxygen content is too high, as in the sample of comparative example 1, a phase that is different than the target generated phase is readily generated and impurity phases reduce emission efficiency. Therefore, the value of x is preferably in a range of $0 \leq x \leq 1$. Conversely, emission efficiency is reduced even if the value of x is brought infinitely close to 0. Therefore, the value of x is most preferably in the vicinity of $0 < x \leq 0.5$ (wherein $Sr_mAl_aSi_bO_oN_n$:Ce, a=(1+x)×m, b=(4−x)×m, o=x×m, and n=(7−x)×m).

On the other hand, it is thought that a uniform composition can be produced in a short period of time because the effect of the flux that accelerates crystal growth of the resulting target phase is made manifest by including a small amount of oxygen. However, emission efficiency can be improved without increasing oxygen even when x=0. This can be achieved by extending the firing time, increasing the nitrogen partial pressure concentration during firing by increasing the pressure of the firing atmosphere, firing using ammonia which readily accelerates nitridation, or carrying out another firing method.

TABLE 1

|  | x | Peak Wavelength (nm) | Emission Intensity (%) | Chromaticity x | Chromaticity y | Luminance (%) |
| --- | --- | --- | --- | --- | --- | --- |
| Example 1 | 0.00 | 562.2 | 77.3 | 0.430 | 0.536 | 76.3 |
| Example 2 | 0.25 | 556.6 | 100.0 | 0.402 | 0.550 | 100.0 |
| Example 3 | 0.50 | 558.1 | 75.9 | 0.409 | 0.542 | 71.6 |
| Example 4 | 0.75 | 559.6 | 65.3 | 0.410 | 0.541 | 65.6 |
| Example 5 | 1.00 | 557.0 | 56.8 | 0.397 | 0.543 | 56.6 |
| Comparative Example 1 | 1.50 | 566.2 | 44.4 | 0.423 | 0.521 | 45.5 |
| Example 6 | 0.25 | 597.1 | 96.4 | 0.526 | 0.463 | 73.5 |

Excitation of monochromatic light at a wavelength of 405 nm

The emission intensity, chromaticity (x, y), and brightness were measured for the case in which a monochromatic light at a wavelength of 405 nm was used (25° C.) as excitation light for the phosphor in examples 1 to 5 and comparative example 1. The measurement results are shown in TABLE 2. The emission intensity of the phosphor fabricated in comparative example 1 was 42.4, with the emission intensity of the phosphor fabricated in example 2 set to 100. The half-width value of the phosphor obtained in example 2 was calculated and found to be 112.1 nm. The chromaticity (x, y) of the excitation spectrum was calculated, and it was found that the chromaticity was x=0.351 and y=0.535. The phosphors of examples 1 to 5 were used to manufacture an emission device in which ultraviolet or near ultraviolet was used as an excitation light source, and in this case as well, an emission device having good efficiency was obtained.

The phosphors of examples 1 to 5 as described above have high emission efficiency and brightness, and when used in illumination and other emission devices, an emission device having high emission efficiency and brightness can accordingly be obtained. The phosphors of examples 1 to 5 have a very wide peak in which the half-value width is 80 nm or more, and when the phosphors are used for white LED illumination, it is possible to fabricate a white LED illumination having better brightness and color rendering properties than those in which a phosphor having a peak with a narrow half-value width is used. In the case of a phosphor having a peak with a narrow half-value width, several types of phosphors must be mixed in order to improve color rendering properties, but since the present phosphor has a broad peak, the number of types of phosphor to be mixed and the usage amount can be reduced and an inexpensive white LED illumination can be fabricated.

Next, the emission spectrum of the phosphor of example 2 will be described with reference to FIG. 3. FIG. 3 is a graph in which the emission intensity of the phosphor is shown on the vertical axis, and the wavelength of the excitation light is shown on the horizontal axis. The measurement results of example 6 described below are also shown in the same manner. The emission spectrum of example 2 is shown by a solid line, and that of example 6 is shown by an alternate long and short dash line. In this case, the emission spectrum was obtained by exciting the phosphor to be measured through the use of monochromatic light of various wavelengths as the excitation light, whereupon an emission intensity of a fixed wavelength at which the phosphor emits light was measured, as was the excitation wavelength dependency of the emission intensity thereof. In the present measurement, the phosphor of example 2 was irradiated with monochromatic light having a wavelength of 300 nm to 550 nm, and the excitation wavelength dependency of the emission intensity at a wavelength of 556.6 nm emitted by the phosphor was measured.

As is apparent from FIG. 3, the phosphor of example 2 emits high-intensity yellow green light in the case of excitation light within a wide wavelength range of near 300 nm to near 500 nm. In particular, the phosphor shows the higher emission efficiency in the case of excitation light having a wavelength of 400 nm to 480 nm. Currently, a highly bright emission device can be manufactured by combining a blue color LED and a near ultraviolet/ultraviolet LED in which the emission wavelengths used as the excitation light for a one-chip white LED illumination are 460 nm and 405 nm, respectively.

TABLE 2

|  | x | Peak Wavelength (nm) | Emission Intensity (%) | Chromaticity x | Chromaticity y | Luminance (%) |
|---|---|---|---|---|---|---|
| Example 1 | 0.00 | 553.1 | 77.8 | 0.375 | 0.530 | 79.8 |
| Example 2 | 0.25 | 532.3 | 100.0 | 0.351 | 0.535 | 100.0 |
| Example 3 | 0.50 | 530.5 | 79.0 | 0.344 | 0.519 | 80.8 |
| Example 4 | 0.75 | 533.4 | 73.0 | 0.345 | 0.518 | 75.0 |
| Example 5 | 1.00 | 527.5 | 75.2 | 0.331 | 0.513 | 74.0 |
| Comparative Example 1 | 1.50 | 562.2 | 42.4 | 0.398 | 0.516 | 44.6 |
| Example 6 | 0.25 | 591.1 | 92.3 | 0.499 | 0.467 | 73.5 |

The results of the compositional analysis, the average particle size (D50), and the specific surface area (BET) of the phosphor powder thus obtained are shown in TABLE 3. Si was measured by gravimetry, oxygen and nitrogen were measured using a nitrogen/oxygen simultaneous analyzer (TC-436) manufactured by LECO Corp., and the other elements were measured by ICP. The average particle size (D50) was measured by laser diffraction dispersion, and the specific surface area was measured using BET. The values of the compositional analysis of each element were substantially the same as the target composition, but an analysis error of ±2.0 wt % was included and the analysis was not perfectly the same. The average particle size (D50) of the phosphor powder thus obtained was 12.2 μm to 21.2 μm, the specific surface area (BET) was 0.19 $m^2/g$ to 0.65 $m^2/g$, and the powder was determined to have the preferred particle size and specific surface area as a phosphor powder. Based on the results of the compositional analysis, the phosphors of examples 1 to 6 had a lower oxygen content than in comparative example 1. It is apparent from this finding that oxygen is preferably kept at 5.0 wt % or less in order to obtain a phosphor having good emission efficiency. Also, the coefficient of variation of the particle size distribution in the phosphor of examples 1 to 6 was 100% or less, and the phosphor was determined to have a very good particle size distribution.

TABLE 3

|  | x | Sr (wt %) | Al (wt %) | Si (wt %) | O (wt %) | N (wt %) | Ce (wt %) | Eu (wt %) | Particle Size (μm) | BET ($m^2/g$) |
|---|---|---|---|---|---|---|---|---|---|---|
| Example 1 | 0.00 | 24.5 | 7.9 | 33.3 | 1.5 | 30.9 | 0.8 | — | 12.2 | 0.19 |
| Example 2 | 0.25 | 25.4 | 10.8 | 30.6 | 2.5 | 27.8 | 0.8 | — | 17.8 | 0.32 |
| Example 3 | 0.50 | 25.3 | 12.0 | 29.2 | 2.4 | 28.1 | 0.8 | — | 17.1 | 0.51 |
| Example 4 | 0.75 | 25.5 | 14.1 | 27.1 | 3.0 | 28.3 | 0.9 | — | 20.5 | 0.62 |
| Example 5 | 1.00 | 25.3 | 15.1 | 24.5 | 3.7 | 29.7 | 0.9 | — | 21.2 | 0.65 |
| Comparative Example 1 | 1.50 | 25.6 | 18.1 | 22.8 | 5.6 | 25.2 | 0.8 | — | 23.5 | 0.81 |
| Example 6 | 0.25 | 25.1 | 10.6 | 29.0 | 2.5 | 29.3 | — | 0.9 | 19.8 | 0.40 |

Next, the phosphors obtained in examples 1 to 3 were measured for the temperature characteristics of emission intensity when a monochromatic color having a wavelength of nm was irradiated as excitation light. The measurement results are shown in TABLE 4.

The temperature of the phosphors was increased in the following steps: 25° C., 50° C., 100° C., 150° C., 200° C., 250° C., and 300° C. After the measurement temperature was reached, the temperature was held for 5 minutes so that the temperature of all the samples became uniform, and the emission intensity was measured thereafter. In addition, the emission intensity at each measurement temperature was measured as the relative intensity, with the value of the emission intensity at a room temperature (25° C.) before increasing the temperature set at 100%. The emission intensity was measured during temperature increase, the phosphor was then cooled, and the emission intensity was measured again at 25° C.

From the results of TABLE 4, the emission intensities of the phosphors of examples 1 to 3 were 80 or higher at a measurement temperature of 100° C., and 70 or higher at 200° C. when the value of the emission intensity at room temperature (25° C.) prior to increasing the measurement temperature was set to 100 for the case in which a monochromatic light having a wavelength of 460 nm was irradiated as excitation light. In particular, the emission intensities of examples 2 and 3 were 90 or higher at a measurement temperature of 100° C., and 80 or higher at 200° C. Accordingly, the phosphor of the present examples 1 to 3 showed very little reduction due to the ambient temperature when combined with an emission element, and an emission device was obtained with little color displacement. In a comparison of temperature dependency, the phosphors of examples 1 to 3 had improved temperature characteristics as x increased, and it was found that the temperature characteristics were also improved by adding Al or oxygen in small amounts to the composition.

TABLE 4

| | Relative Emission Intensity at each Measurement Temperature(Temperature increase prosess) | | | | | | |
|---|---|---|---|---|---|---|---|
| | 25° C. | 50° C. | 100° C. | 150° C. | 200° C. | 250° C. | 300° C. |
| Example 1 | 100.0 | 94.8 | 88.0 | 80.6 | 73.0 | 65.0 | 57.4 |
| Example 2 | 100.0 | 95.9 | 91.9 | 87.0 | 80.9 | 74.3 | 67.2 |
| Example 3 | 100.0 | 95.9 | 92.7 | 87.7 | 82.1 | 75.2 | 67.8 |

Example 6

In example 6, the activator of the composition of example 2 was changed from Ce to Eu, and a phosphor having the composition $SrAl_{1.25}Si_{3.75}O_{0.25}N_{6.75}$:Eu (wherein Eu/(Sr+Eu)=0.030) was manufactured.

Commercially available $SrCO_3$(3N), AlN(3N), $Si_3N_4$(3N), and $Eu_2O_3$(3N) were prepared as raw materials in the same manner as in example 2; and raw materials were weighed in amounts that corresponded to 0.970 mol of $SrCO_3$, 1.25 mol of AlN, 4.25/3 mol (weighed with an additional 0.5/3 mol) of $Si_3N_4$, and 0.030 mol of $Eu_2O_3$ so that the molar ratio of the elements after firing was Sr:Al:Si:O:Eu=0.970:1.25:3.75: 0.25:0.030. The raw materials were mixed in atmospheric air using a mortar. The sample was mixed and fired under the same conditions as in example 2 to obtain a phosphor.

Next, the emission intensity, chromaticity (x, y), and brightness were measured for the case in which the phosphor according to example 6 was irradiated (25° C.) with monochromatic light having a wavelength of 460 nm as the excitation light. The results of measuring the emission intensity and brightness, with the phosphor fabricated in example 2 set to 100, are shown in TABLE 1. The emission spectrum of the light emitted from the phosphor is indicated by an alternate long and short dash line in FIG. 2 for the case in which monochromatic light having a wavelength of 460 nm was irradiated.

As shown in FIG. 2, the emission spectrum of the phosphor had a broad peak in a wide wavelength range of 550 nm to near 760 nm. The peak wavelength was 597.1 nm. The half-width value of the phosphor was calculated and found to be 112 nm. The chromaticity (x, y) of the emission spectrum was calculated, and it was found that the chromaticity was x=0.526 and y=0.463. The sample was an orange phosphor color, and an orange emission color was visually confirmed.

When the activator is changed from Ce to Eu as shown in the comparison above, the emission spectrum shifts to the longer wavelengths, and results indicating high emission efficiency are obtained. High emission efficiency without an effect on the activator element was confirmed. Therefore, it was made apparent that a highly efficient emission device having high brightness can be obtained even when the phosphor of the present example 6 is used for illumination or as another emission device.

Examples 7 to 31

In examples 7 to 31, various compounds were added as fluxes in the manufacture of phosphors having the composition $SrAl_{1.25}Si_{3.75}O_{0.25}N_{6.75}$:Ce (wherein Ce/(Sr+Ce)= 0.030) fabricated in example 2, firing was carried out to obtain phosphors, and the emission intensity of the phosphors was studied. The method of fabricating phosphor samples entailed weighing raw materials in amounts that corresponded to 0.970 mol of $SrCO_3$, 1.25 mol of AlN, 4.25/3 mol (weighed with an additional 0.5/3 mol) of $Si_3N_4$, and 0.030 mol of $CeO_2$ so that the molar ratio of the elements after manufacture was Sr:Al:Si:O:Ce=0.970:1.25:3.75:0.25: 0.030. A flux material, used in the amount of 0.5 wt % with respect to the entire weight after weighing, was added and mixed as a flux. Firing was carried out for 6 hours at 1750° C. in nitrogen in the same manner as the firing of example 2 to obtain the phosphors of examples 7 to 31.

Next, the emission spectrum of the phosphors of examples 7 to 31 were measured, and the relative intensity of the emission intensity, and the chromaticity and brightness were measured. The emission characteristics of the phosphor powder thus obtained are shown in FIG. 5. The relative intensity of the emission intensity is the relative intensity for the case in which the relative intensity of the phosphor of example 2 is assigned a value of 100. In relation to the phosphors of examples 7 to 31, the emission spectrum of the phosphors had a broad peak in a large wavelength range of 470 nm to 720 nm and peak wavelength in the vicinity of 555 nm to 560 nm in the same manner as the phosphor of example 2, when the phosphors were irradiated with monochromatic light having a wavelength of 460 nm. The powders of the phosphors were all yellow phosphor colors, and a yellow green emission color was visually confirmed. The specific surface area of the phosphors was 0.05 $m^2$/g or more and 5.00 $m^2$/g or less. The average particle size (D50) was 1.0 μm or more and 50.0 μm, which is desirable as a phosphor powder. The value of the coefficient of variation CV of the particle size distribution in the phosphors of examples 7 to 31 was 100% or less, and the phosphors were determined to have a very good particle size distribution.

Next, the phosphors of example 7 to 31 were irradiated with monochromatic light having a wavelength of 250 nm to 550 nm, and the excitation wavelength dependency of the emission intensity of the emission peak wavelength emitted by the phosphor was measured, whereupon the emission spectrum of the phosphors also demonstrated high intensity yellow green color emission using excitation light in a broad wavelength range of about 300 nm to 500 nm in the same manner as example 2.

Based on the experiment results shown in TABLE 5, it was found that fluorides, chlorides, and nitrides of Sr and Ba, and oxides and nitrides of Al, Ga, and Mn are particularly preferred in the improvement of the emission characteristics. It is thought that the reason that emission characteristics are improved by the addition of these compounds is that the melting point of the additives is 1000° C. to 2000° C., and the additives therefore melt as the temperature increases during firing, and the reactivity of the raw materials with each other tends to improve. It is also thought that a reduction in the emission characteristics due to impurity elements can be reduced by using compounds composed of readily substituted Ba, Ga, and Mn, for the Sr and Al constituting the raw materials.

On the other hand, it is thought that small amounts of oxides, nitrides, chlorides, and fluorides do not affect the emission spectrum of a phosphor. As described above, nitrides also have effect as an additive compound, but nitrides react with oxygen and moisture in the air. Therefore, care must be taken during weighing and mixing, and oxides, chlorides, fluorides, and other substances that are easy to handle in atmospheric air are preferred. However, depending on the additive compound, excessive firing occurs when the optimum amount is exceeded, and the compound may act as an impurity that reduces emission characteristics. For this reason, in the particular case that the compound contains a chloride or a fluoride, a phosphor with good emission efficiency can be obtained without a reduction in the emission characteristics when the phosphor after production contains chloride or fluoride in the range of 0.0001 wt % or more to 1.0 wt % or less.

TABLE 5

| | Addition compound | Addition amount | Peak Wavelength (nm) | Emission Intensity (%) | Chromaticity x | Chromaticity y | Luminance (%) |
|---|---|---|---|---|---|---|---|
| Example 7 | $MgF_2$ | 0.5 wt % | 559.7 | 87.1 | 0.419 | 0.543 | 87.5 |
| Example 8 | $CaF_2$ | 0.5 wt % | 559.7 | 93.3 | 0.423 | 0.543 | 93.8 |
| Example 9 | $SrF2$ | 0.5 wt % | 557.6 | 112.2 | 0.411 | 0.548 | 110.8 |
| Example 10 | $BaF_2$ | 0.5 wt % | 557.7 | 115.4 | 0.408 | 0.550 | 114.3 |
| Example 11 | $AlF_3$ | 0.5 wt % | 559.2 | 87.9 | 0.417 | 0.544 | 88.3 |
| Example 12 | LiCl | 0.5 wt % | 558.1 | 94.5 | 0.415 | 0.545 | 94.9 |
| Example 13 | NaCl | 0.5 wt % | 559.2 | 100.3 | 0.414 | 0.546 | 100.5 |
| Example 14 | $MgCl_2 \cdot 6H_2O$ | 0.5 wt % | 559.6 | 97.3 | 0.418 | 0.543 | 97.8 |
| Example 15 | $CaCl_2 \cdot 2H_2O$ | 0.5 wt % | 558.1 | 97.4 | 0.415 | 0.545 | 97.9 |
| Example 16 | $SrCl_2 \cdot 6H_2O$ | 0.5 wt % | 557.7 | 101.4 | 0.408 | 0.548 | 100.7 |
| Example 17 | $BaCl_2 \cdot 2H_2O$ | 0.5 wt % | 557.7 | 100.7 | 0.406 | 0.549 | 100.8 |
| Example 18 | $B_2O_3$ | 0.5 wt % | 559.2 | 85.5 | 0.413 | 0.545 | 85.9 |
| Example 19 | $Al_2O_3$ | 0.5 wt % | 557.7 | 110.0 | 0.408 | 0.549 | 109.1 |
| Example 20 | $Ga_2O_3$ | 0.5 wt % | 557.6 | 117.0 | 0.408 | 0.549 | 116.5 |
| Example 21 | $In_2O_3$ | 0.5 wt % | 561.6 | 99.7 | 0.421 | 0.541 | 100.2 |
| Example 22 | MnO | 0.5 wt % | 557.7 | 104.0 | 0.408 | 0.549 | 103.5 |
| Example 23 | $SiO_2$ | 0.5 wt % | 559.7 | 93.1 | 0.415 | 0.543 | 93.6 |
| Example 24 | $GeO_2$ | 0.5 wt % | 559.8 | 98.3 | 0.418 | 0.545 | 98.8 |
| Example 25 | $Ca_3N_2$ | 0.5 wt % | 558.1 | 101.0 | 0.408 | 0.548 | 101.0 |
| Example 26 | $Sr_3N_2$ | 0.5 wt % | 557.7 | 102.8 | 0.409 | 0.548 | 102.0 |
| Example 27 | $Ba_3N_2$ | 0.5 wt % | 557.6 | 100.9 | 0.407 | 0.549 | 100.4 |
| Example 28 | MnN | 0.5 wt % | 557.6 | 103.7 | 0.409 | 0.548 | 103.1 |
| Example 29 | GaN | 0.5 wt % | 557.6 | 114.1 | 0.408 | 0.549 | 113.5 |
| Example 30 | InN | 0.5 wt % | 557.9 | 101.0 | 0.409 | 0.547 | 101.5 |
| Example 31 | BN | 0.5 wt % | 559.2 | 95.9 | 0.416 | 0.544 | 96.4 |

Examples 32 to 41

In examples 32 to 41, Eu and Ce were simultaneously used as the activator in the compositional formula $SrAl_{1.25}Si_{3.75}O_{0.25}N_{6.75}$, the concentration of Ce and Eu was fixed at 0.03 mol, the ratios of Eu and Ce were varied, and phosphors expressed as $SrAl_{1.25}Si_{3.75}O_{0.25}N_{6.75}$:Ce, Eu were manufactured.

Commercially available $SrCO_3(3N)$, AlN(3N), $Si_3N_4(3N)$, $Eu_2O_3(3N)$, and $CeO_2(3N)$ were prepared as raw materials in the same manner as in example 2; the raw materials were weighed in amounts that corresponded to 0.970 mol of $SrCO_3$, 1.25 mol of AlN, and 4.25/3 mol (weighed with an additional 0.5/3 mol) of $Si_3N_4$; and $Eu_2O_3$ and $CeO_2$ were prepared and weighed as the activator to a combined Eu+Ce was amount of 0.030 mol, so that a molar ratio of the elements after manufacture was Sr:Al:Si:O:Eu+Ce=0.970:1.25:3.75: 0.25:0.030. The raw materials were mixed in atmospheric air using a mortar. In this case, a flux material was not added in order to accurately determine the effect of the activator in examples 32 to 41. Firing was carried out under the same conditions as in example 2 to obtain the phosphors.

Next, the emission spectra of the phosphors of examples 32 to 41 were measured in the same manner as in example 2. TABLE 6 shows the results of measuring the emission intensity, brightness, and chromaticity (x, y) of the emission spectra. As shown in TABLE 6, the ratio of the two activators Ce and Eu was varied and variations in the emission spectrum were confirmed. The peak wavelength varied from 550 nm to 600 nm, and the chromaticity x, y also varied in a similar manner. FIG. 4 is graph showing the plotted values of chromaticity x and chromaticity y in the phosphors according to examples 32 to 41. In FIG. 4, the vertical axis represents the chromaticity y and the horizontal axis represents the chromaticity x. The enclosed portion in the chromaticity diagram shows the chromaticity range of five types of light sources for a fluorescent lamp in the correlated color temperature range of 7100 K to 2600 K described in JIS Z9112, wherein D is the daylight region, N is the neutral white color region, W is the white region, WW is the warm white color region, and L is the electric bulb color region.

The ratio of the activators Ce and Eu of the phosphors of the present examples 32 to 41 were varied when an emission device was manufactured using a combination of an emission element that emits light having a wavelength of 430 to 480 nm and the phosphors of the present examples 32 to 41, whereby it was possible to obtain an emission device capable of producing the color of the portions enclosed by the dotted line connected using the emission color emitted from the emission element and the emission color of the phosphors, and to produce the entire chromaticity range of the light source color of a fluorescent lamp described in JIS Z9112. Accordingly, various light source colors can be produced by using the phosphors of the present examples 32 to 41.

Examples 42 and 43

Examples 42 and 43 are emission devices composed of a combination of an emission element (LED) that emits light having a wavelength of 460 nm and the phosphors of examples 35 and 39. In the examples 42 and 43, the emission characteristics and color rendering properties of the emission devices were evaluated using an emission element (LED) that emits light at a wavelength of 460 nm for the case in which the phosphors having the compositional formula $SrAl_{1.25}Si_{3.75}O_{0.25}N_{6.75}$:Ce, Eu of example 35 or 39 were excited. Also, the emission wavelength of the emission element is not limited to a wavelength of 460 nm, and may be in an excitation band (300 nm to 500 nm) where the present phosphors are efficiently excited. Example 42 is an emission device having a correlated color temperature of 5000 K in which the phosphor of example 35 was used, and Example 43 is an emission device having a correlated color temperature of 2700 K in which the phosphor of example 39 was used.

First, an LED (emission wavelength: 460 nm) of blue color light obtained using a nitride semiconductor was prepared as the emission part. The phosphors fabricated in examples 35 and 39 were mixed with a resin and a dispersing agent to obtain a mixture. The resin preferably has a high index of refraction and transparency to visible light. As long as the above-described conditions are satisfied, the resin is not limited to a silicone, and an epoxy resin may also be used. $SiO_2$, $Al_2O_3$, and other microparticles may be mixed with the dispersing agent. The mixture was then sufficiently stirred and applied to the LED using a known method to fabricate a white LED illumination (emission device). Since the emission color and emission efficiency varies due to the phosphor and resin ratio of the mixture and the coating thickness, the conditions may be adjusted in accordance with the target color temperature.

FIG. 5 shows the emission spectrum for the case in which the fabricated white LED illumination is energized by 20 mA. FIG. 5 is a graph in which the vertical axis represents relative emission intensity and the horizontal axis represents the emission wavelength (nm). The emission spectrum of the white LED illumination in example 42 is shown by a solid line and the white LED illumination in example 43 is shown by a broken line.

The phosphor was excited by a blue color light emitted by an emission part and made to emit light, and a white LED illumination that emits a white color light of an emission spectrum having a continuous broad peak in a wavelength range of 400 nm to 700 nm was obtained. The correlated color temperature, chromaticity, and color rendering properties of the emission devices were measured. The correlated color temperature of the emission device in example 42 was 4962 K, the chromaticity was x=0.3461 and y=0.3520, and the average color rendering index (Ra) was 73, as shown in TABLE 7. The correlated color temperature of the emission device in example 43 was 2774 K, the chromaticity was x=0.4531 and y=0.4077, and the average color rendering index (Ra) was 65.

TABLE 6

| | Ce (mol) | Eu (mol) | Peak Wavelength (nm) | Emission Intensity (%) | Chromaticity x | Chromaticity y | Luminance (%) |
|---|---|---|---|---|---|---|---|
| Example 32 | 0.0300 | 0.0000 | 556.6 | 100.0 | 0.402 | 0.550 | 100.0 |
| Example 33 | 0.0296 | 0.0004 | 557.7 | 98.0 | 0.410 | 0.545 | 98.2 |
| Example 34 | 0.0294 | 0.0006 | 562.2 | 97.1 | 0.421 | 0.540 | 95.2 |
| Example 35 | 0.0275 | 0.0025 | 566.7 | 90.0 | 0.438 | 0.528 | 87.5 |
| Example 36 | 0.0225 | 0.0075 | 571.1 | 83.0 | 0.455 | 0.517 | 79.7 |
| Example 37 | 0.0200 | 0.0100 | 575.4 | 81.3 | 0.468 | 0.508 | 75.9 |
| Example 38 | 0.0150 | 0.0150 | 582.4 | 81.1 | 0.489 | 0.492 | 71.4 |
| Example 39 | 0.0100 | 0.0200 | 588.5 | 81.7 | 0.504 | 0.481 | 68.3 |
| Example 40 | 0.0075 | 0.0225 | 591.0 | 84.7 | 0.511 | 0.476 | 68.9 |
| Example 41 | 0.0000 | 0.0300 | 597.1 | 96.4 | 0.526 | 0.463 | 73.5 |

Example 44

In example 44, a red phosphor was added to the phosphor of example 33 to produce a phosphor mixture, and an emission device having improved color rendering properties was fabricated in combination with an emission element that emits light having a wavelength of 460 nm. An emission device that emits light having a correlated color temperature of 5000 K was manufactured for the case in which the phosphor is excited by an emission element (LED) that emits light at a wavelength of 460 nm, and the emission characteristics and color rendering properties of the emission device were evaluated. In the present example 44, $CaAlSiN_3$:Eu was used as the red color phosphor. It is also possible to use as the red color phosphor $Sr_4AlSi_{11}O_2N_{17}$:Eu, (Ca, Sr)$Si_5N_8$:Eu, or another nitrogen-containing red color phosphor, as well as SrS:Eu, CaS:Eu, or another sulfide red color phosphor, but $CaAlSiN_3$:Eu is most preferred from the aspect of temperature characteristics and stability.

1) Preparation of a Phosphor Sample

The phosphor $SrAl_{1.25}Si_{3.75}O_{0.25}N_{6.75}$:Ce, Eu of example 33 was manufactured. The red phosphor $CaAlSiN_3$:Eu was also manufactured using the following method.

Commercially available $Ca_3N_2$(2N), AlN(3N), $Si_3N_4$(3N), and $Eu_2O_3$(3N) were prepared; the raw materials were weighed so that that the molar ratio of elements after manufacture was Ca:Al:Si:Eu=0.970:1.00:1.00:0.030; and the raw materials were mixed using a mortar in a nitrogen atmosphere. The raw materials thus mixed were heated in a powdery state to 1500° C. in a nitrogen atmosphere at a temperature increase rate of 15° C./min, held and fired for 12 hours at 1500° C., and cooled for 1 hour from 1500° C. to 200° C. to obtain a phosphor having the composition formula $CaAlSiN_3$:Eu. The sample thus obtained was pulverized, classified, and prepared as a red color phosphor sample.

2) Preparation of a Phosphor Mixture

Emission spectra of the two types of phosphor samples, i.e., $SrAl_{1.25}Si_{3.75}O_{0.25}N_{6.75}$:Ce, Eu and $CaAlSiN_3$:Eu, were measured for the case in which the phosphors were excited using excitation light having a wavelength of 460 nm, and the relative mixing ratio in which the correlated color temperature of the two phosphor mixtures was 5000 K was obtained from the emission spectrum by simulation. The result of the simulation showed that $SrAl_{1.25}Si_{3.75}O_{0.25}N_{6.75}$:Ce CaAlSiN$_3$:Eu=95.0:5.0 (weight ratio). Based on the results, the phosphors were weighed and mixed to obtain a phosphor mixture.

Depending on the emission wavelength of the emission part (excitation wavelength of the phosphor mixture) and the emission efficiency of the phosphor in relation to the excitation light, the preferred mixture ratio does not always match the simulation results. In such a case, the blend ratio of the phosphor can be suitably adjusted and the actual shape of the emission spectrum can be modified.

3) Evaluation of the Emission Element

A blue LED (emission wavelength: 460 nm) having a nitride semiconductor was prepared as the emission part in the same manner as in example 42. A mixture composed of the phosphor mixture and a resin was applied to the LED. The blend ratio of the phosphor was suitably adjusted so that the mixture ratio of the phosphor mixture and the resin produced a daylight white color that corresponded to a correlated color temperature 5000 K on the basis of the simulation results. A white LED illumination (emission device) was fabricated in combination with the emission part of the LED using a known method.

The two phosphor mixtures were excited by blue color light emitted by the emission part and were made to emit light, and white color LED illumination that emitted a white color light of an emission spectrum having a broad peak in the wavelength range of 400 nm to 700 nm was obtained. In this case, the emission spectrum, obtained when the emission element of the white LED illumination thus fabricated was energized using 20 mA, is similarly shown in FIG. 5. In FIG. 5, the emission spectrum of the daylight white color of the white LED illumination set to correspond to the correlated color temperature of 5000 K is shown by an alternate long and short dash line.

In this case, TABLE 7 shows a list of the brightness, chromaticity, color rendering index, correlated color temperature, and other measurement data of the white LED illumination according to example 44.

The correlated color temperature, chromaticity, and color rendering properties of the phosphor were measured. The correlated color temperature was 4973 K, the chromaticity was x=0.3457 and y=0.3502, the average color rendering index (Ra) was 88, the special color rendering index R9 was 66, R13 was 90, and R15 was 88. Furthermore, in the white LED illumination, the emission color of a different correlated color temperature was obtained by suitably varying the blend amount of the phosphor and the blend amount of the resin that were to be mixed.

Examples 45 to 48

In examples 45 to 48, potassium was used as the element $M^{(1)}$ in the composition formula $(M^{(1)}{}_{m(1)}M^{(2)}{}_{m(2)}Z_z)A_aB_bO_oN_n$, Sr was used as the element $M^{(2)}$, Al was used as the element A, Si was used as the element B, and Ce was used as the element Z. The value of $m^{(1)}$, which is the ratio of the element $M^{(1)}$, was varied in a range of $0<m^{(1)}\leq 0.05$, and phosphors expressed by the composition formula $(K_{m(1)}Sr_{0.97-m(1)}Ce_{0.03})Al_{1.3}Si_{3.7}O_{0.3}N_{6.7}$ were fabricated. The method of fabricating the phosphors entailed weighing the mixture ratio of the raw materials so as to achieve $m^{(1)}/2$ mol of $K_2CO_3$, $(0.970-m^{(1)})$ mol of $SrCO_3$, 1.25 mol of AlN, 4.5/3 mol of $Si_3N_4$, and 0.030 mol of $CeO_2$. The molar ratio of each raw material was determined so that the sample after firing achieved the target composition with consideration given to variations due to decomposition and the like of the raw material during firing.

The raw materials thus weighed were sufficiently mixed using a mortar in atmospheric air. The raw materials thus mixed were placed in a BN crucible, a vacuum was created inside the furnace, the temperature was increased to 1600° C. at 15° C./min at an in-furnace pressure of 0.05 MPa in a nitrogen atmosphere (flow state, 4.0 L/min), the materials were held and fired at 1600° C. for 3 hours, and the fired materials were cooled from 1600° C. to 50° C. Thereafter, the fired samples were crushed in atmospheric air, and held and fired again in a nitrogen atmosphere for 9 hours at 1750° C.

The fired samples were cooled and then crushed again in atmospheric air using a mortar until a suitable particle size was achieved. Phosphors corresponding to $m^{(1)}=0.013$ (example 45), $m^{(1)}=0.025$ (example 46), $m^{(1)}=0.038$ (example 47), and $m^{(1)}=0.050$ (example 48) were fabricated.

Comparative Example 2

Next, as a comparative example, $(M^{(2)}{}_{m(2)}Z_z)A_aB_bO_oN_n$ was provided without an element expressed by $M^{(1)}$, which is the characteristic of the present invention. In this case, a phosphor expressed by the composition formula $(Sr_{0.97}Ce_{0.03})Al_{1.3}Si_{3.7}O_{0.3}N_{6.7}$ was fabricated in the following manner.

Weighed as the starting raw material were 0.970 mol of $SrCO_3(3N)$, 1.25 mol of AlN(3N), 4.5/3 mol of $Si_3N_4(3N)$, and 0.030 mol of $CeO_2(3N)$. The raw materials thus weighed were sufficiently mixed using a mortar in atmospheric air. The steps following mixing were carried out in the same manner as in examples 45 to 48 to obtain a phosphor according to comparative example 2. Therefore, comparative example 2 is one that corresponds to $m^{(1)}=0$ in the examples described above.

TABLE 7

| | Chromaticity | | Correlated Color Temperature | Average Color Rendering | Special Color Rendering Index | | | | | | |
|---|---|---|---|---|---|---|---|---|---|---|---|
| | x | y | Tcp (K) | Index Ra | R9 | R10 | R11 | R12 | R13 | R14 | R15 |
| Example 42 | 0.346 | 0.352 | 4962 | 73 | −23 | 61 | 55 | 38 | 75 | 95 | 66 |
| Example 43 | 0.453 | 0.408 | 2774 | 65 | −43 | 51 | 36 | 34 | 63 | 96 | 55 |
| Example 44 | 0.346 | 0.350 | 4973 | 88 | 66 | 77 | 77 | 49 | 90 | 94 | 88 |

Comparative Example 3

In comparative example 3, a phosphor was fabricated in which the ratio $m^{(1)}$ of the element $M^{(1)}$ was further increased compared with examples 45 to 48, and $0.05<m^{(1)}$. The raw materials were weighed to achieve a mixture ratio of (0.10/2) mol of $K_2CO_3$, 0.870 mol of $SrCO_3$, 1.25 mol of AlN, 4.5/3 mol of $Si_3N_4$, and 0.030 mol of $CeO_2$. The steps thereafter were carried out in the same manner as in examples 45 to 48 to obtain the phosphor according to comparative example 3.

It was confirmed that the particle size D50 of the phosphors could be increased by increasing the ratio $m^{(1)}$ of the element K, and it was also confirmed that particle growth was accelerated during firing. The reason for this is not apparent, but it is surmised that the crystal structure is made more stable through element substitution, and a state in which crystals readily grow is formed. It is thought that the crystallinity of the particles is improved when crystal growth progresses smoothly, which affects the emission characteristics described below.

TABLE 8

| | Composition Formulra | Replaceing Ratio: $m^{(1)}$ (in mixing) | $M^{(1)}$ Element | Sr (wt. %) | Al (wt. %) | Si (wt. %) | O (wt. %) | N (wt. %) | Ce (wt. %) | K (wt. %) | BET ($m^2$/g) | D50 (µm) |
|---|---|---|---|---|---|---|---|---|---|---|---|---|
| Example 45 | $(K_{0.01}Sr_{0.96}Ce_{0.03})Al_{1.3}Si_{3.7}O_{0.3}N_{6.7}$ | 0.012 | K | 23.3 | 10.3 | 29.9 | 2.09 | 30.2 | 0.74 | 0.12 | 0.21 | 25.3 |
| Example 46 | $(K_{0.02}Sr_{0.95}Ce_{0.03})Al_{1.3}Si_{3.7}O_{0.3}N_{6.7}$ | 0.025 | K | 23.0 | 10.3 | 30.3 | 1.98 | 28.3 | 0.86 | 0.26 | 0.19 | 27.9 |
| Example 47 | $(K_{0.04}Sr_{0.93}Ce_{0.03})Al_{1.3}Si_{3.7}O_{0.3}N_{6.7}$ | 0.038 | K | 23.0 | 10.1 | 30.9 | 1.97 | 28.7 | 0.88 | 0.40 | 0.22 | 35.9 |
| Example 48 | $(K_{0.05}Sr_{0.92}Ce_{0.03})Al_{1.3}Si_{3.7}O_{0.3}N_{6.7}$ | 0.05 | K | 23.4 | 10.2 | 31.1 | 1.92 | 29.5 | 1.67 | 0.62 | 0.25 | 36.3 |
| Comparative Example 2 | $(Sr_{0.97}Ce_{0.03})Al_{1.3}Si_{3.7}O_{0.3}N_{6.7}$ | 0 | — | 23.6 | 10.1 | 31.2 | 1.90 | 27.3 | 0.93 | 0.01 | 0.28 | 23.9 |
| Comparative Example 3 | $(K_{0.10}Sr_{0.87}Ce_{0.03})Al_{1.3}Si_{3.7}O_{0.3}N_{6.7}$ | 0.1 | K | 22.8 | 10.9 | 30.6 | 1.79 | 30.1 | 1.45 | 1.10 | 0.21 | 52.0 |

Therefore, comparative example 3 is one that corresponds to $m^{(1)}=0.10$ in the examples described above.

TABLE 8 shows the results of a compositional analysis, the average particle size, and the specific surface area of the phosphors according to examples 45 to 48 and comparative examples 2 and 3. The composition formula of the phosphors calculated from the compositional analysis results are also noted in the table. In the compositional analysis, Si was measured by gravimetry; K was measured using atomic absorption; oxygen and nitrogen were measured using a nitrogen/oxygen simultaneous analyzer (TC-436) manufactured by LECO Corp.; and the other elements were measured by ICP. The average particle size (D50) was measured by laser diffraction dispersion, and the specific surface area was measured using BET. The measurement results included an analysis error of about ±5.0 wt %, but the constituent ratio of each element for all samples was substantially $(K_{m(1)}Sr_{0.97-m(1)}Ce_{0.03})Al_{1.3}Si_{3.7}O_{0.3}N_{6.7}$, and it was confirmed that the target composition had been produced. The values of $m^{(1)}$ as the ratio of the element K were $m^{(1)}=0.00$ (comparative example 2), $m^{(1)}=0.01$ (example 45), $m^{(1)}=0.02$ (example 46), $m^{(1)}=0.04$ (example 47), $m^{(1)}=0.05$ (example 48), and $m^{(1)}=0.09$ (comparative example 3), and it was confirmed that the values of $m^{(1)}$ also matched the target compositional ratio. The average particle size (D50) of the phosphor powders thus obtained was 23.9 µm to 36.3 µm, the specific surface area (BET) was 0.19 $m^2$/g to 0.28 $m^2$/g, and the powder was determined to have the particle size of 1.0 µm to 50 µm and the specific surface area of 0.05 $m^2$/g to 5.00 $m^2$/g preferred for phosphor powders. The coefficient of variation CV of the particle size distribution in the phosphors of examples 45 to 48 was 100% or less, and the phosphors were determined to have a very good particle size distribution.

TABLE 9 shows results of measuring the emission intensity, chromaticity (x, y), and brightness for the case in which the phosphors of comparative example 2, examples 45 to 48, and comparative example 3 were irradiated with monochromatic light at a wavelength of 460 nm (25° C.) as an excitation light. The emission spectrum, brightness, and chromaticity were measured using a fluorescence spectrophotometer FP-6500 manufactured by Nihon Bunko. The emission intensity and brightness are expressed as absolute values, with comparative example 2 assigned a value of 100. In the expression $0<m^{(1)}\leq 0.05$, the emission intensity and brightness exceeded 100, and it was confirmed that the emission efficiency improved above that of $m^{(1)}=0$, i.e., above that of the phosphor of comparative example 2 in which the element potassium had not been added. This improvement in the emission intensity is thought to be due to the fact that some of the St sites are substituted with K, whereby the stability of the crystal structure of the phosphor is improved in the manner described above, and the emission efficiency is also improved.

Considerable variation in the wavelength and chromaticity of the emission peak in the phosphor of the comparative example 2, examples 45 to 48, and comparative example 3 due to variation in the value of the substitution ratio $m^{(1)}$ were not observed. For this reason, it was confirmed that the emission intensity and brightness alone can be improved without varying the emission color, and that this can be achieved by substituting potassium for a portion of the strontium constituting the phosphor. The emission intensity of example 47, which exhibited the highest emission intensity, was 107, the brightness was 106, the chromaticity (x, y) of the emission spectrum was x=0.422, and y=0.545.

TABLE 9

Excitation Wavelength: 460 nm

|  | Replaceing Ratio: $m^{(1)}$ (in mixing) | $M^{(1)}$ Element | Peak Wavelength (nm) | Relative Emission Intensity | Chromaticity point x | Chromaticity point y | Relative Luminance |
|---|---|---|---|---|---|---|---|
| Example 45 | 0.012 | K | 559.6 | 104 | 0.422 | 0.544 | 104 |
| Example 46 | 0.025 | K | 559.6 | 106 | 0.422 | 0.545 | 106 |
| Example 47 | 0.038 | K | 559.6 | 107 | 0.422 | 0.545 | 106 |
| Example 48 | 0.050 | K | 559.6 | 103 | 0.423 | 0.544 | 102 |
| Comparative Example 2 | 0.000 | — | 559.6 | 100 | 0.424 | 0.543 | 100 |
| Comparative Example 3 | 0.100 | K | 561.2 | 82 | 0.429 | 0.541 | 81 |

FIG. 8 is a graph showing the emission intensity of the phosphor on the vertical axis, and the value of $m^{(1)}$ on the horizontal axis. In the region in which $m^{(1)}$ is low, the emission intensity is improved as the value of $m^{(1)}$ increases, and the emission intensity is maximal when $m^{(1)}=0.038$. When the value of $m^{(1)}$ exceeds 0.038, the emission efficiency is reduced. In comparative example 3, in which the value of $m^{(1)}$ had increased to 0.10, the emission intensity was 80% or less of that in example 47, which had the highest emission intensity. This is thought to be due to the fact that the reduction of the emission characteristics can be kept to a lesser extent if the substitution ratio $m^{(1)}$ is in the range $0<m(1)\leqq0.05$, although the crystal structure of the phosphor is changed, balance of the charges in the crystal may be upset, and a reduction in the emission characteristics can be induced when the substitution amount of the potassium is excessive.

The emission intensity, chromaticity (x, y), and brightness were measured for the case in which the phosphors of the comparative example 2, examples 45 to 48, and comparative example 3 were irradiated with monochromatic light at a wavelength of 405 nm (25° C.) as an excitation light. The measurement results are shown in TABLE 10. When the emission intensity of the phosphor fabricated in comparative example 2 was set to 100, the emission intensity of the phosphor fabricated in example 46 was 104 and the brightness was 104. The chromaticity (x, y) of the emission spectrum of the phosphor obtained in example 46 was x=0.386 and y=0.545.

From these results, it is apparent that the phosphors of examples 45 to 48 can be used to form an emission device that has good efficiency, even in the manufacture of an emission device that uses not only a blue color light, but also a near ultraviolet or ultraviolet light as an excitation source.

Examples 49 to 52

Described next are examples of the case in which $M^{(2)}$ is obtained by mixing Sr and Ba in the composition formula $(M^{(1)}_{m(1)}M^{(2)}_{m(2)}Z_z)A_aB_bO_oN_n$.

Examples 49 to 52 in which a Ba compound has been added to the starting raw materials will be described. The phosphors of examples 49 to 52 were formed in the same manner as in examples 45 to 48 except that BaO was added in an amount corresponding to 0.2 wt % with respect to the starting raw materials, and a phosphor expressed by $(K_{m(1)}Sr_{0.96-m(1)}Ba_{0.005}Ce_{0.03})Al_{1.3}Si_{3.7}O_{0.3}N_{6.7}$ was fabricated. Here, since the ratio of the added element Ba is small, the composition ratio of each element was determined to have substantially not changed due to the addition of BaO.

The substitution ratios $m^{(1)}$ were $m^{(1)}=0.013$ (example 49), $m^{(1)}=0.025$ (example 50), $m^{(1)}=0.038$ (example 51), and $m^{(1)}=0.050$ (example 52). The resulting phase obtained by the X-ray analysis of the fabricated samples was evaluated, but the occurrence of BaO residue and an impurity phase was not observed.

Comparative Example 4

A case in which the element K was not added to examples 49 to 52 will be described as a comparative example 4. In examples 49 to 52, all steps were carried out in the same manner as in examples 49 to 52 (*2), except that $m^{(1)}=0$ and $K_2CO_3$ was not added to the raw materials. A phosphor $(Sr_{0.96}Ba_{0.005}Ce_{0.03})Al_{1.3}Si_{3.7}O_{0.3}N_{6.7}$ according to comparative example 4 was obtained.

Compositional Analysis Result

TABLE 11 shows composition analysis results of examples 49 to 52 and comparative example 4, and the average particle size and specific surface area are also shown in

TABLE 10

Excitation Wavelength: 405 nm

|  | Replaceing Ratio: $m^{(1)}$ (in mixing) | $M^{(1)}$ Element | Peak Wavelength (nm) | Relative Emission Intensity | Chromaticity point x | Chromaticity point y | Relative Luminance |
|---|---|---|---|---|---|---|---|
| Example 45 | 0.012 | K | 553.0 | 103 | 0.385 | 0.544 | 103 |
| Example 46 | 0.025 | K | 553.0 | 104 | 0.386 | 0.545 | 104 |
| Example 47 | 0.038 | K | 552.9 | 103 | 0.388 | 0.546 | 102 |
| Example 48 | 0.050 | K | 553.1 | 102 | 0.391 | 0.546 | 101 |
| Comparative Example 2 | 0.000 | — | 553.3 | 100 | 0.387 | 0.543 | 100 |
| Comparative Example 3 | 0.100 | K | 555.6 | 73 | 0.402 | 0.544 | 72 |

TABLE 11. The composition formula of the phosphor calculated from the analysis results is also noted. From the compositional analysis results, it was confirmed that all of the phosphors can be expressed by the composition formula $(K_{m(1)}Sr_{0.96-m(1)}Ba_{0.005}Ce_{0.03})Al_{1.3}Si_{3.7}O_{0.3}N_{6.7}$.

It was also confirmed that, in the same manner as in examples 45 to 48, the particle size of the phosphor in examples 49 to 52 tends to increase in association with an increase in the substitution ratio $m^{(1)}$, and that crystallinity of the phosphor improves due to the addition of K, even when Sr is substituted with Ba in a small amount.

The emission spectrum for the case in which the phosphor of example 51 was irradiated with monochromatic light having a wavelength of 460 nm is shown by a solid line in FIG. 9, and the excitation spectrum is shown by a solid line in FIG. 10. The emission spectrum for the case in which the phosphor of comparative example 4 was irradiated with monochromatic light having a wavelength of 460 nm is shown by a broken line in FIG. 9, and the excitation spectrum is shown by a broken line in FIG. 10.

It was confirmed from FIG. 9 that example 51 has high emission intensity in comparison with comparative example 4. The emission spectrum had a peak in the wavelength range of yellow color having a wavelength of 550 nm, and since the spectrum had a broad shape, the phosphor is suitable for manufacturing an emission device having high brightness and color rendering properties.

It was confirmed from FIG. 10 that example 51 has substantially the same excitation spectrum as comparative example 4, but also has better excitation characteristics than comparative example 4 in all excitation wavelength wavelength (*3) ranges.

TABLE 11

| | Composition Formulra | Replaceing Ratio: $m^{(1)}$ (in mixing) | $M^{(1)}$ Element | Sr (wt. %) | Al (wt. %) | Si (wt. %) | O (wt. %) | N (wt. %) | Ce (wt. %) | K (wt. %) | Ba (wt. %) | BET ($m^2$/g) | D50 (μm) |
|---|---|---|---|---|---|---|---|---|---|---|---|---|---|
| Example 49 | $(K_{0.01}Sr_{0.95}Ba_{0.005}Ce_{0.03})Al_{1.3}Si_{3.7}O_{0.3}N_{6.7}$ | 0.012 | K | 24.7 | 10.1 | 32.2 | 2.18 | 29.0 | 1.67 | 0.11 | 0.23 | 0.16 | 27.1 |
| Example 50 | $(K_{0.02}Sr_{0.94}Ba_{0.005}Ce_{0.03})Al_{1.3}Si_{3.7}O_{0.3}N_{6.7}$ | 0.025 | K | 24.7 | 10.3 | 31.7 | 2.16 | 28.8 | 1.64 | 0.24 | 0.23 | 0.20 | 31.7 |
| Example 51 | $(K_{0.04}Sr_{0.92}Ba_{0.005}Ce_{0.03})Al_{1.3}Si_{3.7}O_{0.3}N_{6.7}$ | 0.038 | K | 24.8 | 10.6 | 31.8 | 2.28 | 28.5 | 1.68 | 0.42 | 0.21 | 0.15 | 35.5 |
| Example 52 | $(K_{0.05}Sr_{0.91}Ba_{0.005}Ce_{0.03})Al_{1.3}Si_{3.7}O_{0.3}N_{6.7}$ | 0.050 | K | 24.8 | 10.6 | 31.9 | 2.25 | 28.9 | 1.71 | 0.67 | 0.23 | 0.22 | 37.2 |
| Comparative Example 4 | $(Sr_{0.96}Ba_{0.005}Ce_{0.03})Al_{1.3}Si_{3.7}O_{0.3}N_{6.7}$ | 0.000 | — | 24.9 | 10.4 | 31.0 | 2.28 | 28.6 | 1.51 | 0.01 | 0.20 | 0.30 | 28.9 |

TABLE 12 shows the results of measuring the emission intensity, chromaticity (x, y), and brightness for the case in which the phosphors of examples 49 to 53 were irradiated with monochromatic light at a wavelength of 460 nm (25° C.) as an excitation light. The emission spectrum and brightness are expressed as absolute values in which the comparative example 4 was set to 100. From the results of TABLE 12, it was confirmed that $(K_{m(1)}Sr_{0.96-m(1)}Ba_{0.005}Ce_{0.03})Al_{1.3}Si_{3.7}O_{0.3}N_{6.7}$, which is the phosphor according to examples 49 to 52, exhibited high emission characteristics in comparison with comparative example 4, which does not contain K, in the same manner as in examples 45 to 48. Also, the phosphors demonstrated high emission characteristics and brightness when excited by ultraviolet light having wavelength of 405 nm.

The emission intensity of excitation at a wavelength of 460 nm in example 51, which showed the highest emission characteristics, was 110, the brightness was 106, and the chromaticity (x, y) of the emission spectrum was x=0.423 and y=0.545. The phosphor of example 51 exhibited even higher emission intensity and brightness in comparison with example 48, which did not include Ba as a constituent element. Accordingly, it was confirmed that the phosphor expressed by the composition formula $(K_{m(1)}Sr_{0.96-m(1)}Ba_{0.005}Ce_{0.03})Al_{1.3}Si_{3.7}O_{0.3}N_{6.7}$ showed high emission characteristics.

Examples 53 to 60

Next, examples of the case in which the element $M^{(1)}$ in the present invention is Li and Na will be described.

In examples 53 to 56, Li was used as the element $M^{(1)}$, and in examples 57 to 60, Na was used as the element $M^{(1)}$. The method of manufacturing the samples was the same as in examples 50 to 54, except that $Li_2CO_3$ was used in place of $K_2CO_3$ as the raw material in examples 53 to 56, and $Na_2CO_3$ was used in examples 57 to 60. The substitution ratios $m^{(1)}$ were $m^{(1)}=0.013$ (examples 53 and 57), $m^{(1)}=0.025$ (examples 54 and 58), $m^{(1)}=0.038$ (examples 55 and 59), and $m^{(1)}=0.050$ (examples 56 and 60).

TABLES 13 and 14 show results of measuring the emission intensity, chromaticity (x, y), and brightness for the case in which the phosphors of examples 53 to 56 and 57 to 60 were

TABLE 12

| | Excitation Wavelength: 460 nm | | | | | | |
|---|---|---|---|---|---|---|---|
| | Raplaceing Ratio: $m^{(1)}$ (in mixing) | $M^{(1)}$ Element | Peak Wavelength (nm) | Relative Emission Intensity | Chromaticity point x | y | Relative Luminance |
| Example 49 | 0.012 | K | 559.6 | 104 | 0.421 | 0.545 | 102 |
| Example 50 | 0.025 | K | 559.6 | 108 | 0.421 | 0.545 | 105 |
| Example 51 | 0.038 | K | 559.6 | 110 | 0.423 | 0.545 | 106 |
| Example 52 | 0.050 | K | 559.7 | 103 | 0.424 | 0.544 | 101 |
| Comparative Example 4 | 0.000 | — | 559.6 | 100 | 0.422 | 0.545 | 100 | irradiated with monochromatic light at a wavelength of 460 nm (25° C.) as an excitation light. In all of the examples, higher emission intensity and brightness were obtained in comparison with comparative example 4, which did not contain the element $M^{(1)}$. Accordingly, it was confirmed that the phosphor having high emission characteristics can be manufactured even when Li or Na, not K, is used as the element $M^{(1)}$.

The phosphors exhibited excellent emission characteristics even with excitation produced not only by blue color light at a wavelength of 460 nm, but also by ultraviolet light having a wavelength of 405 nm, in the same manner as in examples 45 to 48.

TABLE 13

Excitation Wavelength: 460 nm

| | Replaceing Ratio: $m^{(1)}$ (in mixing) | $M^{(1)}$ Element | Peak Wavelength (nm) | Relative Emission Intensity | Chromaticity point x | y | Relative Luminance |
|---|---|---|---|---|---|---|---|
| Example 53 | 0.012 | Li | 559.7 | 101 | 0.421 | 0.546 | 101 |
| Example 54 | 0.025 | Li | 559.6 | 105 | 0.421 | 0.546 | 105 |
| Example 55 | 0.038 | Li | 559.6 | 106 | 0.422 | 0.546 | 106 |
| Example 56 | 0.050 | Li | 559.6 | 104 | 0.423 | 0.544 | 101 |
| Comparative Example 4 | 0.000 | — | 559.6 | 100 | 0.422 | 0.545 | 100 |

TABLE 14

Excitation Wavelength: 460 nm

| | Replaceing Ratio.: $m^{(1)}$ (in mixing) | $M^{(1)}$ Element | Peak Wavelength (nm) | Relative Emission Intensity | Chromaticity point x | y | Relative Luminance |
|---|---|---|---|---|---|---|---|
| Example 57 | 0.012 | Na | 559.6 | 103 | 0.423 | 0.545 | 102 |
| Example 58 | 0.025 | Na | 559.7 | 105 | 0.423 | 0.546 | 105 |
| Example 59 | 0.038 | Na | 559.6 | 105 | 0.424 | 0.545 | 105 |
| Example 60 | 0.050 | Na | 559.7 | 105 | 0.423 | 0.546 | 105 |
| Comparative Example 4 | 0.000 | — | 559.6 | 100 | 0.422 | 0.545 | 100 |

The results of examples 45 to 60 show that a phosphor having excellent emission intensity and brightness can be manufactured by using Li, Na, and K as the element $M^{(1)}$ in the composition formulas $(M^{(1)}{}_{m(1)}Sr_{0.96-m(1)}Ce_{0.03})Al_{1.3}Si_{3.7}O_{0.3}N_{6.7}$ and $(M^{(1)}{}_{m(1)}Ba_{0.005}Sr_{0.96-m(1)}Ce_{0.03})Al_{1.3}Si_{3.7}O_{0.3}N_{6.7}$.

In the phosphor according to the present invention, the emission wavelength is varied by varying the ratio of the elements Al, Si, and Ce. Therefore, a phosphor having various emission colors and excellent brightness can be fabricated by varying the composition ratio of the elements.

In examples 61 to 65 below, emission devices were evaluated in which the phosphors described above were used.

Example 61

In example 61, the emission characteristics and color rendering properties of the emission devices were evaluated for the case in which the phosphor sample $(K_{0.04}Sr_{0.92}Ba_{0.005}Ce_{0.03})Al_{1.3}Si_{3.7}O_{0.3}N_{6.7}$ according to example 51 of the present invention was excited using an emission element (LED) that emits light at a wavelength of 460 nm. Also, the emission wavelength of the emission element is not limited to a wavelength of 460 nm, and an excitation band (300 nm to 500 nm) having the good efficiency of the present phosphors may be used.

First, a blue LED (emission wavelength: 460 nm) in which a nitride semiconductor is used was prepared as the emission part. The phosphor fabricated in example 51 was mixed with a silicone resin and a small amount of $SiO_2$ as a dispersing agent to obtain a mixture. The resin preferably has a high index of refraction and transparency to visible light. As long as the above-described conditions are satisfied, the resin is not limited to a silicone, and an epoxy resin may also be used. In addition to $SiO_2$, small amounts of $Al_2O_3$ and other microparticles may be mixed with the dispersing agent. The mixture was then sufficiently stirred, and a white LED illumination (emission device) was fabricated in the same manner as the emission devices in which the phosphor according to the first embodiment was used as described with reference to FIGS. 6 and 7. Since the emission color and emission efficiency varies due to the phosphor and resin ratio of the mixture and the coating thickness, the conditions may be adjusted in accordance with the target color temperature.

FIG. 11 shows the emission spectrum for the case in which the fabricated emission device was energized by 20 mA. FIG. 11 is a graph in which the vertical axis represents correlated color temperature and the horizontal axis represents the emission wavelength (nm). The emission spectrum of the emission device in example 61 is shown by a solid line.

The phosphor was excited by a blue color light emitted by an emission part and was made to emit light, and an emission device that emits a white color light of an emission spectrum having a continuous broad peak in a wavelength range of 400 nm to 700 nm was obtained. The color temperature, chromaticity, and color rendering properties of the emission were measured. The color temperature was 6561 K, the chromaticity (x, y) was x=0.311 and y=0.337. The average color rendering index (Ra) of the emission device was 74. Furthermore, an emission color of a different color temperature was obtained by suitably varying the blend amount of the phosphor and the resin. Here, the chromaticity, color rendering index, color temperature, and other measurement data of the emission device according to example 61 are listed in TABLE 15.

Examples 62 and 63

In examples 62 and 63, a phosphor mixture was manufactured that was used to emit light having a correlated color temperature 5200 K (example 62) or a correlated color temperature of 3000 K (example 63), and the emission characteristics and color rendering properties of the phosphor mixture were evaluated for the case in which a red color phosphor was added to the phosphor according to example 51 and excited using an emission element (LED) that emitted light at a wavelength of 460 nm. In present example, $CaAlSiN_3$:Eu was used as the red color phosphor, but it was also possible to use $Sr_4AlSi_{11}O_2N_{17}$:Eu, $(Ca, Sr)Si_5N_8$:Eu, or another nitrogen-containing red color phosphor, or SrS:Eu, CaS:Eu, or another sulfide red color phosphor.

1) Preparation of a Phosphor Sample

The phosphor according to example 51 was prepared as a green color phosphor.

A red color phosphor $CaAlSiN_3$:Eu was manufactured in the following manner.

Commercially available $Ca_3N_2$(2N), AlN(3N), $Si_3N_4$(3N), and $Eu_2O_3$(3N) were prepared; the raw materials were weighed so that the molar ratio of the elements was Ca:Al:Si:Eu=0.970:1.00:1.00:0.030; and the raw materials were mixed using a mortar in a nitrogen atmosphere. The raw materials thus mixed were heated in a powdery state to 1500° C. in a nitrogen atmosphere at a temperature increase rate of 15° C./min, held and fired for 12 hours at 1500° C., and then cooled for 1 hour from 1500° C. to 200° C. to obtain a phosphor having the composition formula $CaAlSiN_3$:Eu. The sample thus obtained was pulverized, classified, and prepared as a red color phosphor sample.

2) Preparation of a Phosphor Mixture

Emission spectra of the two types of phosphor samples, i.e., $(K_{0.04}Sr_{0.92}Ba_{0.005}Ce_{0.03})$:$Al_{1.3}Si_{3.7}O_{0.3}N_{6.7}$ and $CaAlSiN_3$:Eu, were measured for the case in which each was excited using excitation light having a wavelength of 460 nm, and the correlated color temperatures of the two phosphor mixtures were obtained from the emission spectrum by simulating correlated mixture ratios that yielded 5200 K (example 62) or 3000 K (example 63). The result of the simulation showed that $(K_{0.04}Sr_{0.92}Ba_{0.005}Ce_{0.03})Al_{1.3}Si_{3.7}O_{0.3}N_{6.7}$:$CaAlSiN_3$:Eu=91.0:9.0 (weight ratio) for the case in which the correlated color temperature was 5200 K (example 62), and that $(K_{0.04}Sr_{0.92}Ba_{0.005}Ce_{0.03})Al_{1.3}Si_{3.7}O_{0.3}N_{6.7}$:$CaAlSiN_3$:Eu=98.0:2.0 (weight ratio) for the case in which the correlated color temperature was 3000 K (example 63). Based on these results, the phosphors were weighed and mixed to obtain a phosphor mixture.

Depending on the emission wavelength of the emission part (excitation wavelength of the phosphor mixture) and the emission efficiency of the phosphor in relation to the excitation light, the preferred mixture ratio does not always match the simulation results. In such a case, the blend ratio of the phosphor can be suitably adjusted and the actual shape of the emission spectrum can be modified.

3) Evaluation of the Emission Element

A blue LED (emission wavelength: 460 nm) having a nitride semiconductor was prepared as the emission part in the same manner as in example 61. A mixture composed of the phosphor mixture and a resin was applied to the LED. The blend ratio of the phosphor was suitably adjusted so that the mixture ratio of the phosphor mixture and the resin produced a daylight light color that corresponded to a correlated color temperature 5200 K or an electric bulb color that corresponded to 3000 K on the basis of the simulation results. An emission device was fabricated in combination with the emission part of the LED using a known method.

The two phosphor mixtures were excited by blue color light emitted by the emission part and were made to emit light, and emission devices that emit a white color light of an emission spectrum having a broad peak in the wavelength range of 420 nm to 750 nm were obtained. In this case, the emission spectrum when the emission element of the emission device thus fabricated was energized using 20 mA is shown in FIG. 11. In FIG. 11, the emission spectrum of the daylight white color of the emission device (example 62) set to correspond to the correlated color temperature of 5200 K is shown by an alternate long and short dash line, and the emission spectrum of the electric bulb color of the emission device (example 63) set to correspond to the correlated color temperature of 3000 K is shown by an alternate long and two short dashes line.

In this case, a list of the chromaticity, color rendering index, color temperature, and other measurement data of the emission device according to examples 62 and 63 is noted in TABLE 15.

The color temperature, chromaticity, and color rendering properties of the phosphor were measured. For the emission device according to example 62, which was set to correspond to a color temperature of 5200 K, the color temperature was 5175 K, the chromaticity (x, y) was x=0.340 and y=0.345, the average color rendering index (Ra) was 86, the special color rendering index R9 was 61, and R15 was 88. For the emission device according to example 63, which was set to correspond to a color temperature of 3000 K, the color temperature was 3007 K, the chromaticity (x, y) was x=0.436 and y=0.403, the average color rendering index (Ra) was 88, the special color rendering index R9 was 70, and R15 was 88. Furthermore, the emission color of a different color temperature was obtained in the emission device by suitably varying the blend amount of the phosphor and the blend amount of the resin that were to be mixed.

TABLE 15

| | Chromaticity Point | | Average Color Rendering | Special Color Rendering Index | | | | | | |
|---|---|---|---|---|---|---|---|---|---|---|
| | x | y | Index Ra | R9 | R10 | R11 | R12 | R13 | R14 | R15 |
| Example 61 | 0.311 | 0.337 | 74 | −24 | 56 | 60 | 36 | 74 | 93 | 66 |
| Example 62 | 0.340 | 0.345 | 86 | 61 | 73 | 76 | 51 | 88 | 93 | 88 |
| Example 63 | 0.436 | 0.403 | 88 | 70 | 74 | 80 | 56 | 88 | 93 | 90 |
| Example 64 | 0.339 | 0.327 | 94 | 96 | 87 | 93 | 85 | 95 | 94 | 97 |
| Example 65 | 0.436 | 0.403 | 93 | 81 | 85 | 92 | 84 | 93 | 95 | 93 |

Examples 64 and 65

In examples 64 and 65, a phosphor mixture was manufactured that was used to emit light having a correlated color temperature 5200 K (example 64) and a correlated color temperature of 3000 K (example 65), and the emission characteristics and color rendering properties of the phosphor mixture were evaluated for the case in which a blue color phosphor a red color phosphor were added to the phosphor according to example 51 and excited using an emission element (LED) that emitted light at a wavelength of 405 nm.

Here, $Sr_5(PO_4)_3Cl:Eu$ was used as the blue color phosphor, but no limitation is imposed thereby, and it is also possible to combine BAM:Eu ($BaMgAl_{10}O_{17}$:Eu) and a phosphor expressed as $(Sr, Ca, Ba, Mg)_{10}(PO_4)_6Cl_2$:Eu, $SrAl_xSi_{6-x}O_{1+x}N_{8-x}$:Eu ($0 \leq x \leq 2$), $(Ba, Sr, Ca, Mg)_2SiO_4$:Eu, or $(Ba, Sr, Ca)Si_2O_2N_2$:Eu.

1) Preparation of a Phosphor

A green color phosphor was manufactured and prepared using the method of example 51.

A red color phosphor $CaAlSiN_3$:Eu was manufactured using the method described in examples 62 and 63.

A commercially available blue color phosphor $Sr_5(PO_4)_3Cl$:Eu was prepared.

2) Preparation of a Phosphor Mixture

Three types of phosphor samples, i.e., $(K_{0.04}Sr_{0.92}Ba_{0.005}Ce_{0.03})Al_{1.3}Si_{3.7}O_{0.3}N_{6.7}$, $CaAlSiN_3$:Eu, and $Sr_5(PO_4)_3Cl$:Eu were measured for their emission spectra for the case in which the phosphors were excited using excitation light having a wavelength of 405 nm, and the correlated color temperatures of the phosphor mixtures were obtained from the emission spectrum by simulating correlated mixture ratios that yielded 5200 K (example 64) and 3000 K (example 65). The result of the simulation showed that $Sr_5(PO_4)_3Cl$:Eu:$(K_{0.04}Sr_{0.92}Ba_{0.005}Ce_{0.03})Al_{1.3}Si_{3.7}O_{0.3}N_{6.7}$:$CaAlSiN_3$:Eu=36:60:4 for the case in which the correlated color temperature was 5200 K (example 64), and that $Sr_5(PO_4)_3Cl$:Eu:$(K_{0.04}Sr_{0.92}Ba_{0.005}Ce_{0.03})Al_{1.3}Si_{3.7}O_{0.3}N_{6.7}$:$CaAlSiN_3$:Eu=20:68:12 for the case in which the correlated color temperature was 3000 K (example 65). Based on the results, the phosphors were weighed and mixed to obtain a phosphor mixture.

However, depending on the emission wavelength of the emission part (excitation wavelength of the phosphor mixture) and the emission efficiency of the phosphor in relation to the excitation light, the preferred mixture ratio does not always match the simulation results. In such a case, the blend ratio of the phosphor can be suitably adjusted and the actual shape of the emission spectrum can be modified.

The two phosphor mixtures were excited by ultraviolet light emitted by the emission part and were made to emit light, and emission devices that emit a white color light of an emission spectrum having a broad peak in the wavelength range of 420 nm to 750 nm were obtained. In this case, the emission spectrum when the emission element of the emission device thus fabricated was energized using 20 mA is shown in FIG. 12. In FIG. 12, the emission spectrum of the daylight white color of the emission device (example 64) set to correspond to the color temperature of 5200 K is shown by an solid line, and the emission spectrum of the electric bulb color of the emission device (example 65) set to correspond to the color temperature of 3000 K is shown by an alternate long and short dash line.

In this case, a list of the chromaticity, color rendering index, color temperature, and other measurement data of the emission devices according to examples 64 and 65 is noted in TABLE 15.

The color temperature, chromaticity, and color rendering properties of the phosphor were measured. For the emission device according to example 64, which was set to correspond to a color temperature of 5200 K, the color temperature was 5197 K, the chromaticity (x, y) was x=0.339 and y=0.327, the average color rendering index (Ra) was 94, the special color rendering index R9 was 96, and R15 was 97. For the emission device according to example 65, which was set to correspond to a color temperature of 3000 K, the color temperature was 3010 K, the chromaticity (x, y) was x=0.436 and y=0.403, the average color rendering index (Ra) was 93, the special color rendering index R9 was 81, and R15 was 93. Furthermore, in the emission device illumination, an emission color of a different color temperature was obtained by suitably varying the blend amount of the phosphor and the blend amount of the resin that were to be mixed.

Figure 1:
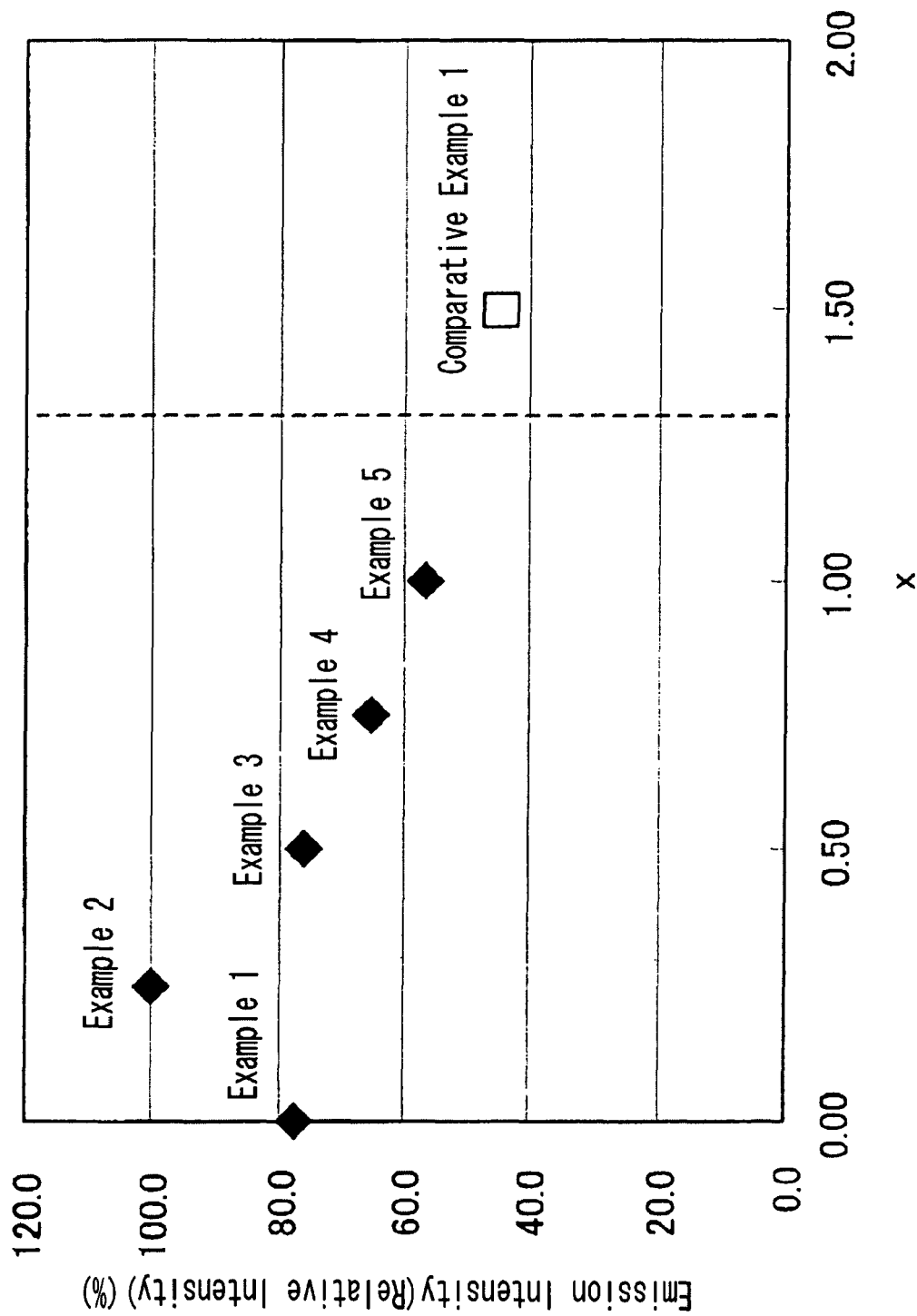
FIG. 1 is a graph showing a relation between an emission intensity and x of a phosphor according to examples 1 to 5, and a comparative example 1.
Figure 2:
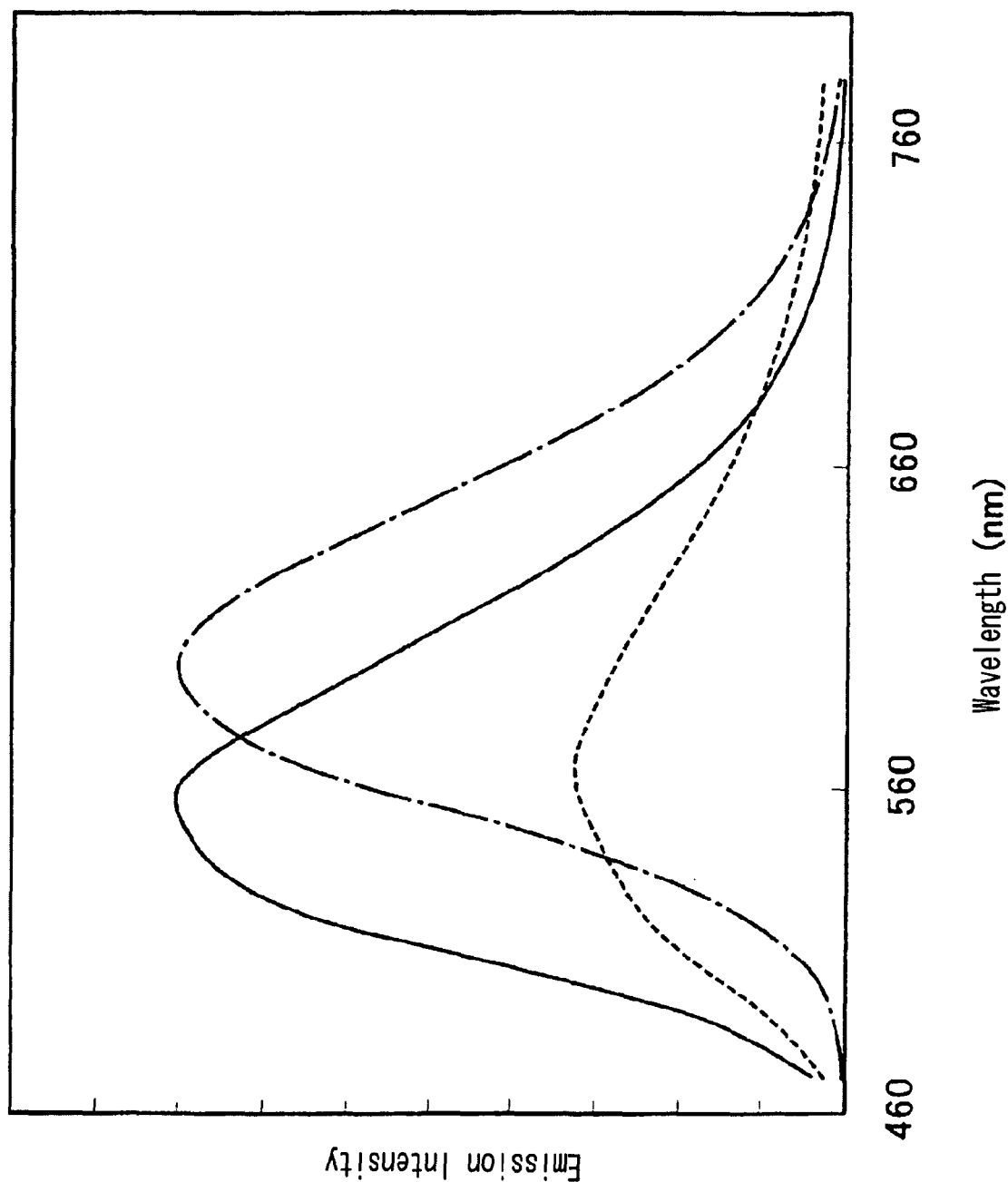
FIG. 2 is a graph showing an emission spectrum of the phosphor according to examples 2 and 6, and the comparative example 1.
Figure 3:
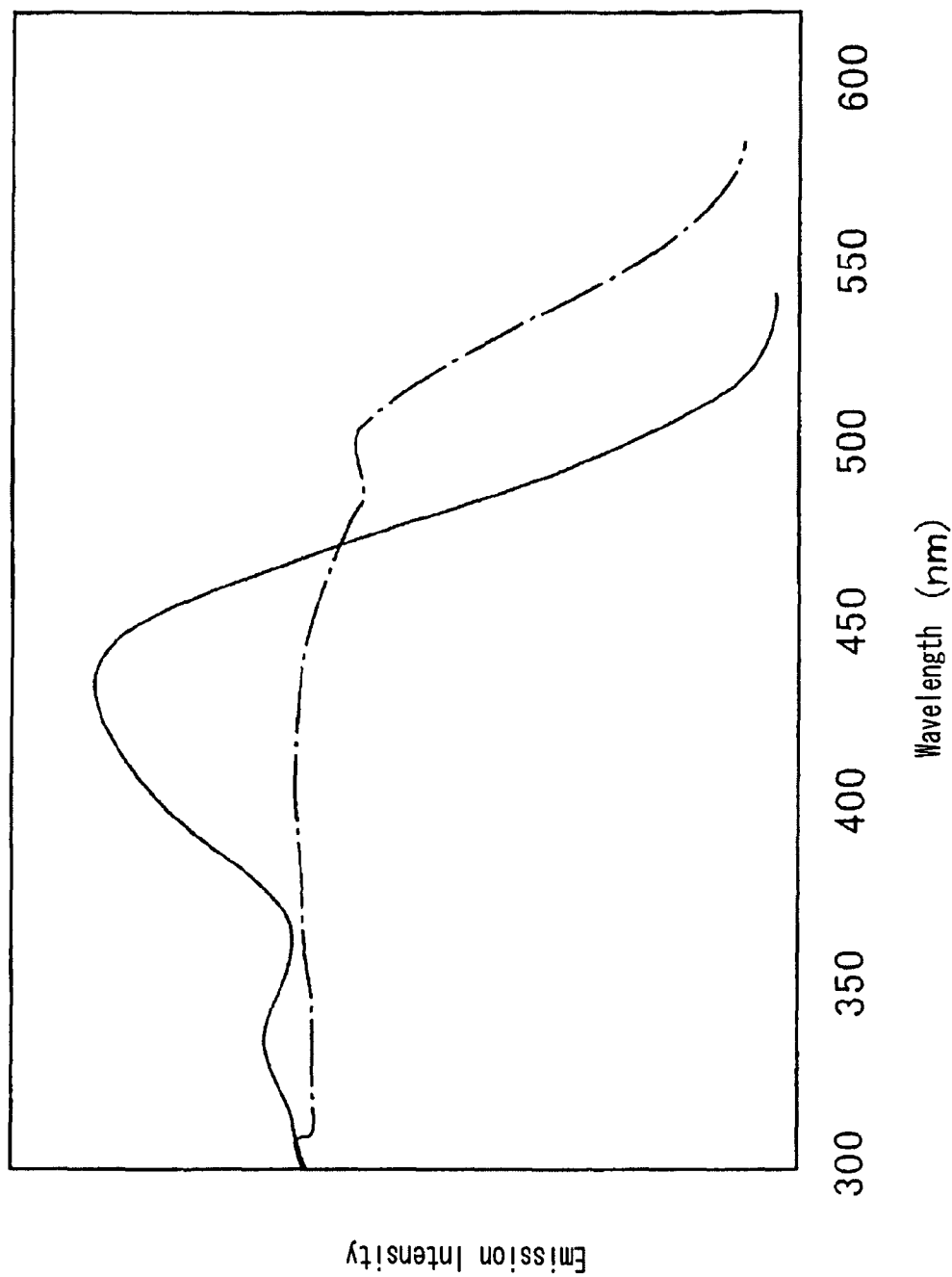
FIG. 3 is a graph showing an excitation spectrum of the phosphor according to the examples 2 and 6.
Figure 4:
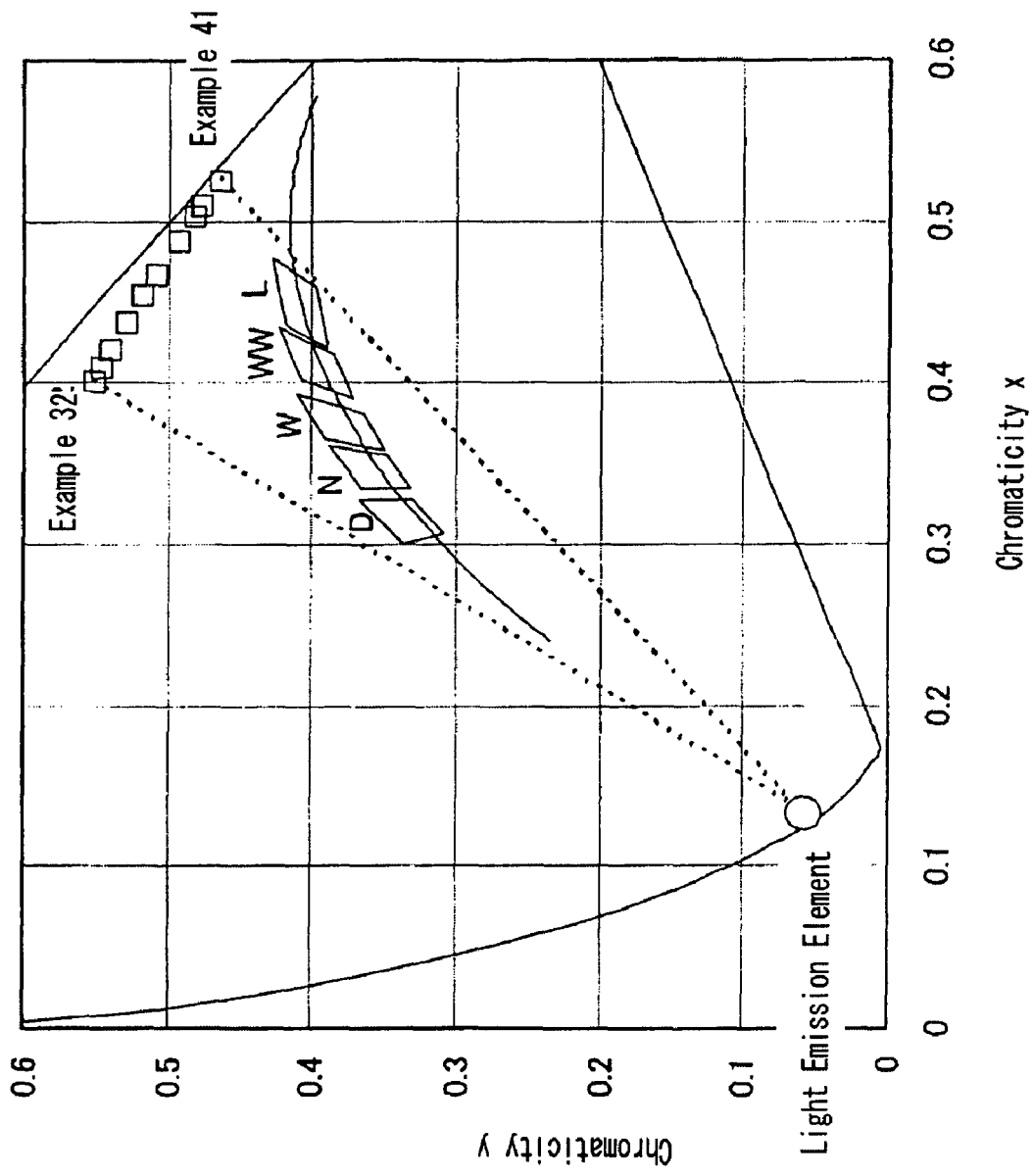
FIG. 4 is a graph showing a chromaticity coordinate of the phosphor according to examples 32 to 41.
Figure 5:
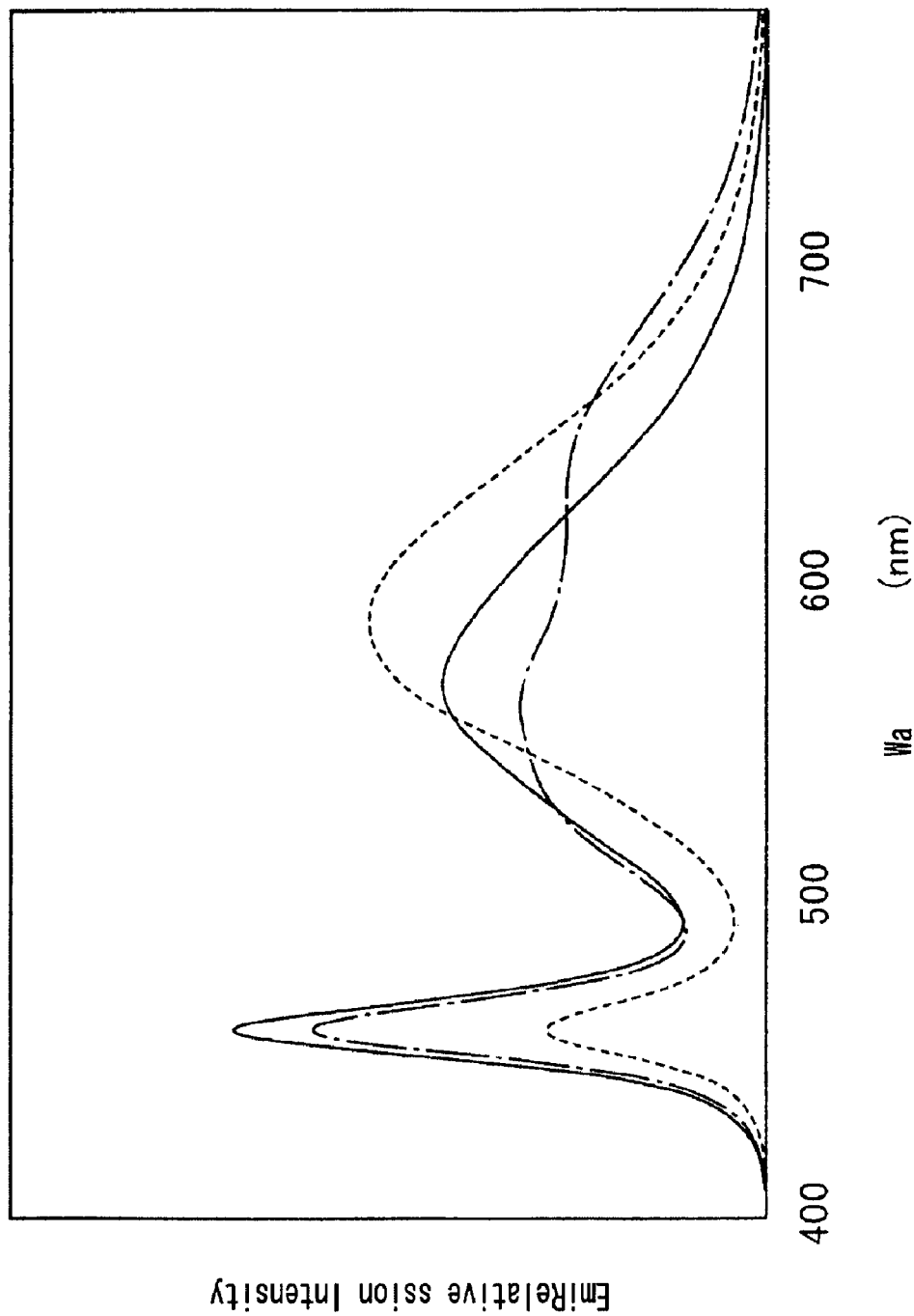
FIG. 5 is a graph showing the emission spectrum of a white LED illumination (emission device) according to examples 42 to 44.
Figure 6:
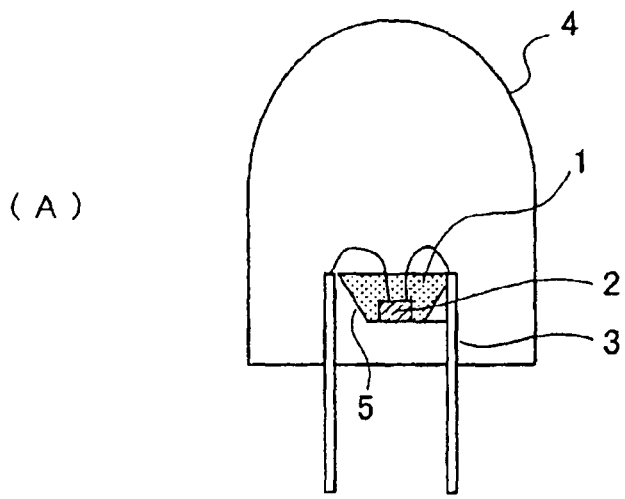
FIGS. 6(A)-(C) is a schematic sectional view of a bullet-type LED emission device.
Figure 6:
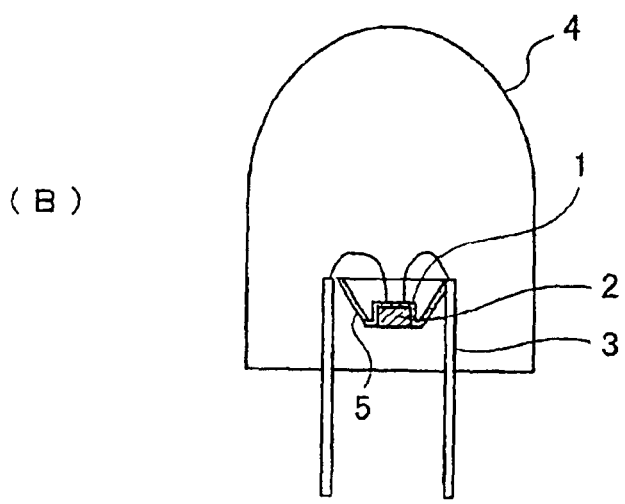
Figure 6:
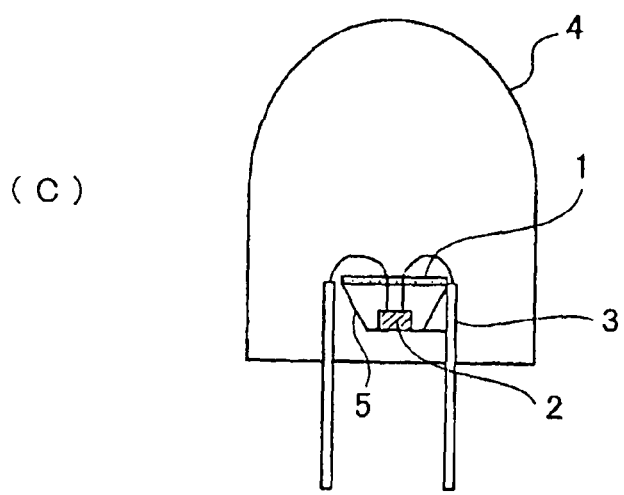
Figure 7:
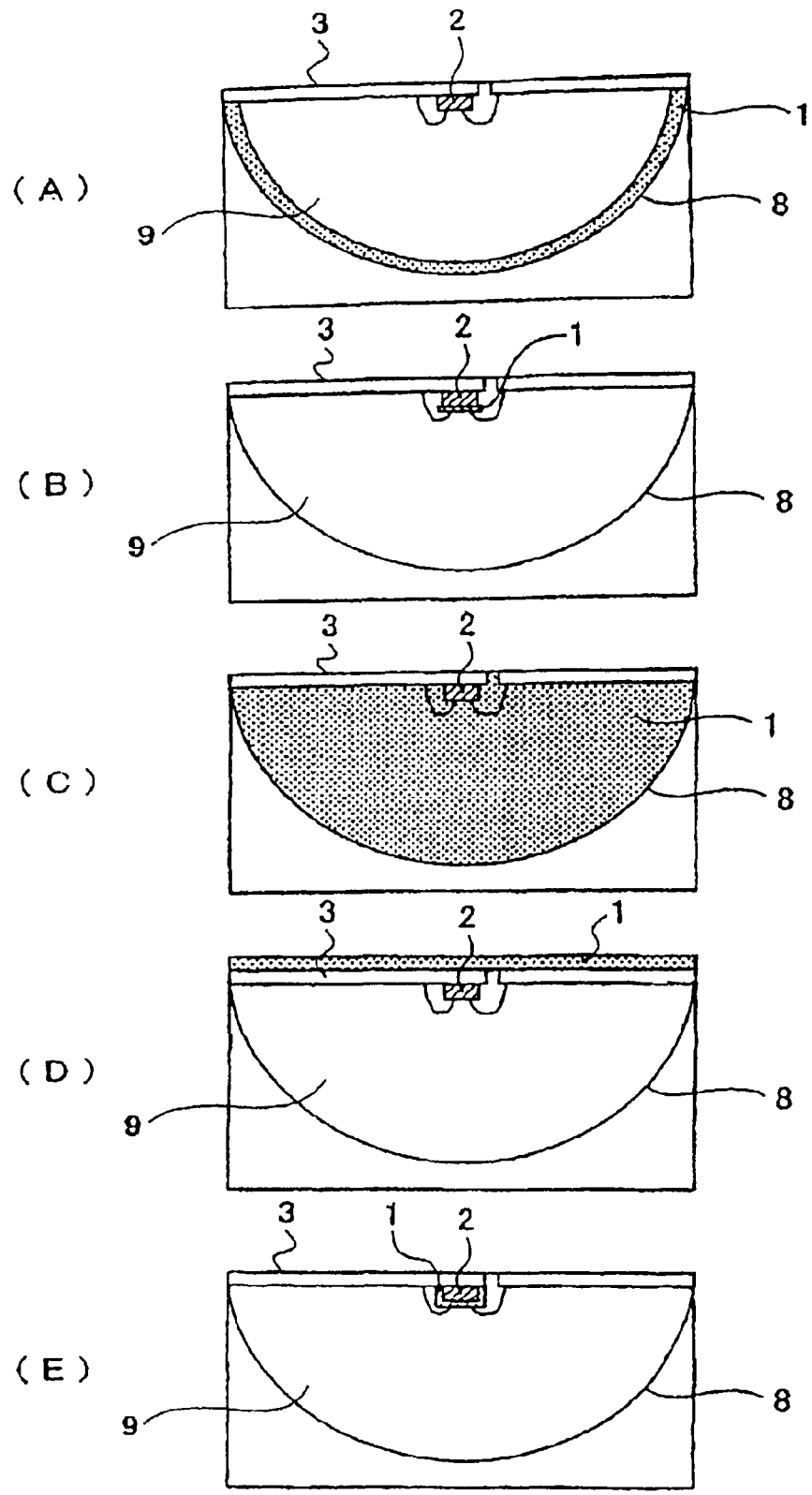
FIGS. 7(A)-(E) is a schematic sectional view of a reflective type LED emission device.
Figure 8:
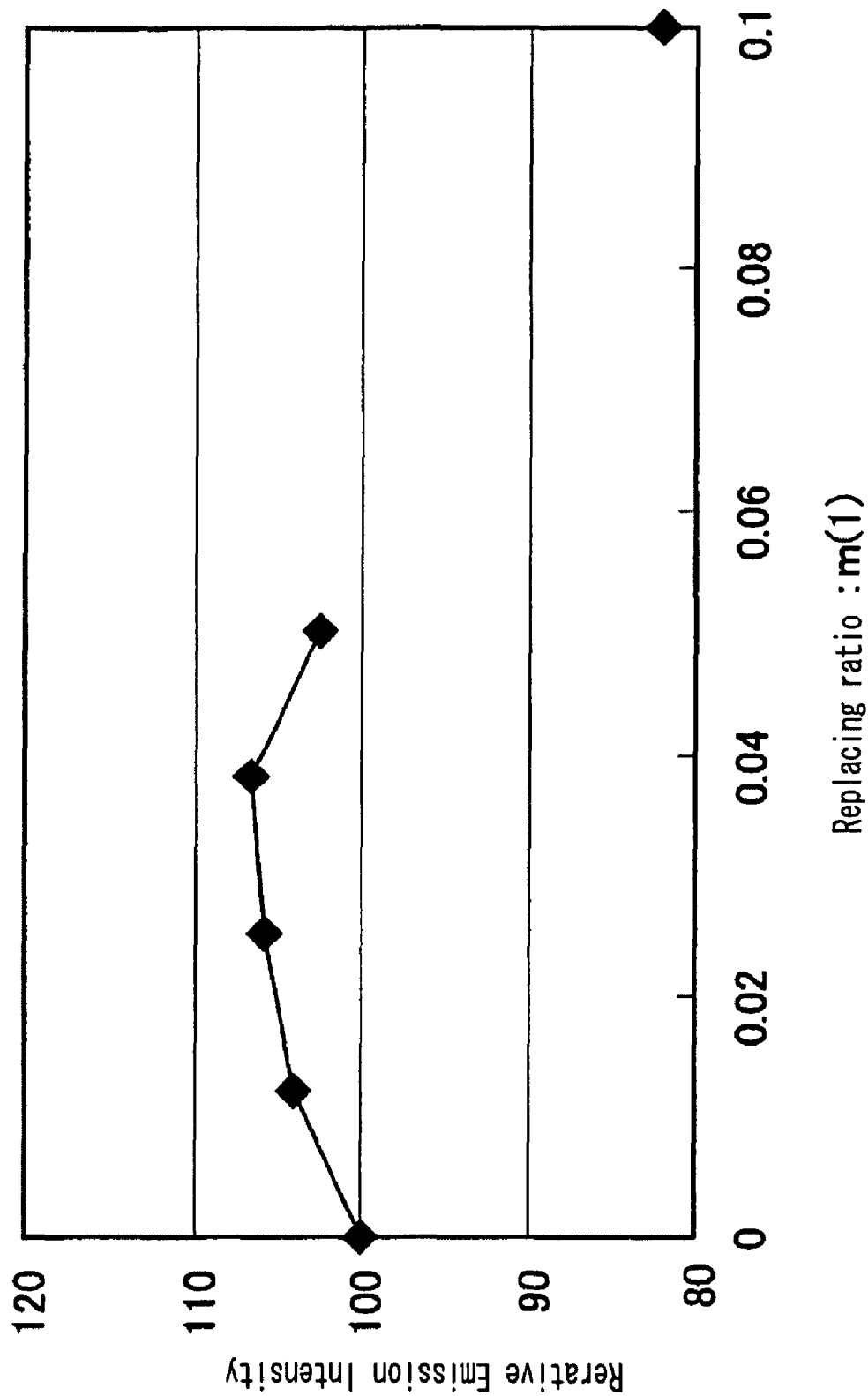
FIG. 8 is a graph showing a relation between a replacing ratio of element M(1) and element M(2) in the phosphor according to the second embodiment.
Figure 9:
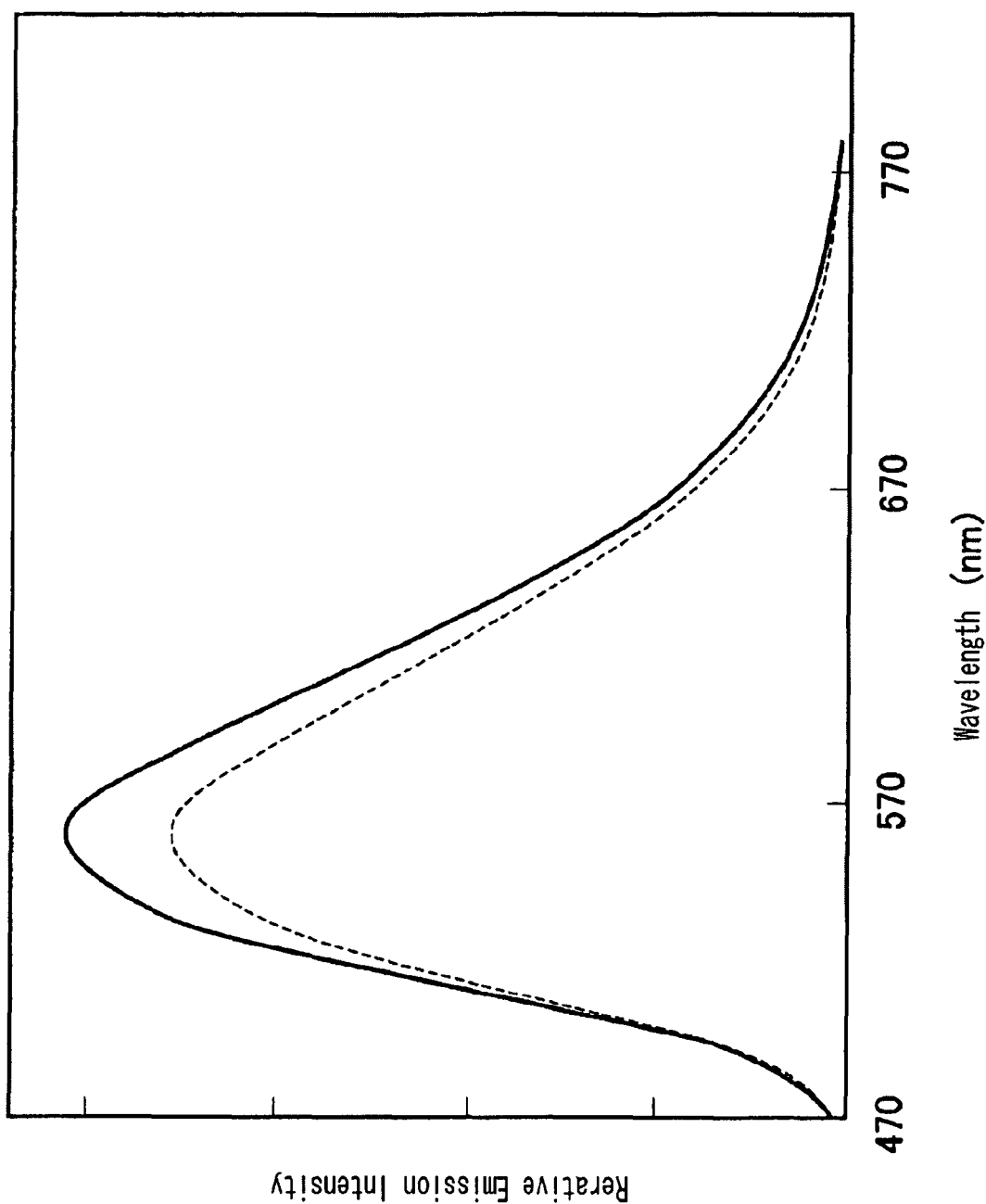
FIG. 9 shows an emission spectrum of the phosphor according to an example 51 and a comparative example 4.
Figure 10:
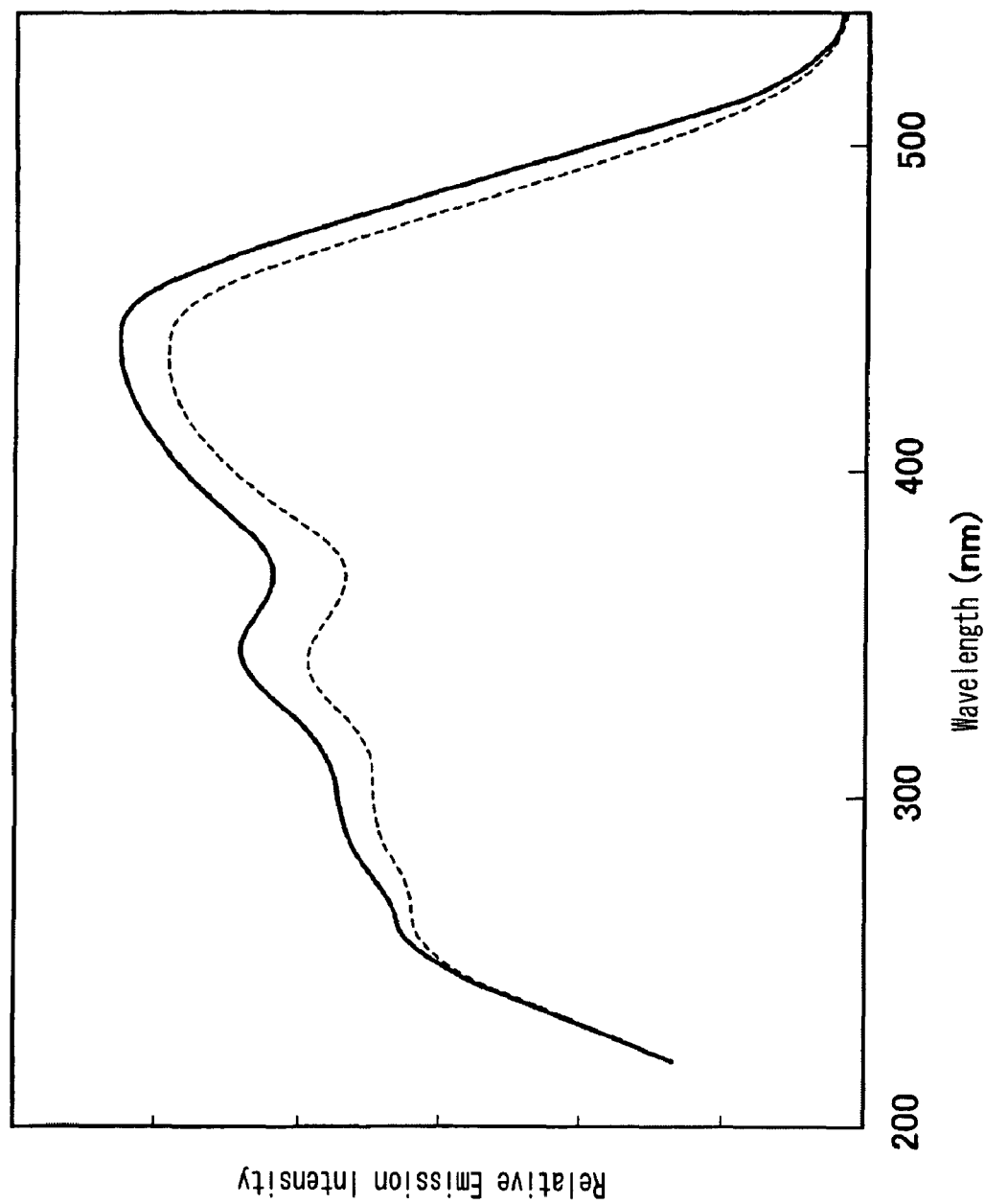
FIG. 10 shows an excitation spectrum of the phosphor according to the example 51 and the comparative example 4.
Figure 11:
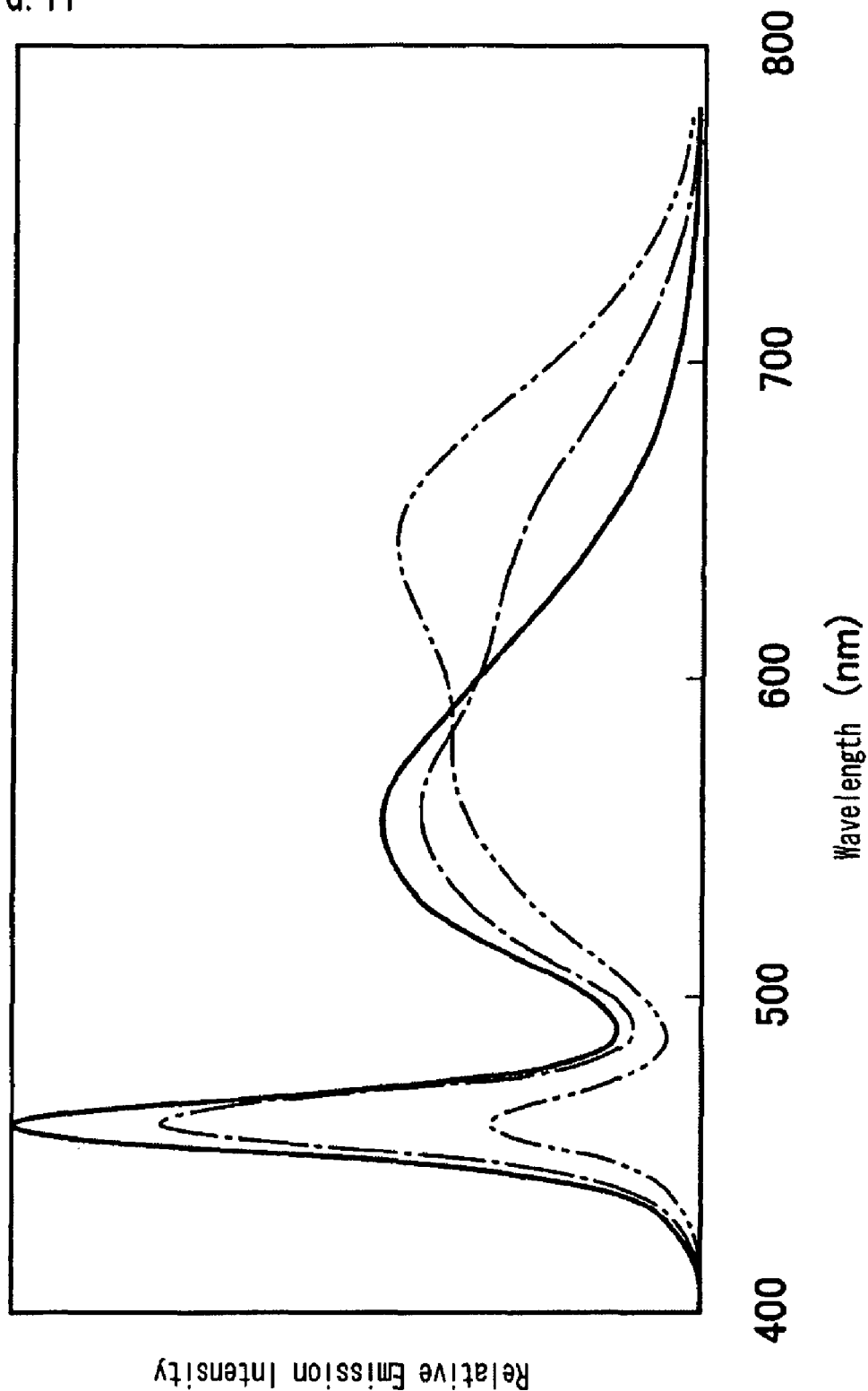
FIG. 11 shows an example of an emission spectrum of an emission device according to the second embodiment.
Figure 12:
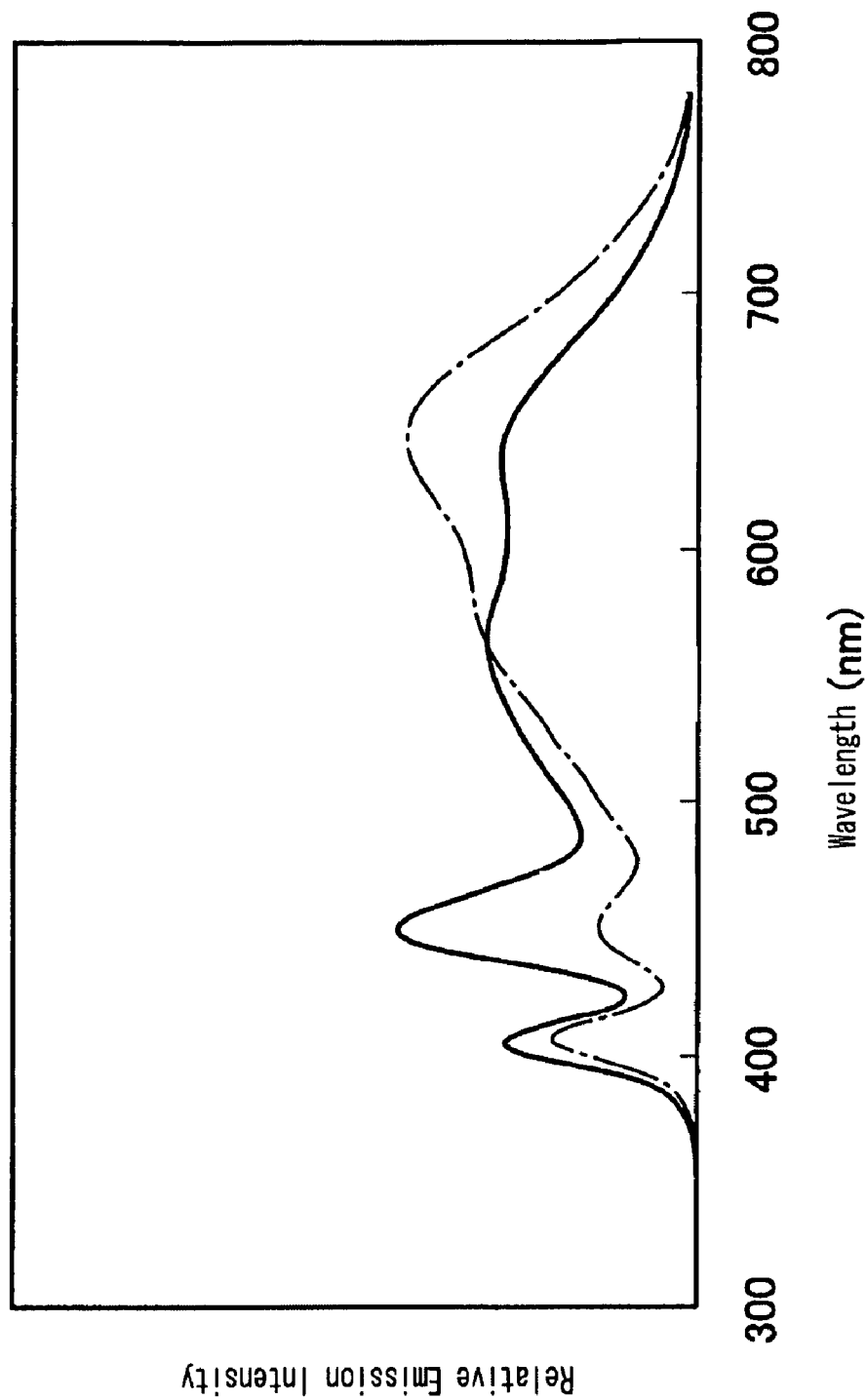
FIG. 12 shows an example of the emission spectrum of the emission device according to the second embodiment.

What is claimed is:

1. A phosphor, which is represented by the composition formula $M_mA_aB_bO_oN_n$:Z, wherein element M is at least one element having bivalent valency, element A is at least one element having tervalent valency, element B is at least one element having tetravalent valency, O is oxygen, N is nitrogen, and element Z is at least one element acting as an activator, wherein the conditions $a=(1+x)\times m$, $b=(4-x)\times m$, $o=x\times m$, $n=(7-x)\times m$, $0 \leq x \leq 1$ are satisfied, and wherein when excited by light in a wavelength range from 300 nm to 500 nm, the phosphor has an emission spectrum with a peak wavelength in a range from 500 nm to 620 nm.

2. The phosphor according to claim 1, wherein the element M is at least one element selected from the group consisting of Mg, Ca, Sr, Ba, and Zn, the element A is at least one element selected from the group consisting of Al, Ga, In, Sc, La, and Y, the element B is at least one element selected from the group consisting of Si and Ge, and the element Z is at least one element selected from the group consisting of Eu, Ce, Pr, Th, Yb, and Mn.

3. The phosphor according to claim 1, wherein the element M is Sr or Ba, the element A is Al or Ga, the element B is Si, and the element Z is Ce and/or Eu.

4. The phosphor according to claim 1, wherein when the composition formula is MmAaBbOoNn:Zz, the value of z/(m+z), which is a molar ratio of the element M to the element Z, is from 0.0001 to 0.5.

5. The phosphor according to claim 1, further comprising chloride or/and fluoride.

6. The phosphor according to claim 5, wherein contents of said chloride or/and fluoride are from 0.0001 wt % to 1.0 wt %.

7. The phosphor according to claim 1, wherein $P_{25}$ and $P_{100}$ satisfy the condition $(P_{25}-P_{100})/P_{25} \times 100 < 20$, wherein $P_{25}$ is an emission intensity at a temperature of 25° C. when the phosphor is excited by a prescribed excitation light in the wavelength range from 300 nm to 500 nm, and $P_{100}$ is the emission intensity at the temperature of 100° C. when the phosphor is irradiated with said prescribed excitation light.

8. The phosphor according to claim 1, comprising a primary particle having a particle size of 50 μm or less and aggregates in which the primary particle agglutinates, wherein an average particle size (D50) of a powder of the phosphor comprising the primary particle and the aggregates is from 1.0 μm to 50.0 μm.

9. A phosphor, which is represented by the composition formula $(M^{(1)}_{m(1)}M^{(2)}_{m(2)}Z_z)$AaBbOoNn, where element $M^{(1)}$ is at least one element having monovalent valency, element $M^{(2)}$ is at least one element having bivalent valency, element A is at least one element having tervalent valency, element B is at least one element having tetravalent valency, O is oxygen, N is nitrogen, and element Z is at least one element acting as an activator, wherein in the conditions $0.5 \leq a \leq 2.0$, $3.0 \leq b \leq 7.0$, $m^{(1)} > 0$, $m^{(2)} > 0$, $z > 0$, $4.0 \leq (a+b) \leq 7.0$, $m^{(1)}+m^{(2)}+z=1$, $0 < o \leq 4.0$, $n = 1/3m^{(1)} + 2/3m^{(2)} + z + a + 4/3b - 2/3o$, are satisfied, and wherein when the phosphor is irradiated with light with a wavelength range form 300 nm to 500 nm, a peak wavelength in an emission spectrum is in a range from 500 nm to 600 nm.

10. The phosphor according to claim 9, satisfying $0 < m^{(1)} \leq 0.05$.

11. The phosphor according to claim 9, satisfying $0.0001 \leq z \leq 0.5$.

12. The phosphor according to claim 9, satisfying $0.8 \leq a \leq 2.0$, $3.0 \leq 6.0$, $0 < o \leq 1.0$.

13. The phosphor according to claim 9, satisfying $0 < o \leq 1.0$, $a = 1+o$, $b = 4-o$, $n = 7-o$.

14. The phosphor according to claim 9, wherein the element $M^{(1)}$ is at least one element selected from the group consisting of Li, Na, K, and Rb, the element $M^{(2)}$ is at least one element selected from the group consisting of Mg, Ca, Sr, Ba, and Zn, the element A is at least one element selected from the group consisting of Al, Ga, and In, the element B is Si and/or Ge, and the element Z is at least one element selected from the group consisting of Eu, Ce, Pr, Th, Yb, and Mn.

15. The phosphor according to claim 9, wherein the element $M^{(2)}$ is Sr and/or Ba, the element A is Al, the element B is Si, and the element Z is Ce.

16. The phosphor according to claim 9, wherein the element $M^{(1)}$ is K.

17. The phosphor according to claim 9, comprising from 21.0 wt % to 27.0 wt % of Sr, from 8.0 wt % to 14.0 wt % of Al, from 0.5 wt % to 6.5 wt % of O, from 26.0 wt % to 32.0 wt % of N, more than zero and not more than 4.0 wt % of Ce, and more than zero and less than 1.0 wt % of at least one element selected from the group consisting of Li, Na, and K.

18. The phosphor according to claim 9, comprising more than zero and less than 2.0 wt % Ba.

19. The phosphor according to claim 9, comprising a primary particle having a particle size of 50 μm or less and aggregates in which the primary particle agglutinates, wherein an average particle size (D50) of a powder of the phosphor comprising the primary particle and the aggregates is from 1.0 μm to 50.0 μm.

20. A method of manufacturing the phosphor according to claim 1, the method comprising:
obtaining a mixture by weighing and mixing raw material powders;
firing said mixture in a firing furnace and obtaining a fired product; and
pulverizing said fired product, thereby obtaining the phosphor,
wherein in the step of firing said mixture and obtaining the fired product, at least one gas selected from the group consisting of the nitrogen gas a rare gas, the ammonia gas, a mixed gas of the ammonia gas and the nitrogen gas, and a mixed gas of the nitrogen gas and hydrogen is used as an atmosphere gas during firing.

21. The method of manufacturing the phosphor according to claim 20, wherein the at least one gas used as the atmosphere gas in said firing furnace comprises 80% or more of the nitrogen gas.

22. The method of manufacturing the phosphor according to claim 20, wherein the firing is performed, and the at least one gas used as the atmosphere gas in said firing furnace flows through said fire furnace at 0.1 ml/min or more.

23. The method of manufacturing the phosphor according to claim 20, wherein in the obtaining the fired product by firing said mixture in the firing furnace, the at least one gas used as the atmosphere gas in said firing furnace is pressurized at 0.001 MPa to 11.0 MPa.

24. The method of manufacturing the phosphor according to claim 20, wherein chloride or/and fluoride of the element M or/and the element A is added to the mixture of the raw material powders.

25. The method of manufacturing the phosphor according to claim 24, wherein said chloride or/and fluoride compound is at at least one compound selected from the group consisting of $SrF_2$, $BaF_2$, $AlF_3$, $SrCl_2$, $BaCl_2$, and $AlCl_3$.

26. The method of manufacturing the phosphor according to claim 20, wherein oxide or/and nitride of the element M or/and the element A is added to the mixture of the raw material powders.

27. The method of manufacturing the phosphor according to claim 26, wherein said oxide or/and said nitride is at least one compound selected from the group consisting of $Al_2O_3$, $Ga_2O_3$, $In_2O_3$, GaN, $Sr_3N_2$, $Ba_3N_2$, and $Ca_3N_2$.

28. The method of manufacturing the phosphor according to claim 20, wherein an average particle size of the raw material powders of said phosphor is from 0.1 μm to 10.0 μm.

29. The method of manufacturing the phosphor according to claim 20, wherein when the raw material powders of the phosphor are put in a crucible and fired in the furnace, wherein a BN crucible is used as the crucible, 0.1 ml/min or more of the at least one gas is flown through the furnace, and a furnace pressure is set at 0.0001 MPa to 1.0 MPa, so that the raw material powders are fired at a temperature from 1400° C. to 2000° C. for 30 minutes or more, wherein the at least one gas is selected from the group consisting of the nitrogen gas, a rare gas, and the ammonia gas.

30. The method of manufacturing the phosphor according to claim 29, wherein the firing, pulverizing, and mixing the fired product obtained by the firing are repeated at least twice or more.

31. The method of manufacturing the phosphor according to claim 29, wherein at least one material selected from the group consisting of barium chloride, fluoride, oxide, and carbonate is used for the raw material powders.

32. A light emission device, comprising the phosphor according to claim 1 and a light emission part for emitting light of a first wavelength, wherein the light having a wavelength different from the first wavelength is emitted from the phosphor, by using a part or the entire light of the first wavelength as an excitation light.

33. The light emission device according to claim 32, wherein the first wavelength is a wavelength of 300 nm to 500 nm.

34. The light emission device according to claim 32, wherein an average color rendering index Ra of an emission spectrum of the light emission device is 60 or more.

35. The light emission device according to claim 32, wherein an average color rendering index Ra of an emission spectrum of the light emission device is 80 or more.

36. The light emission device according to claim 32, wherein a special color rendering index R15 of an emission spectrum of the light emission device is 80 or more.

37. The light emission device according to claim 32, wherein a special color rendering index R9 of an emission spectrum of the light emission device is 60 or more.

38. The light emission device according to claim 32, wherein a correlated color temperature of the light emission device is in a range from 10000K to 2000K.

39. The light emission device according to claim 32, wherein a correlated color temperature of the light emission device is in a range from 7000K to 2500K.

40. The light emission device according to claim 32, wherein said light emission part for emitting light of said first wavelength is a light emitting diode (LED).

* * * * *

UNITED STATES PATENT AND TRADEMARK OFFICE
CERTIFICATE OF CORRECTION

PATENT NO. : 8,062,549 B2
APPLICATION NO. : 11/992647
DATED : November 22, 2011
INVENTOR(S) : Akira Nagatomi et al.

It is certified that error appears in the above-identified patent and that said Letters Patent is hereby corrected as shown below:

Column 1, lines 12 and 13, "and a method of manufacturing therefore," should read --and manufacturing method therefore,--;
line 14, "which a phosphor mixture, a phosphor sheet," should read --which--.

Column 2, line 8, "sulfurous phosphor" should read --sulfide phosphor--;
line 46, "620 mm" should read --620nm--.

Column 3, line 20, "described" should read --described in--;
line 49, "the light discharged" should read --the light from the phosphor with the light discharged--.

Column 4, line 4, "There problems" should read --These problems--;
line 35, "even if" should read --even though--.

Column 5, line 19, "solid phase" should read --solid-state--;
line 21, "solid phase" should read --solid-state--;
line 30, "tetrahedral structure" should read --tetrahedron--;
line 33, "valency in a network" should read --valency--;
line 34, "into the" should read --into a network composed of--;
line 45, "solid-phase" should read --solid-state--;
line 51, "solid-phase" should read --solid-state--;
line 53, "solid-phase" should read --solid-state--;
lines 58 and 59, "first structure of" should read --first constituent of--.

Column 6, line 4, "structure" should read --constituent--;
line 5, "structure" should read --constituent--;
line 12, "structure" should read --constituent--;
line 13, "structures" should read --constituents--;
line 16, "structure" should read --constituent--;

Signed and Sealed this
Sixteenth Day of April, 2013

Teresa Stanek Rea
*Acting Director of the United States Patent and Trademark Office*

Column 6 (continued):
  line 21, "structure" should read --constituent--;
  line 22, "structures" should read --constituent--;
  line 24, "structure" should read --constituent--;
  line 25, "structure" should read --constituent--;
  line 27, "structure" should read --constituent--;
  line 28, "structures" should read --constituent--;
  line 36, "structure" should read --constituent--;
  line 37, "structures" should read --constituent--;
  line 43, "structure" should read --constituent--;
  line 49, "the element acting as the activator" should read --one or more kinds selected from rare-earth elements and transition metal elements--;
  line 53, "form" should read --from--;
  line 56, "structure" should read --constituent--;
  line 57, "structure" should read --constituent--;
  line 58, "structure" should read --constituent--;
  line 59, "structure" should read --constituent--;
  line 60, "structure" should read --constituent--;
  line 61, "structures" should read --constituents--;
  line 63, "structure" should read --constituent--;
  line 64, "structures" should read --constituent--;
  line 66, "structure" should read --constituent--;
  line 67, "structures" should read --constituent--.

Column 7, line 2, "kind" should read --kinds--;
  line 8, "structure" should read --constituent--;
  line 9, "structures" should read --constituents--;
  line 12, "structure" should read --constituent--;
  line 13, "structures" should read --constituents--;
  line 15, "structure" should read --constituent--;
  line 16, "structures" should read --constituents--;
  line 21, "structure" should read --constituent--;
  line 22, "structures" should read --constituents--;
  line 25, "structure" should read --structures--;
  line 26, "structures" should read --constituents--;
  line 32, "structure" should read --constituent--;
  line 45, "structure" should read --constituent--;
  line 46, "structure" should read --constituent--;
  line 49, "structure" should read --constituent--;
  line 50, "according to claim 20 or 21" should read --according to twentieth or twenty-first constitutent--;
  line 55, "structure" should read --constituent--;
  line 57, "structures" should read --constituents--;
  line 61, "structure" should read --constituent--;
  line 63, "structures" should read --constituents--;

CERTIFICATE OF CORRECTION (continued)

Column 7 (continued):
 line 66, "structure" should read --constituent--;
 line 67, "structure" should read --constituent--.

Column 8, line 3, "structure" should read --constituent--;
 line 5, "structures" should read --constituents--;
 line 8, "structure" should read --constituent--;
 line 12, "structure" should read --constituent--;
 line 14, "structures" should read --constituents--;
 line 16, "structure" should read --constituent--;
 line 18, "structures" should read --constituents--;
 line 26, "minutes." should read --minutes or more.--;
 line 27, "structure" should read --constituent--;
 line 28, "structure" should read --constituent--;
 line 32, "structure" should read --constituent--;
 lines 33-34, "structure" should read --constituent--;
 line 36, "structure" should read --constituent--;
 line 38, "structures" should read --constituents--;
 line 43, "structure" should read --constituent--;
 line 44, "structure" should read --constituent--;
 line 46, "structure" should read --constituent--;
 line 47, "structure" should read --constituent--;
 line 50, "structure" should read --constituent--;
 line 51, "structure" should read --constituent--;
 line 54, "structure" should read --constituent--;
 line 55, "structures" should read --constituents--;
 line 58, "structure" should read --constituent--;
 lines 59-60, "structures" should read --constituents--;
 line 62, "structure" should read --constituent--;
 lines 63-64, "structures" should read --constituents--;
 line 65, "10000K to 2000K" should read --2000K to 10000K--;
 line 66, "structure" should read --constituent--;
 line 67 to Column 9, line 1, "structures" should read --constituents--.

Column 9, line 3, "structure" should read --constituent--;
 lines 4-5, "structures" should read --constituents--;
 line 10, "structures" should read --constituents--;
 line 19, "structures" should read --constituents--;
 line 24, "spectrum" should read --spectra--;
 line 25, "structures" should read --constituents--;
 line 29, "heat-resistant property" should read --a thermal stability--;
 line 30, "deteriorated" should read --deteriorating--;
 line 37, "structures" should read --constituents--;
 line 45, "structures" should read --constituents--;

CERTIFICATE OF CORRECTION (continued)

U.S. Pat. No. 8,062,549 B2

Column 10, line 9, "blue color" should read --blue green color--;
    line 13, "heat" should read --thermal stability--;
    line 14, "resistance" should read --proof--;
    line 48-50, "It is apparent that a phosphor whose visual color appearance more closely resemles that observed under a reference light is preferred as the light source for illumination" should read --It is naturally preferable as a light source for illumination that a hue of color is closer to that of a reference light--;
    line 54, "for wavelengths" should read --for some wavelengths--;
    line 63, "80 m" should read --80 nm--.

Column 11, line 26, "there is no problem" should read --it is possible to avoid--.

Column 12, line 27, "yellow/green" should read --yellow-green--;
    line 29, "or the like" should read --and so on after light--;
    line 32, "similar" should read --crystal structure close to that--;
    line 45, "color/green" should read --color-green--
    line 51, "0<x<0.5" should read --$0 \leq x \leq 1.0$--;
    line 52, "$0 \leq x \leq 1.0$" should read --0<x<0.5--.

Column 13, line 17, "his" should read --is--;
    line 42, "of the raw materials fluoride and chloride" should read --fluorine and chlorine of the raw material element--;
    line 51, "chloride and/or fluoride" should read --chlorine and/or fluoine--;
    line 51, "is can be obtained" should read --is obtained--.

Column 14, line 21, "mole count of" should read --mole number of--;
    line 23, "count z" should read --number z--.

Column 15, line 8, "Si or another element" should read --Si, or another element added in minute amounts--;
    line 34, "blue/green" should read --blue-green--;
    line 44, "exothermic temperature" should read --heat-generating temperature--.

Column 16, line 47, "solid-phase" should read --solid-state--;
    line 48, "solid-phase" should read --solid-state--;
    line 53, "However, higher" should read --Higher--;
    line 58, "form are" should read --form of the phosphor obtained are--;
    line 59, "of the phosphor obtained" should read --of the raw materials--;
    line 63, "However, preferably" should read --Preferably--.

Column 17, line 30, "dissolves/nitrides" should read --decomposes/nitrides--.

CERTIFICATE OF CORRECTION (continued)
U.S. Pat. No. 8,062,549 B2

Column 18, line 15, "solid-phase" should read --solid-state--;
   line 19, "solid-phase" should read --solid-state--;
   line 45, "mL/min," should read --mL/min or more,--;
   line 60, "solid-phase" should read --solid-state--.

Column 19, line 62, "blue/green" should read --blue-green--.

Column 20, line 1, "$m^{(1)}+m^{(2)}+=1$" should read --$m^{(1)}+m^{(2)}+z=1$--.

Column 22, line 67, "in a powdery state" should read --as a powder--.

Column 23, line 4, "the powdery phosphor" should read --the phosphor powder--;
   line 41, "solid-phase" should read --solid-state--;
   line 42, "solid-phase" should read --solid-state--.

Column 24, line 22, "adjusted due" should read --adjusted--;
   line 41, "easy" should read --easily--;
   line 58, "solid-phase" should read --solid-state--;
   line 62, "solid-phase" should read --solid-state--.

Column 25, line 21, "intermixed" should read --incorporated--;
   line 43, "solid-phase" should read --solid-state--.

Column 26, line 47, "ultraviolet/ultraviolet" should read --ultraviolet-ultraviolet--.

Column 27, line 22, "blue color" should read --blue-green color--;
   line 37, "to be" should read --as--.

Column 28, line 35, "to be" should read --as--.

Column 30, line 53, "(examples 5)" should read --(example 5)--.

Column 31, line 66, "$0<x\leqq0.5$" should read --$0<x<0.5$--.

Column 34, line 63, "displacement" should read --shift--.

Column 35, line 45, "phosphor" should read --fluorescent--;
   line 51, "effect on" should read --effect of--.

Column 36, line 33, "phosphor" should read --fluorescent--;
   line 36, "50.0 μm" should read --50.0 μm or less--.

Column 37, line 6, "firing" should read --sintering--;
   line 63, "was amount" should read --amount--.

CERTIFICATE OF CORRECTION (continued)
U.S. Pat. No. 8,062,549 B2

Column 38, line 11, "is graph" should read --is a graph--;
    line 49, "a fluorescent" should read --fluorescent--.

Column 40, line 47, "so that that the" should read --so that the--.

Column 42, line 19, "decomposition and the like of" should read --decomposition of--;
    line 20, "material during" should read --material and so on--.

Column 44, line 39, "absolute" should read --relative--.

Column 46, line 43, "52 (*2)," should read --52,--.

Column 47, line 30, "absolute" should read --relative--.

Column 48, line 34, "length (*3)" should read --length--.

Column 49, line 48, "$Sr_{0.96-m(1)}$" should read --$SR_{0.97-m(1)}$--.

Column 50, lines 58-59, "correlated color temeprature" should read --relative emission intensity--.

Column 51, line 25, "51" should read --7--;
    lines 45-46, "the correlated color temperatures of the two phosphor mixtures" should read --correlated mixture ratios--;
    line 46-47, "spectrum by simulating correlated mixture ratios that yielded" should read --spectrum by a simulation so that the correlated color temperatures of the two phosphor mixtures that yields--;
    line 50, "91.0:9.0" should read --98.0:2.0--;
    line 53, "98.0:2.0" should read --91.0:9.0--.

Column 53, lines 30-31, "the correlated color temperatures of the phosphor mixtures" should read --correlated mixture ratios--;
    lines 32-33, "by simulating correlated mixture ratios that yielded" should read --a simulation so that the correlated color temperatures of the phosphor mixtures that yields--.

Column 54, line 33, "schematic sectional" should read --schematic cross sectional--;
    line 35, "schematic sectional" should read --schematic cross sectional--.